US012626895B2

(12) United States Patent
Kapoor et al.

(10) Patent No.: US 12,626,895 B2
(45) Date of Patent: May 12, 2026

(54) RF SIGNAL PARAMETER MEASUREMENT IN AN INTEGRATED CIRCUIT FABRICATION CHAMBER

(71) Applicant: Lam Research Corporation, Fremont, CA (US)

(72) Inventors: Sunil Kapoor, Vancouver, WA (US); David French, Fort Myers, FL (US); Gary Lemson, San Jose, CA (US); Liang Meng, Sherwood, OR (US)

(73) Assignee: Lam Research Corporation, Fremont, CA (US)

( * ) Notice: Subject to any disclaimer, the term of this patent is extended or adjusted under 35 U.S.C. 154(b) by 343 days.

(21) Appl. No.: 17/907,067

(22) PCT Filed: Mar. 24, 2021

(86) PCT No.: PCT/US2021/023942
§ 371 (c)(1),
(2) Date: Sep. 23, 2022

(87) PCT Pub. No.: WO2021/195253
PCT Pub. Date: Sep. 30, 2021

(65) Prior Publication Data
US 2024/0203711 A1 Jun. 20, 2024

Related U.S. Application Data

(63) Continuation-in-part of application No. 16/832,961, filed on Mar. 27, 2020, now Pat. No. 11,994,542.

(51) Int. Cl.
*H01J 37/32* (2006.01)
*G01R 15/16* (2006.01)
(Continued)

(52) U.S. Cl.
CPC ........ *H01J 37/32935* (2013.01); *G01R 15/16* (2013.01); *G01R 15/183* (2013.01);
(Continued)

(58) Field of Classification Search
CPC ........... H01J 37/32935; H01J 37/32183; H01J 37/32926; H01L 21/67161;
(Continued)

(56) References Cited

U.S. PATENT DOCUMENTS 3,995,237 A 11/1976 Brunner
4,044,357 A 8/1977 Goldie
(Continued)

FOREIGN PATENT DOCUMENTS

CN 1233147 A 10/1999
CN 1619767 A 5/2005
(Continued)

OTHER PUBLICATIONS

CN Office Action dated Oct. 11, 2023, in application No. CN202080056165.4 with English translation.
(Continued)

*Primary Examiner* — Alesa Allgood
*Assistant Examiner* — Rahul Maini
(74) *Attorney, Agent, or Firm* — Weaver Austin Villeneuve & Sampson LLP

(57) ABSTRACT

An apparatus to estimate parameters of a radio frequency (RF) signal may include a voltage sensor configured to provide an indication of a voltage of the RF signal as well as a current sensor configured to provide an indication of current conducted by the RF signal. The apparatus may additionally include an analog-to-digital converter coupled to an output port of the voltage sensor and the current sensor, wherein the analog-to-digital converter is configured to provide digital representations of an instantaneous voltage (Continued)

and an instantaneous current of the RF signal. The apparatus may additionally include one or more processors configured to transform the digital representations of the instantaneous voltage and current into frequency domain representations of a complex voltage and complex current.

21 Claims, 19 Drawing Sheets

(51) Int. Cl.

| | |
|---|---|
| *G01R 15/18* | (2006.01) |
| *G01R 19/165* | (2006.01) |
| *G01R 19/25* | (2006.01) |
| *G01R 25/00* | (2006.01) |
| *G01R 35/00* | (2006.01) |
| *H01L 21/67* | (2006.01) |

(52) U.S. Cl.
CPC ... *G01R 19/16528* (2013.01); *G01R 19/2509* (2013.01); *G01R 25/00* (2013.01); *G01R 35/007* (2013.01); *H01J 37/32183* (2013.01); *H01J 37/32926* (2013.01); *H01L 21/67161* (2013.01); *H01L 21/67253* (2013.01)

(58) Field of Classification Search
CPC . H01L 21/67253; G01R 15/16; G01R 15/183; G01R 19/16528; G01R 19/2509; G01R 25/00; G01R 35/007
USPC ........................................................ 324/649
See application file for complete search history.

(56) References Cited

U.S. PATENT DOCUMENTS

| | | | | |
|---|---|---|---|---|
| 4,316,254 | A * | 2/1982 | Levin | G01R 19/145 |
| | | | | 324/87 |
| 5,130,678 | A | 7/1992 | Edwards | |
| 5,155,547 | A | 10/1992 | Casper et al. | |
| 5,195,045 | A | 3/1993 | Keane et al. | |
| 5,314,603 | A | 5/1994 | Sugiyama et al. | |
| 5,369,795 | A | 11/1994 | Yanagimoto | |
| 5,499,384 | A | 3/1996 | Lentz et al. | |
| 5,572,170 | A | 11/1996 | Collins et al. | |
| 5,580,385 | A | 12/1996 | Paranjpe et al. | |
| 5,643,364 | A | 7/1997 | Zhao et al. | |
| 5,770,922 | A | 6/1998 | Gerrish et al. | |
| 5,866,985 | A | 2/1999 | Coultas et al. | |
| 5,897,713 | A | 4/1999 | Tomioka et al. | |
| 6,020,794 | A | 2/2000 | Wilbur | |
| 6,028,014 | A | 2/2000 | Sukjarev | |
| 6,054,013 | A | 4/2000 | Collins et al. | |
| 6,068,784 | A | 5/2000 | Collins et al. | |
| 6,239,587 | B1 | 5/2001 | Buck | |
| 6,251,792 | B1 | 6/2001 | Collins et al. | |
| 6,288,493 | B1 | 9/2001 | Lee et al. | |
| 6,339,206 | B1 | 1/2002 | Johnson | |
| 6,367,410 | B1 | 4/2002 | Leahey et al. | |
| 6,388,226 | B1 | 5/2002 | Smith et al. | |
| 6,444,137 | B1 | 9/2002 | Collins et al. | |
| 6,447,636 | B1 | 9/2002 | Qian et al. | |
| 6,518,195 | B1 | 2/2003 | Collins et al. | |
| 6,632,324 | B2 | 10/2003 | Chan | |
| 6,815,633 | B1 | 11/2004 | Chen et al. | |
| 6,887,339 | B1 | 5/2005 | Goodman et al. | |
| 6,922,324 | B1 | 7/2005 | Horwitz | |
| 6,939,434 | B2 | 9/2005 | Collins et al. | |
| 6,950,009 | B1 | 9/2005 | Nysen | |
| 7,042,311 | B1 | 5/2006 | Hilliker et al. | |
| 7,777,152 | B2 | 8/2010 | Todorov et al. | |
| 8,179,050 | B2 | 5/2012 | Chen | |
| 8,190,380 | B2 | 5/2012 | Choueiry et al. | |
| 8,282,983 | B1 | 10/2012 | Kapoor et al. | |

| | | | | |
|---|---|---|---|---|
| 8,368,308 | B2 | 2/2013 | Banna et al. | |
| 8,617,351 | B2 | 12/2013 | Hoffman et al. | |
| 8,823,357 | B2 | 9/2014 | Shafer et al. | |
| 9,082,589 | B2 | 7/2015 | Thomas et al. | |
| 9,518,554 | B2 | 12/2016 | Mongin et al. | |
| 9,526,161 | B2 | 12/2016 | Habu | |
| 9,596,744 | B2 | 3/2017 | Leeser | |
| 9,704,692 | B2 | 7/2017 | Leeser | |
| 9,773,643 | B1 | 9/2017 | Singhal et al. | |
| 9,779,196 | B2 | 10/2017 | Valcore, Jr. et al. | |
| 9,859,088 | B2 | 1/2018 | Shaikh | |
| 9,918,376 | B2 | 3/2018 | Thomas et al. | |
| 10,187,032 | B2 | 1/2019 | Kapoor et al. | |
| 10,224,184 | B2 | 3/2019 | Van Zyl | |
| 10,304,663 | B1 | 5/2019 | Kapoor et al. | |
| 10,354,838 | B1 | 7/2019 | Mopidevi et al. | |
| 10,388,485 | B2 | 8/2019 | Shaikh | |
| 10,553,465 | B2 | 2/2020 | Augustyniak et al. | |
| 10,950,421 | B2 | 3/2021 | Valcore, Jr. | |
| 11,527,385 | B2 | 12/2022 | Maw et al. | |
| 11,756,768 | B2 | 9/2023 | Hasegawa et al. | |
| 11,984,298 | B2 | 5/2024 | Juco et al. | |
| 11,994,542 | B2 | 5/2024 | Kapoor et al. | |
| 12,136,938 | B2 | 11/2024 | Juco et al. | |
| 12,205,796 | B2 | 1/2025 | Kapoor | |
| 12,283,462 | B2 | 4/2025 | Mopidevi et al. | |
| 2001/0042594 | A1 | 11/2001 | Shamouilian et al. | |
| 2001/0054383 | A1 | 12/2001 | Pu et al. | |
| 2002/0023899 | A1 | 2/2002 | Khater et al. | |
| 2002/0038688 | A1 | 4/2002 | Nakano et al. | |
| 2002/0129904 | A1 | 9/2002 | Itabashi et al. | |
| 2002/0180534 | A1 | 12/2002 | Bohn et al. | |
| 2003/0046013 | A1 * | 3/2003 | Gerrish | H01J 37/32935 |
| | | | | 702/60 |
| 2003/0106645 | A1 | 6/2003 | Ni et al. | |
| 2003/0141821 | A1 | 7/2003 | Nakano et al. | |
| 2003/0146803 | A1 | 8/2003 | Pickard et al. | |
| 2003/0157812 | A1 | 8/2003 | Narwankar et al. | |
| 2004/0032212 | A1 | 2/2004 | Yuzurihara et al. | |
| 2004/0116080 | A1 * | 6/2004 | Chen | H01J 37/32174 |
| | | | | 455/115.1 |
| 2004/0195972 | A1 | 10/2004 | Cornelius | |
| 2004/0236524 | A1 | 11/2004 | Mundt | |
| 2004/0253921 | A1 * | 12/2004 | Turner | G01R 19/0061 |
| | | | | 455/2.01 |
| 2005/0001556 | A1 | 1/2005 | Hoffman et al. | |
| 2005/0069651 | A1 | 3/2005 | Miyoshi et al. | |
| 2005/0106873 | A1 | 5/2005 | Hoffman et al. | |
| 2005/0134186 | A1 | 6/2005 | Brouk et al. | |
| 2005/0161769 | A1 | 7/2005 | Coolbaugh et al. | |
| 2005/0205532 | A1 | 9/2005 | Patrick et al. | |
| 2006/0116106 | A1 | 6/2006 | Turner | |
| 2007/0153780 | A1 | 7/2007 | Stanley | |
| 2007/0166134 | A1 | 7/2007 | Suzuki | |
| 2007/0251920 | A1 | 11/2007 | Hoffman | |
| 2008/0106206 | A1 | 5/2008 | Hooke et al. | |
| 2008/0179948 | A1 | 7/2008 | Nagarkatti et al. | |
| 2008/0264904 | A1 | 10/2008 | Yuen et al. | |
| 2009/0037999 | A1 | 2/2009 | Anderson et al. | |
| 2009/0162570 | A1 | 6/2009 | Swenberg et al. | |
| 2009/0278512 | A1 | 11/2009 | Karlicek et al. | |
| 2009/0289630 | A1 | 11/2009 | Nascimento et al. | |
| 2010/0025384 | A1 | 2/2010 | Todorow et al. | |
| 2010/0171427 | A1 | 7/2010 | Kirchmeier et al. | |
| 2010/0276391 | A1 | 11/2010 | Grimbergen et al. | |
| 2011/0063042 | A1 | 3/2011 | Mendolia et al. | |
| 2011/0101862 | A1 | 5/2011 | Koo et al. | |
| 2011/0140607 | A1 | 6/2011 | Moore et al. | |
| 2011/0148303 | A1 | 6/2011 | Van Zyl et al. | |
| 2011/0214811 | A1 | 9/2011 | Ashida | |
| 2012/0073757 | A1 | 3/2012 | Yamazawa | |
| 2012/0074844 | A1 | 3/2012 | York et al. | |
| 2012/0212135 | A1 | 8/2012 | Suzuki | |
| 2012/0247679 | A1 | 10/2012 | Yamazawa | |
| 2012/0298303 | A1 | 11/2012 | Ikeda et al. | |
| 2013/0076343 | A1 * | 3/2013 | Carpenter | G01R 19/00 |
| | | | | 324/252 |
| 2013/0105082 | A1 | 5/2013 | Melikyan et al. | |

(56) References Cited

U.S. PATENT DOCUMENTS

| | | | |
|---|---|---|---|
| 2013/0197874 A1* | 8/2013 | Heckel | A61B 18/1206 703/2 |
| 2013/0234741 A1 | 9/2013 | Mow et al. | |
| 2013/0256271 A1 | 10/2013 | Panagopoulos et al. | |
| 2014/0008357 A1 | 1/2014 | Cheng et al. | |
| 2014/0062303 A1 | 3/2014 | Hoffman et al. | |
| 2014/0087668 A1 | 3/2014 | Mow et al. | |
| 2014/0097751 A1 | 4/2014 | Thomas et al. | |
| 2014/0155008 A1 | 6/2014 | Van Zyl | |
| 2014/0214350 A1* | 7/2014 | Valcore, Jr. | H01J 37/32697 702/64 |
| 2014/0231389 A1 | 8/2014 | Nagami et al. | |
| 2014/0232483 A1 | 8/2014 | Correa et al. | |
| 2014/0367043 A1 | 12/2014 | Bishara et al. | |
| 2015/0037972 A1 | 2/2015 | Danek et al. | |
| 2015/0221478 A1 | 8/2015 | Himori et al. | |
| 2015/0235811 A1 | 8/2015 | Cooperberg et al. | |
| 2015/0255994 A1 | 9/2015 | Kesler et al. | |
| 2015/0313000 A1 | 10/2015 | Thomas et al. | |
| 2015/0319837 A1 | 11/2015 | Bhutta | |
| 2015/0332894 A1* | 11/2015 | Valcore, Jr. | H01J 37/32137 700/121 |
| 2015/0340204 A1 | 11/2015 | Kudela et al. | |
| 2015/0348854 A1 | 12/2015 | Kapoor et al. | |
| 2015/0357210 A1 | 12/2015 | Mori et al. | |
| 2015/0371832 A1 | 12/2015 | Yanai et al. | |
| 2015/0371876 A1 | 12/2015 | Terauchi et al. | |
| 2016/0065207 A1 | 3/2016 | Bhutta | |
| 2016/0087687 A1 | 3/2016 | Kesler et al. | |
| 2016/0113103 A1 | 4/2016 | Van Zyl | |
| 2016/0181866 A1* | 6/2016 | Moeskops | G01R 19/165 710/313 |
| 2016/0295677 A1 | 10/2016 | Leeser | |
| 2016/0322215 A1 | 11/2016 | Shaikh | |
| 2016/0351375 A1 | 12/2016 | Valcore, Jr. et al. | |
| 2017/0004955 A1* | 1/2017 | Leeser | H01J 37/321 |
| 2017/0062187 A1 | 3/2017 | Radomski et al. | |
| 2017/0117869 A1 | 4/2017 | Leeser et al. | |
| 2017/0236693 A1 | 8/2017 | Kobayashi et al. | |
| 2017/0244582 A1 | 8/2017 | Gal et al. | |
| 2017/0256416 A1 | 9/2017 | Fischer et al. | |
| 2017/0330732 A1 | 11/2017 | Valcore, Jr. et al. | |
| 2017/0330744 A1 | 11/2017 | Keil et al. | |
| 2017/0345620 A1 | 11/2017 | Coumou et al. | |
| 2017/0365907 A1 | 12/2017 | Kapoor et al. | |
| 2017/0372870 A1 | 12/2017 | Godyak et al. | |
| 2018/0023158 A1 | 1/2018 | Sasaki et al. | |
| 2018/0025930 A1 | 1/2018 | Augustyniak et al. | |
| 2018/0068834 A1 | 3/2018 | Valcore, Jr. et al. | |
| 2018/0097520 A1 | 4/2018 | Wu | |
| 2018/0130696 A1 | 5/2018 | Konkola et al. | |
| 2018/0144903 A1 | 5/2018 | Shaikh | |
| 2018/0163302 A1 | 6/2018 | Kapoor et al. | |
| 2018/0231587 A1 | 8/2018 | Ye et al. | |
| 2018/0261431 A1 | 9/2018 | Hammond, IV et al. | |
| 2018/0308663 A1 | 10/2018 | Collins et al. | |
| 2018/0308664 A1 | 10/2018 | Collins et al. | |
| 2018/0350649 A1 | 12/2018 | Gomm | |
| 2018/0351322 A1 | 12/2018 | Kurosawa et al. | |
| 2018/0366378 A1 | 12/2018 | Kim et al. | |
| 2019/0013222 A1 | 1/2019 | Kim et al. | |
| 2019/0049534 A1 | 2/2019 | Guan | |
| 2019/0051496 A1 | 2/2019 | Collins et al. | |
| 2019/0068158 A1 | 2/2019 | Coumou et al. | |
| 2019/0108979 A1 | 4/2019 | Higuchi | |
| 2019/0148118 A1 | 5/2019 | Zhang et al. | |
| 2019/0149119 A1 | 5/2019 | Kapoor et al. | |
| 2019/0198345 A1 | 6/2019 | Fischer et al. | |
| 2019/0228950 A1 | 7/2019 | Funk et al. | |
| 2019/0288737 A1 | 9/2019 | Hanks et al. | |
| 2019/0391547 A1 | 12/2019 | Coumou et al. | |
| 2020/0010957 A1 | 1/2020 | Chen et al. | |
| 2020/0067545 A1 | 2/2020 | Howald et al. | |
| 2020/0118792 A1 | 4/2020 | Mopidevi et al. | |
| 2020/0118856 A1 | 4/2020 | Augustyniak et al. | |
| 2020/0126762 A1 | 4/2020 | Yang et al. | |
| 2020/0161104 A1 | 5/2020 | Ni et al. | |
| 2020/0211873 A1 | 7/2020 | Zhao et al. | |
| 2020/0333434 A1 | 10/2020 | Chancey et al. | |
| 2020/0381213 A1 | 12/2020 | Lian et al. | |
| 2020/0411286 A1 | 12/2020 | Koshimizu et al. | |
| 2021/0005474 A1 | 1/2021 | Hong | |
| 2021/0159107 A1 | 5/2021 | Woo | |
| 2021/0183619 A1 | 6/2021 | Patrick et al. | |
| 2021/0302478 A1 | 9/2021 | Kapoor et al. | |
| 2021/0313948 A1 | 10/2021 | Leeser et al. | |
| 2022/0018878 A1 | 1/2022 | Dames et al. | |
| 2022/0190854 A1 | 6/2022 | Juco et al. | |
| 2022/0328236 A1 | 10/2022 | Kapoor | |
| 2022/0344129 A1 | 10/2022 | Kapoor | |
| 2022/0375721 A1 | 11/2022 | Fields et al. | |
| 2022/0415616 A1 | 12/2022 | Juco et al. | |
| 2023/0052543 A1 | 2/2023 | Linebarger, Jr. et al. | |
| 2023/0223238 A1 | 7/2023 | Guo et al. | |
| 2023/0326720 A1 | 10/2023 | Mopidevi et al. | |
| 2023/0341448 A1 | 10/2023 | Saurabh et al. | |
| 2024/0258073 A1 | 8/2024 | Juco et al. | |
| 2024/0272210 A1 | 8/2024 | Kapoor et al. | |
| 2025/0015819 A1 | 1/2025 | Juco et al. | |
| 2025/0038034 A1 | 1/2025 | Topping et al. | |
| 2025/0118533 A1 | 4/2025 | Kapoor | |
| 2025/0132127 A1 | 4/2025 | Guo et al. | |
| 2025/0246406 A1 | 7/2025 | Dehghan et al. | |

FOREIGN PATENT DOCUMENTS

| | | |
|---|---|---|
| CN | 1656593 A | 8/2005 |
| CN | 1925322 A | 3/2007 |
| CN | 101630624 A | 1/2010 |
| CN | 101866808 A | 10/2010 |
| CN | 101933225 A | 12/2010 |
| CN | 102037789 A | 4/2011 |
| CN | 102272869 A | 12/2011 |
| CN | 103553690 A | 1/2014 |
| CN | 105321792 A | 2/2016 |
| CN | 107419238 A | 12/2017 |
| CN | 108109897 A | 6/2018 |
| CN | 108494381 A | 9/2018 |
| CN | 109659215 A | 4/2019 |
| CN | 112753089 A | 5/2021 |
| EP | 0840350 A2 | 5/1998 |
| EP | 0935406 A2 | 8/1999 |
| EP | 0731559 B1 | 11/2001 |
| EP | 2881579 A1 | 6/2015 |
| EP | 2881579 B1 | 3/2019 |
| GB | 1599557 A | 10/1981 |
| JP | H0589997 A | 4/1993 |
| JP | H08274067 A | 10/1996 |
| JP | H11233294 A | 8/1999 |
| JP | 2001057360 A | 2/2001 |
| JP | 2001249028 A | 9/2001 |
| JP | 2003302431 A | 10/2003 |
| JP | 2004031566 A | 1/2004 |
| JP | 2004266038 A | 9/2004 |
| JP | 2005527078 A | 9/2005 |
| JP | 2006019716 A | 1/2006 |
| JP | 2006209976 A | 8/2006 |
| JP | 2006286814 A | 10/2006 |
| JP | 4352562 B2 | 10/2009 |
| JP | 2010065240 A | 3/2010 |
| JP | 2011515790 A | 5/2011 |
| JP | 2011135766 A | 7/2011 |
| JP | 2011222292 A | 11/2011 |
| JP | 2013216949 A | 10/2013 |
| JP | 5491109 B2 | 5/2014 |
| JP | 2014099585 A | 5/2014 |
| JP | 2014142266 A | 8/2014 |
| JP | 2014186994 A | 10/2014 |
| JP | 5812561 B2 | 11/2015 |
| JP | 2016009733 A | 1/2016 |
| JP | 2016184924 A | 10/2016 |
| JP | 2017143057 A | 8/2017 |
| JP | 2017168298 A | 9/2017 |
| JP | 2017199904 A | 11/2017 |

(56) References Cited

FOREIGN PATENT DOCUMENTS

| | | | |
|---|---|---|---|
| JP | 2018011050 A | 1/2018 | |
| JP | 2018022685 A | 2/2018 | |
| JP | 2019504481 A | 2/2019 | |
| JP | 2019071270 A | 5/2019 | |
| JP | 2019517125 A | 6/2019 | |
| JP | 2019133785 A | 8/2019 | |
| JP | 2020510959 A | 4/2020 | |
| JP | 2021052062 A | 4/2021 | |
| KR | 980012069 A | 4/1998 | |
| KR | 19980012069 U | 5/1998 | |
| KR | 20010015590 A | 2/2001 | |
| KR | 20040084477 A | 10/2004 | |
| KR | 20050029122 A | 3/2005 | |
| KR | 20060105668 A | 10/2006 | |
| KR | 20070101654 A | 10/2007 | |
| KR | 20070109275 A | 11/2007 | |
| KR | 20090009681 U | 9/2009 | |
| KR | 20110116939 A | 10/2011 | |
| KR | 20120087925 A | 8/2012 | |
| KR | 20130047532 A | 5/2013 | |
| KR | 101415551 B1 | 7/2014 | |
| KR | 20140104380 A | 8/2014 | |
| KR | 20150038316 A | 4/2015 | |
| KR | 20150139461 A | 12/2015 | |
| KR | 20160000400 A | 1/2016 | |
| KR | 20170054239 A | 5/2017 | |
| KR | 101791706 B1 | 10/2017 | |
| KR | 20170114800 A | 10/2017 | |
| KR | 20180080631 A | 7/2018 | |
| KR | 20180082626 A | 7/2018 | |
| KR | 20180101243 A | 9/2018 | |
| KR | 20190047404 A | 5/2019 | |
| KR | 20190109559 A | 9/2019 | |
| KR | 20200001608 A | 1/2020 | |
| KR | 20200003561 A | 1/2020 | |
| KR | 20200111233 A | 9/2020 | |
| KR | 102505150 B1 | 2/2023 | |
| TW | 200509194 A | 3/2005 | |
| TW | 200518210 A | 6/2005 | |
| TW | I290331 B | 11/2007 | |
| TW | 201141317 A | 11/2011 | |
| TW | 201143546 A | 12/2011 | |
| TW | 201611153 A | 3/2016 | |
| TW | 201808057 A | 3/2018 | |
| TW | 201838352 A | 10/2018 | |
| TW | 201840989 A | 11/2018 | |
| TW | 201903818 A | 1/2019 | |
| TW | 201935596 A | 9/2019 | |
| TW | 202016974 A | 5/2020 | |
| TW | 202020925 A | 6/2020 | |
| WO | WO-9534945 A2 | 12/1995 | |
| WO | WO-9914855 A1 | 3/1999 | |
| WO | WO-0219387 A2 | 3/2002 | |
| WO | WO-02080220 A1 | 10/2002 | |
| WO | WO-02084698 A1 | 10/2002 | |
| WO | WO-03101160 A2 | 12/2003 | |
| WO | WO-2005031839 A1 | 4/2005 | |
| WO | WO-2009099486 A1 | 8/2009 | |
| WO | WO-2011028600 A2 | 3/2011 | |
| WO | WO-2017100136 A1 | 6/2017 | |
| WO | WO-2018156486 A1 | 8/2018 | |
| WO | WO-2018228133 A1 | 12/2018 | |
| WO | WO-2019079325 A1 | 4/2019 | |
| WO | WO-2019165296 A1 | 8/2019 | |
| WO | WO-2020076413 A1 | 4/2020 | |

OTHER PUBLICATIONS

CN Office Action dated Oct. 24, 2023, in application No. CN202080034447.4 with English translation.

International Preliminary Report on Patentability and Written Opinion dated Oct. 3, 2024 in PCT Application No. PCT/US2022/030252.

International Preliminary Report on Patentability dated Jan. 12, 2023, in PCT Application No. PCT/US2021/038457.

International Preliminary Reporton Patentability dated Dec. 22, 2022, in PCT Application No. PCT/US2021/036163.

International Search Report and Written Opinion dated Oct. 14, 2021, in application No. PCT/US2021/038457.

JP Notice of Allowances dated Sep. 3, 2024 in JP Application No. 2022-506171 with English translation.

JP Notice of Allowances dated Sep. 10, 2024 in JP Application No. 2022-530889 with English translation.

JP Office Action dated Apr. 30, 2024 in JP Application No. 2022-506171, with English Translation.

JP Office Action dated Aug. 27, 2024 in JP Application No. 2022-547225 with English translation.

JP Office Action dated Jun. 11, 2024 in JP Application No. 2022-530889 with English translation.

JP Office Action dated Jun. 18, 2024 in JP Application No. 2022-523827 with English Translation.

JP Office Action dated May 7, 2024 in JP Application No. 2021-564697, with English Translation.

JP Office Action dated Oct. 1, 2024 in JP Application No. 2022-520163 with English translation.

KR Office Action dated Aug. 23, 2024 in KR Application No. 10-2023-7006703, with English Translation.

KR Office Action dated Feb. 24, 2023 in Application No. KR10-2022-7025826 with English translation.

KR Office Action dated Jan. 16, 2024 in KR Application No. 10-2023-7006703 with English translation.

KR Office Action dated May 21, 2024 in KR Application No. 10-2019-0071320, with English translation.

SG Search Report and Written Opinion dated Nov. 1, 2023 in SG Application No. 11202111969R.

SG Search Report and Written Opinion dated Nov. 15, 2023 in SG Application No. 11202202918X.

SG Search report dated Jul. 16, 2024 in Application No. SG11202205585V.

TW Office Action dated Apr. 3, 2024 in TW Application No. 109115006, with English Translation.

TW Office Action dated Aug. 2, 2024 in TW Application No. 109133629 with English translation.

TW Office Action dated Aug. 16, 2024 in TW Application No. 110123521, with English Translation.

TW Office Action dated May 9, 2024 in TW Application No. 109125947, with English Translation.

TW Office Action dated May 22, 2024 in TW Application No. 109136856, with English translation.

TW Office Action dated Sep. 23, 2024 in TW Application No. 110111059 with English translation.

U.S. Corrected Notice of Allowance dated Oct. 7, 2024 in U.S. Appl. No. 17/594,906.

U.S. Final Office Action dated Jun. 28, 2024 in U.S. Appl. No. 17/597,932.

U.S. Non-Final Office Action dated Dec. 21, 2023 in U.S. Appl. No. 17/594,906.

U.S. Non-Final Office Action dated Jul. 3, 2023, in U.S. Appl. No. 16/832,961.

U.S. Non-Final Office Action dated Jul. 5, 2024 in U.S. Appl. No. 18/000,895.

U.S. Non-Final Office Action dated Mar. 8, 2024 in U.S. Appl. No. 17/597,932.

U.S. Notice of Allowance dated Feb. 6, 2024 in U.S. Appl. No. 16/832,961.

U.S. Notice of Allowance dated Jan. 12, 2024 in U.S. Appl. No. 17/756,058.

U.S. Notice of Allowance dated Jan. 23, 2024 in U.S. Appl. No. 17/756,058.

U.S. Notice of Allowance dated Jun. 20, 2024 in U.S. Appl. No. 17/594,906.

U.S. Notice of Allowance dated Oct. 20, 2023 in U.S. Appl. No. 16/832,961.

U.S. Notice of Allowance dated Sep. 18, 2024 in U.S. Appl. No. 17/597,932.

U.S. Appl. No. 18/847,308, inventors Dehghan S, et al., filed on Sep. 16, 2024.

(56) References Cited

OTHER PUBLICATIONS

U.S. Appl. No. 18/890,408, inventors Juco E.Y, et al., filed on Sep. 19, 2024.

U.S. Restriction Requirement dated Aug. 16, 2024 in U.S. Appl. No. 17/755,141.

U.S. Restriction Requirement dated Feb. 24, 2023 in U.S. Appl. No. 16/832,961.

U.S. Restriction requirement dated Oct. 1, 2024 in U.S. Appl. No. 17/997,802.

Chinese First Office Action dated Aug. 27, 2015 issued in Application No. CN 201310467492.0.

Chinese First Office Action dated May 17, 2017 issued in Application No. CN 201610428220.3.

Chinese Second Office Action dated Mar. 5, 2018 issued in Application No. CN 201610428220.3.

Chinese Third Office Action dated Aug. 15, 2018 issued in Application No. CN 201610428220.3.

Final Office Action dated Jul. 7, 2017 issued in U.S. Appl. No. 14/737,377.

International Preliminary Report on Patentability and written opinion dated Aug. 25, 2022 in Application PCT/US2021/017227.

International Preliminary Report on Patentability and written opinion dated Nov. 17, 2022 in Application PCT/US2021/030177.

International Preliminary Report on Patentability dated Oct. 6, 2022 in PCT Application PCT/US2021/023942.

International Preliminary Report on Patentability dated Apr. 14, 2022 from PCT/US2020/053014.

International Preliminary Report on Patentability dated Feb. 10, 2022 issued in Application No. PCT/US2020/070333.

International Preliminary Report on Patentability dated Jun. 16, 2022, in PCT Application No. PCT/US2020/062924.

International Preliminary Report on Patentability dated Nov. 18, 2021, issued in PCT/US2020/030835.

International Search Report and Written Opinion dated Apr. 7, 2021 issued in Application No. PCT/US2020/062924.

International Search Report and Written Opinion dated Aug. 17, 2021 issued in Application No. PCT/US2021/030177.

International Search Report and Written Opinion dated Aug. 21, 2020 issued in Application No. PCT/US2020/030835.

International Search Report and Written Opinion dated Dec. 16, 2022 in PCT Application No. PCT/US2022/030252.

International Search Report and Written Opinion dated Feb. 3, 2021 issued in Application No. PCT/US2020/057020.

International Search Report and Written Opinion dated Jan. 19, 2021, for International Application No. PCT/US2020/053014.

International Search Report and Written Opinion dated Jul. 15, 2021 issued in Application No. PCT/US2021/023942.

International Search Report and Written Opinion dated Jun. 4, 2021 issued in Application No. PCT/US2021/017227.

International Search Report and Written Opinion dated Nov. 11, 2020 issued in Application No. PCT/US2020/070333.

International Search Report and Written Opinion dated Sep. 27, 2021 issued in Application No. PCT/US2021/036163.

Korean Decision for Grant of Patent dated Jan. 18, 2020 issued in Application No. KR 10-2013-0120518.

KR Office Action dated Aug. 4, 2022 in Application No. KR10-2022-7013719 With English translation.

KR Office Action dated Sep. 21, 2022 in Application No. KR10-2022-7025826 with English translation.

Notice of Allowance dated Mar. 31, 2015 issued in U.S. Appl. No. 13/648,183.

Notice of Allowance dated Oct. 31, 2017 issued in U.S. Appl. No. 14/737,377.

Office Action dated Sep. 23, 2016 issued in U.S. Appl. No. 14/737,377.

PCT International Preliminary Report on Patentability dated May 5, 2022 issued in PCT/US2020/057020.

Taiwanese Notice of Allowance dated Jan. 19, 2017 issued in Application No. TW 102136597.

U.S. Appl. No. 17/756,058, Juco et al., filed on May 16, 2022.

U.S. Appl. No. 17/760,159, Inventors Linebarger et al., filed on Aug. 4, 2022.

U.S. Appl. No. 17/997,802, inventor Guo et al., filed on Nov. 2, 2022.

Andersson C.M., et al., "A Sic Varactor with Large Effective Tuning Range for Microwave Power Applications," IEEE Electron Device Letters, Jun. 2011, vol. 32(6), pp. 788-790.

Araujo D., et., "Diamond for electronics: Materials, processing and devices," Materials, 2021, vol. 14(22), pp. 1-25.

Brezeanu M., "Diamond Schottky Barrier Diodes," 2010, pp. 1-164.

CN Office Action dated Mar. 8, 2025 in CN Application No. 202080069268.4, with English Translation.

CN Office Action dated Oct. 31, 2024 in CN Application No. 202080074587.4 with English translation.

Hegazi E., et al., "Varactor Characteristics, Oscillator Tuning Curves, and AM-FM Conversion," IEEE Journal of Solid-State Circuits, Jun. 2003, vol. 38 (6), pp. 1033-1039.

Ibarra A., et al., "Wide Frequency Dielectric Properties of CVD Diamond," Diamond and Related Materials, Apr. 1997, vol. 6(5-7), pp. 856-859.

International Preliminary Report on Patentability and Written Opinion dated Aug. 15, 2024 in PCT Application No. PCT/US2023/011463.

International Preliminary Report on Patentability and Written Opinion dated Feb. 15, 2024 in PCT Application No. PCT/US2022/074608.

International Search Report and Written Opinion dated Jun. 2, 2023, in Application No. PCT/US2023/011463.

International Search Report and Written Opinion dated Nov. 18, 2022 in PCT Application No. PCT/US2022/074608.

Kalish R., "Doping of diamond," Carbon, 1999, vol. 37, pp. 781-785.

Kawarada H., et., "Wide Temperature K-700k) and High Voltage (~ V) Operation of C—H Diamond MOSFETs for Power Electronics Application," IEEE International Electron Devices Meeting, 2014, 4 Pages.

KR Notice of Allowance dated Nov. 28, 2024 in KR Application No. 10-2023-7006703, with English Translation.

KR Office Action dated Dec. 18, 2024 in KR Application No. 10-2022-7006928, with English Translation.

KR Office Action dated Feb. 19, 2025 in KR Application No. 10-2022-7022290, with English Translation.

KR Office Action dated Jan. 20, 2025 in KR Application No. 10-2022-7017491, with English Translation.

KR Office Action dated Mar. 13, 2025 in KR Application No. 20227030866, with English Translation.

Liao M., et al., Ultra-wide Bandgap Semiconductor Materials, Elsevier, 2019, 234 pages.

Makino T., et al., "Diamond Schottky P-n Diode with High Forward Current Density," Physica status solidi, 2009, pp. 2086-2090.

Masante C., "Diamond MOSFET for Power Electronics. Micro and Nanotechnologies/microelectronics," Universite grenoble alpes, 2019, 159 Pages.

Merchant S., et al., "Realization of High Breakdown Voltage ( 700 V) in Thin SOI Devices," IEEE Proceedings of the 3rd International Symposium on Power Semiconductor Devices and ICs, 1991, pp. 31-35.

Peatman W.C.B., et al., "Design and Fabrication of Heterostructure Varactor Diodes for Millimeter and Submillimeter Wave Multiplier Applications," Proceedings IEEE/Cornell Conference on Advanced Concepts in High Speed Semiconductor Devices and Circuits, 1991, pp. 49-57.

Rouger N., et al., "Design of Diamond Power Devices: Application to Schottky Barrier Diodes," Energies, 2019, vol. 12 (12), pp. 1-17.

Sudow M., et al., "Sic Varactors for Dynamic Load Modulation of High Power Amplifiers," IEEE electron device letters, 2008, vol. 29 (7), pp. 728-730.

TW Office Action and Search Report dated Apr. 9, 2025 in TW Application No. 110120724, with English Translation.

TW Office Action and Search Report dated Feb. 18, 2025 in TW Application No. 110115860, with English Translation.

TW Office Action dated Oct. 11, 2024 in TW Application No. 109115006 with English translation.

(56) References Cited

OTHER PUBLICATIONS

TW Office Action dated Oct. 11, 2024 in TW Application No. 109125947 with English translation.

Umezawa H., et al., "Diamond Schottky Barrier Diode for High-temperature, High-power, and Fast Switching Applications," Japanese Journal of Applied Physics, 2014, vol. 53 ,5 Pages.

U.S. Non-Final Office Action dated Nov. 13, 2024 in U.S. Appl. No. 18/631,368.

U.S. Notice of Allowance dated Apr. 14, 2025 in U.S. Appl. No. 18/631,368.

U.S. Notice of Allowance dated Dec. 16, 2024 in U.S. Appl. No. 18/000,895.

U.S. Restriction Requirement dated Apr. 10, 2025 in U.S. Appl. No. 17/760,159.

U.S. Restriction Requirement dated Mar. 14, 2025 in U.S. Appl. No. 17/997,802.

Volpe P.N., et al., "Extreme Dielectric Strength in Boron Doped Homoepitaxial Diamond," Applied Physics Letters, 2010, vol. 97, 4 Pages.

EP Extended European Search report dated Jul. 14, 2025 in EP Application No. 22854124.9.

Habib B., et al., "Improved Frequency Domain Architecture for the Digital Block of a Hardware Simulator for MIMO Radio Channels," International Symposium on Signals, Circuits and Systems, 2011, pp. 1-4.

JP Office Action dated Sep. 9, 2025 in JP Application No. 2024-172857, with English Translation.

KR Office Action dated Jul. 3, 2025 in KR Application No. 10-2022-7042490, with English Translation.

KR Office Action dated Jun. 10, 2025 in KR Application No. 10-2022-7045375, with English Translation.

KR Office Action dated Oct. 21, 2025 in KR Application No. 10-2022-7030866, with English Translation.

SG Search Report and Written Opinion dated Aug. 12, 2025 in SG Application No. 11202253460Y.

SG Search Report and Written Opinion dated Aug. 18, 2025 in SG Application No. 11202254750X.

SG Search Report and Written Opinion dated Jun. 23, 2025 in SG Application No. 11202204256Y.

TW Office Action dated May 29, 2025 in TW Application No. 110111059, with English Translation.

TW Office Action dated Nov. 3, 2025 in TW Application No. 110111059, with English Translation.

U.S. Non-Final Office Action dated Aug. 27, 2025 in U.S. Appl. No. 17/997,802.

U.S. Non-Final Office Action dated Jul. 18, 2025 in U.S. Appl. No. 18/002,733.

US Non-Final Office Action dated Jun. 24, 2025 in U.S. Appl. No. 17/760,159.

U.S. Restriction Requirement dated May 23, 2025 in U.S. Appl. No. 17/754,202.

* cited by examiner

300

400

410

Sense voltage and current magnitudes

420

Apply bandpass filter

430

Apply peak detector

440

Digitize detected peak

450

Compute parameters from detected voltage and current peaks

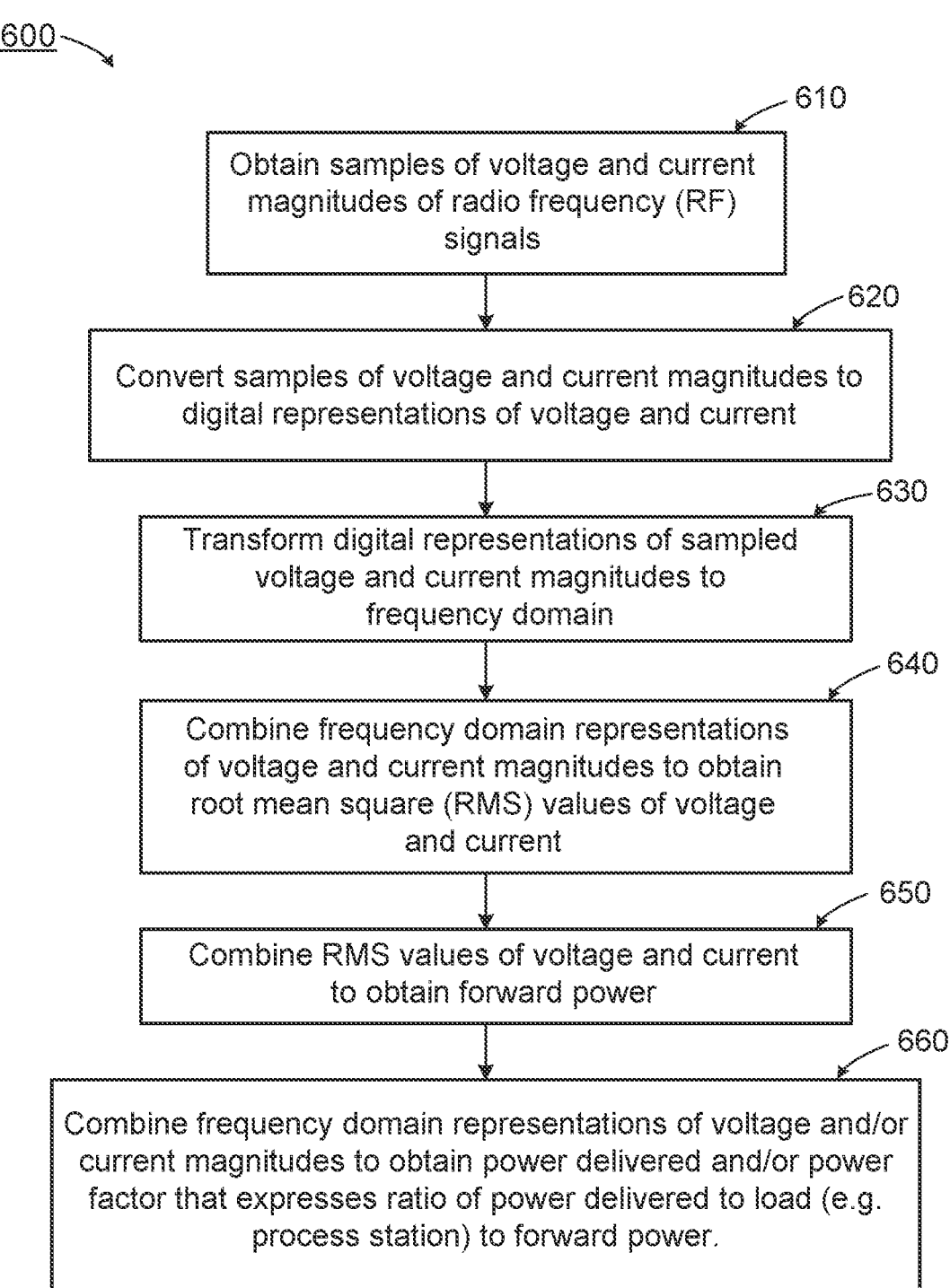

600

610

Obtain samples of voltage and current magnitudes of radio frequency (RF) signals

620

Convert samples of voltage and current magnitudes to digital representations of voltage and current

630

Transform digital representations of sampled voltage and current magnitudes to frequency domain

640

Combine frequency domain representations of voltage and current magnitudes to obtain root mean square (RMS) values of voltage and current

650

Combine RMS values of voltage and current to obtain forward power

660

Combine frequency domain representations of voltage and/or current magnitudes to obtain power delivered and/or power factor that expresses ratio of power delivered to load (e.g. process station) to forward power.

*FIG. 6*

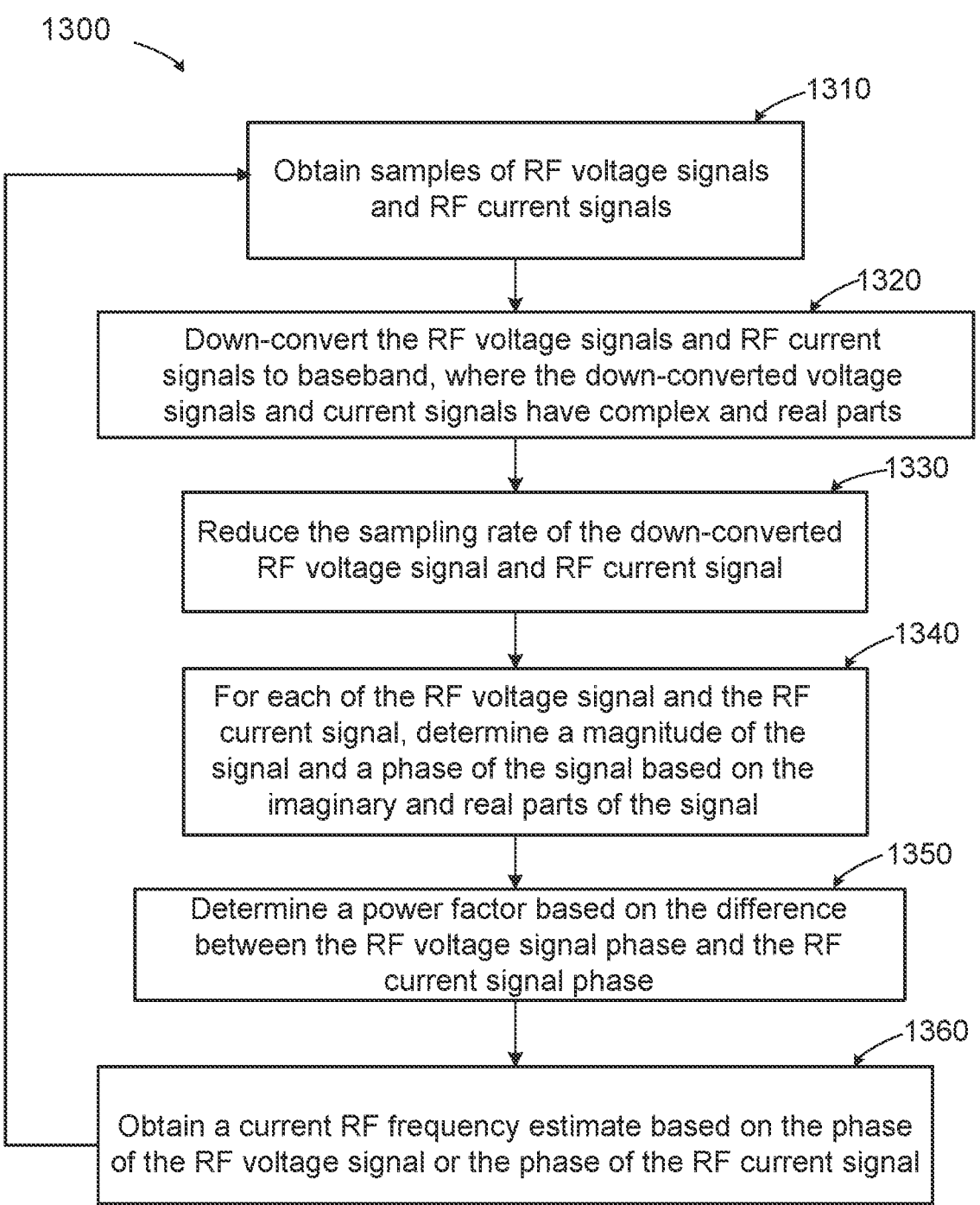

1300

1310

Obtain samples of RF voltage signals
and RF current signals

1320

Down-convert the RF voltage signals and RF current
signals to baseband, where the down-converted voltage
signals and current signals have complex and real parts

1330

Reduce the sampling rate of the down-converted
RF voltage signal and RF current signal

1340

For each of the RF voltage signal and the RF
current signal, determine a magnitude of the
signal and a phase of the signal based on the
imaginary and real parts of the signal

1350

Determine a power factor based on the difference
between the RF voltage signal phase and the RF
current signal phase

1360

Obtain a current RF frequency estimate based on the phase
of the RF voltage signal or the phase of the RF current signal

*FIG. 13*

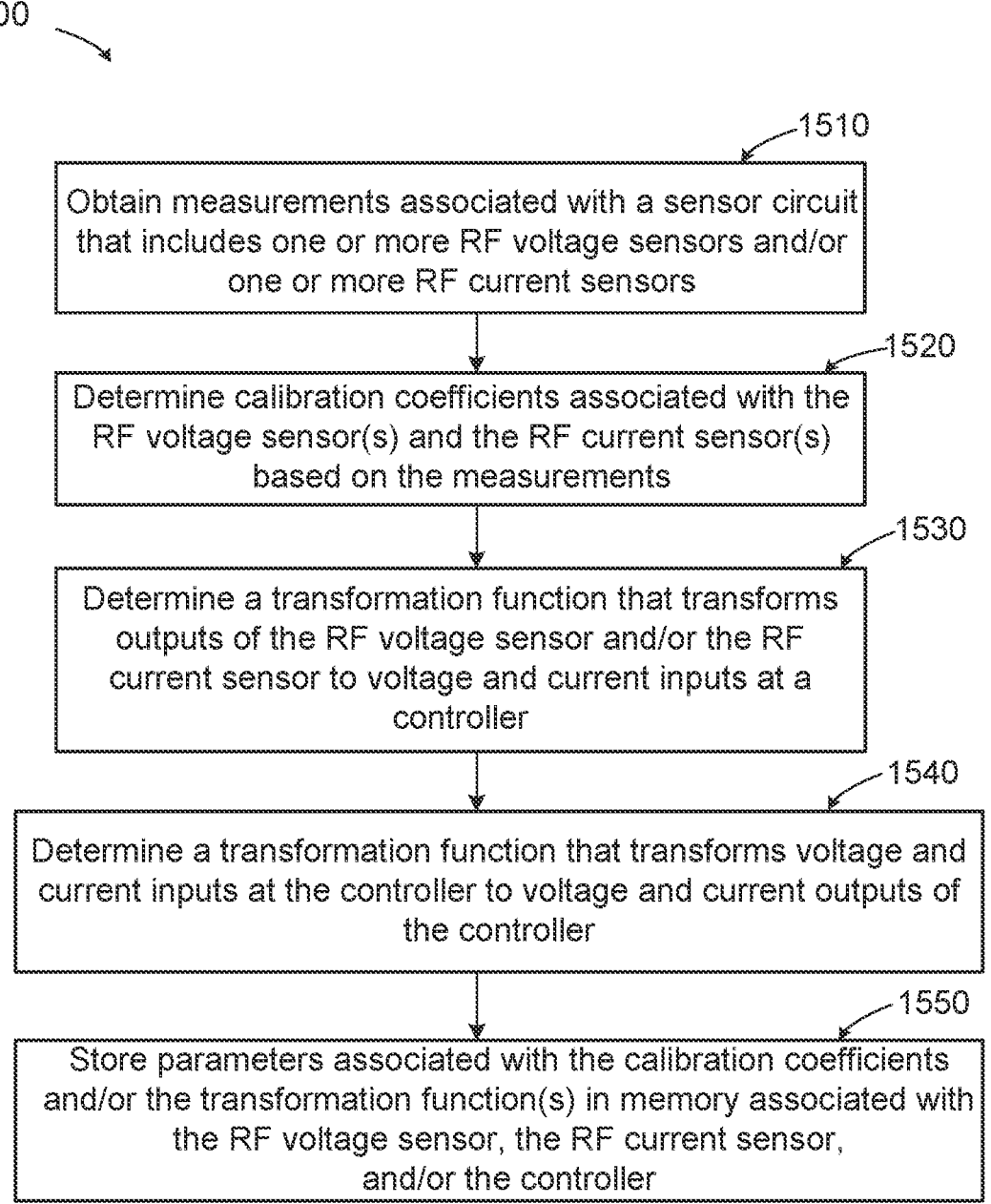

1500

1510

Obtain measurements associated with a sensor circuit that includes one or more RF voltage sensors and/or one or more RF current sensors

1520

Determine calibration coefficients associated with the RF voltage sensor(s) and the RF current sensor(s) based on the measurements

1530

Determine a transformation function that transforms outputs of the RF voltage sensor and/or the RF current sensor to voltage and current inputs at a controller

1540

Determine a transformation function that transforms voltage and current inputs at the controller to voltage and current outputs of the controller

1550

Store parameters associated with the calibration coefficients and/or the transformation function(s) in memory associated with the RF voltage sensor, the RF current sensor, and/or the controller

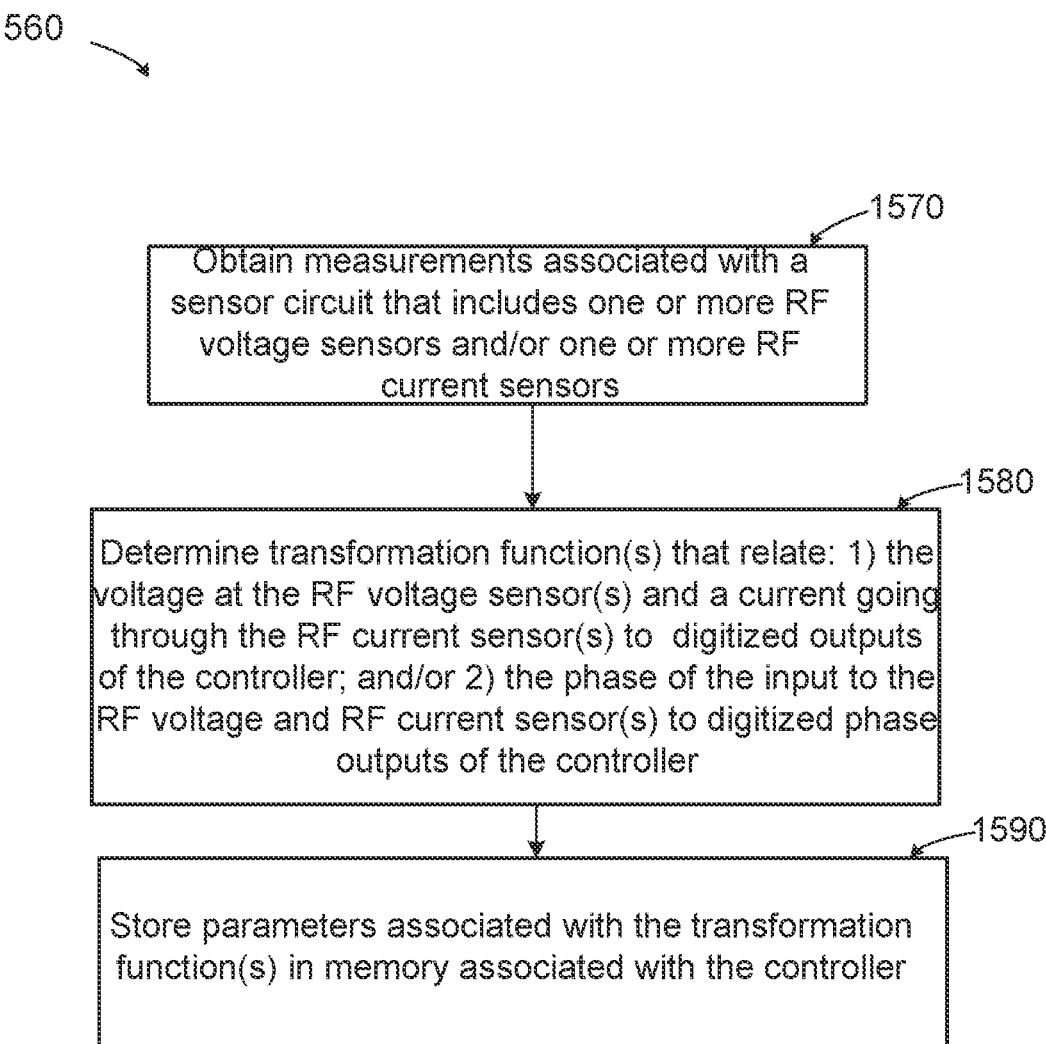

1570

Obtain measurements associated with a sensor circuit that includes one or more RF voltage sensors and/or one or more RF current sensors

1580

Determine transformation function(s) that relate: 1) the voltage at the RF voltage sensor(s) and a current going through the RF current sensor(s) to digitized outputs of the controller; and/or 2) the phase of the input to the RF voltage and RF current sensor(s) to digitized phase outputs of the controller

1590

Store parameters associated with the transformation function(s) in memory associated with the controller

*FIG. 15B*

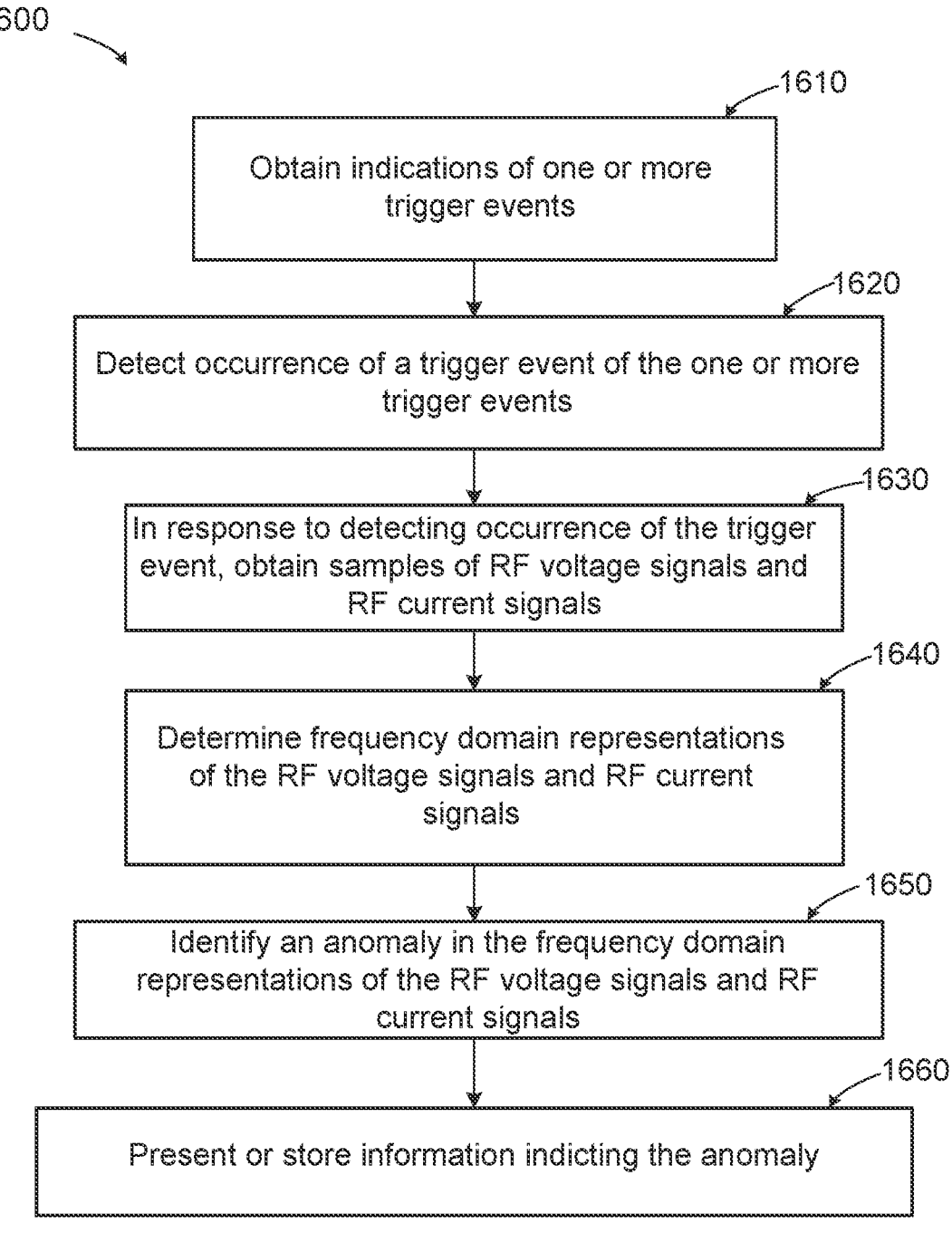

1600

1610
Obtain indications of one or more trigger events

1620
Detect occurrence of a trigger event of the one or more trigger events

1630
In response to detecting occurrence of the trigger event, obtain samples of RF voltage signals and RF current signals 1640
Determine frequency domain representations of the RF voltage signals and RF current signals 1650
Identify an anomaly in the frequency domain representations of the RF voltage signals and RF current signals 1660
Present or store information indicting the anomaly

*FIG. 16*

RF SIGNAL PARAMETER MEASUREMENT IN AN INTEGRATED CIRCUIT FABRICATION CHAMBER

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Fabrication of integrated circuit devices may involve the processing of semiconductor wafers in a semiconductor processing chamber. Typical processes may involve deposition, in which a semiconductor structure may be built on or over a substrate such as by way of a layer-by-layer process. Typical processes may also involve removal (e.g., etching) of material from certain regions of the semiconductor wafer. In commercial-scale manufacturing processes, each wafer contains many copies of a set of semiconductor devices, and many wafers may be utilized to achieve the required volumes of semiconductor devices. Accordingly, the commercial viability of a semiconductor processing operation may depend, at least to some extent, upon within-wafer uniformity and upon wafer-to-wafer repeatability of process conditions. Consequently, efforts are made to ensure that each portion of a given wafer, as well as each wafer processed in a semiconductor processing chamber, is subjected to tightly-controlled processing conditions. Variations in processing conditions can bring about undesirable variations in deposition and etch rates, which, in turn, may bring about unacceptable variations in overall fabrication processes. Such variations may degrade circuit performance which, in turn, may give rise to unacceptable variations in performance of higher-level systems that utilize the integrated circuit devices. Accordingly, techniques for monitoring semiconductor processes with increased granularity, as well as an ability to make fine adjustments to process variables during fabrication, continues to be an active area of investigation.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

In one embodiment an apparatus is utilized to estimate parameters of a radio frequency (RF) signal coupled to an integrated circuit fabrication chamber. The apparatus may include a voltage sensor configured to provide an indication of a voltage of the RF signal. The apparatus also includes a current sensor configured to provide an indication of a current conducted by the RF signal. The apparatus also includes an analog-to-digital conversion module coupled to an output port of the voltage sensor and to an output port of the current sensor, the analog-to-digital converter is configured to provide digital representations of an instantaneous voltage and an instantaneous current of the RF signal. The apparatus also includes one or more processors configured to transform the digital representations of the instantaneous voltage and the digital representations of the instantaneous current into frequency domain representations of a complex voltage corresponding to the RF signal voltage and into frequency domain representations of a complex current corresponding to the RF signal current. The one or more processors are additionally configured to combine frequency domain representations of a complex voltage and the complex current.

In other implementations, the one or more processors of the apparatus are configured to perform a Fast Fourier Transforms (FFT) of the digital representation of the instantaneous voltage of the RF signal and of the instantaneous current of the RF signal. In another implementation, the voltage sensor of the apparatus includes a capacitive voltage sensor. In another implementation, the current sensor includes an inductive current transformer. In an implementation, the analog-to-digital conversion module is configured to apply a successive-approximation technique. In another implementation, the RF signal is provided by an RF power generator, which provides at least 2 frequency components. In an implementation, the at least 2 frequency components include a first component having a frequency of about 400 kHz and a second component having a frequency of about 13.56 MHz. In an implementation, the one or more processors of the apparatus are additionally configured to apply one or more calibration coefficients to the frequency domain representations of the complex voltage and to apply one or more calibration coefficients to the frequency domain representations of the complex current. In an implementation, the one or more processors are additionally configured to aggregate the complex voltage and the complex current to form root mean square voltage and rms current. In an implementation, the apparatus is exclusive of a voltage divider. In an implementation, the apparatus is exclusive of a peak detector. In an implementation, apparatus is exclusive of a buffer amplifier. In an implementation, the frequency domain representations of the complex voltage and the complex current are combined to obtain actual power delivered to a process station. In an implementation, the frequency domain representations of the complex voltage and the complex current are combined to obtain power factor at the process station.

In another embodiment an apparatus may be adapted or configured to estimate radio frequency (RF) power coupled to a station of an integrated circuit fabrication chamber. The apparatus may include a voltage sensor configured to provide an indication of a voltage of the RF signal. The apparatus also includes a current sensor configured to provide an indication of the current conducted by the RF signal. The apparatus also includes an analog-to-digital conversion module coupled to an output port of the voltage sensor and to an output port of the current sensor, the analog-to-digital converter configured to provide digital representations of an instantaneous voltage and an instantaneous current of the RF signal. The apparatus may include one or more processors configured to obtain the digital representations of the instantaneous voltage of the RF signal and the digital representations of the instantaneous current conducted by the RF signal. The one or more processes may transform the obtained digital representations of the instantaneous voltage of the RF signal and the obtained digital representations of the instantaneous current of the RF signal into frequency domain representations of a complex voltage corresponding to the voltage of the RF signal and into frequency domain representation of a complex current corresponding to the current conducted by the RF signal. In an implementation, the apparatus is additionally configured to combine the complex voltage of the RF signal and the complex current of the RF signal.

In an implementation, the one or more processors of the apparatus is configured to transform the obtained digital representations of the instantaneous voltage of the RF signal and the instantaneous current conducted by the RF signal utilizing a Fast Fourier Transform. In an implementation, the one or more processors of the apparatus is additionally configured to apply one or more calibration coefficients to the complex voltage of the RF signal and the complex current conducted by the RF signal. In an implementation, the one or more processors of the apparatus is additionally configured to aggregate the complex voltage of the RF signal and the complex current of the RF signal to form root mean square voltage and root mean square current. In an implementation, the one or more processors of the apparatus is additionally configured to utilize the complex voltage of the RF signal and the complex current of the RF signal to obtain power delivered to a station of the integrated circuit fabrication chamber. In an implementation, the one or more processors of the apparatus is additionally configured to utilize the complex voltage of the RF signal and the complex current of the RF signal to obtain a ratio of power delivered to forward power at the station of the integrated circuit fabrication chamber. In an implementation, the apparatus is exclusive of a buffer amplifier.

In an implementation, an integrated circuit fabrication chamber, includes a radio frequency (RF) signal generator configured to couple an RF signal to the integrated circuit fabrication chamber. The integrated circuit fabrication chamber also includes a first sensor configured to sense voltage of the RF signal. The integrated circuit fabrication chamber also includes a second sensor configured to sense current conducted via the RF signal. The integrated circuit fabrication chamber also includes one or more analog-to-digital converters coupled to an output port of the first sensor and to an output port of the second sensor, the one or more analog-to-digital converters configured to convert sensed voltages and currents to digital representations. The integrated circuit fabrication chamber also includes one or more processors configured to transform the digital representations to frequency domain representations of the complex voltage of the RF signal and to transform the digital representations to frequency domain representations of the complex current conducted via the RF signal, the one or more processors additionally configured to combine the complex voltage of the RF signal and the complex current of the RF signal.

In an implementation, the integrated circuit fabrication chamber is configured to perform Fast Fourier Transform of the digital representation of the instantaneous voltage of the RF signal and of the instantaneous current conducted via the RF signal. In an implementation, the RF signal generator of the integrated circuit fabrication chamber is configured to provide 2 or more frequency components to the integrated circuit fabrication chamber. In an implementation, the integrated circuit fabrication chamber receives 2 or more frequency components including a signal below about 2 MHz a signal above about 2 MHz. In an implementation, the integrated circuit fabrication chamber includes 2 or more process stations. In an implementation, the integrated circuit fabrication chamber includes 4 process stations. In an implementation, the integrated circuit fabrication chamber is exclusive of a peak detector. In an implementation, the integrated circuit fabrication chamber is exclusive of a buffer amplifier.

In some embodiments, an apparatus is utilized to estimate parameters of an RF signal coupled to an integrated circuit fabrication chamber. The apparatus may include a voltage sensor configured to provide an indication of a voltage of the RF signal. The apparatus may include a current sensor configured to provide an indication of a current conducted by the RF signal. The apparatus may include an analog-to-digital converter configured to receive outputs from the voltage sensor and the current sensor and configured to provide digital representations of the voltage of the RF signal and the current conducted by the RF signal based on the inputs from the voltage sensor and the current sensor. The apparatus may include one or more processors configured to determine, based on the digital representations of the voltage and the current of the RF signal: a peak voltage associated with the digital representation of the voltage, a peak current associated with the digital representation of the current, and power characteristics associated with the RF signal.

In an implementation, the one or more processors are further configured to determine phases associated with the digital representations of the voltage and the current. In an implementation, the power characteristics are based on the determined phases.

In an implementation, the one or more processors are further configured to determine an impedance based on the peak voltage and the peak current.

In an implementation, the apparatus may further include a plurality of voltage sensors included the voltage sensor and a plurality of current sensors associated with the current sensor. The apparatus may include a multiplexer. The multiplexer may be configured to: select a voltage sensor of the plurality of voltage sensors and a current sensor of the plurality of current sensors; and provide outputs of the selected voltage sensor and the selected current sensor to the analog-to-digital converter.

In an implementation, the voltage sensor comprises a capacitive voltage sensor.

In an implementation, the current sensor comprises an inductive transformer.

In an implementation, the RF signal is provided by an RF power generator that provides at least 2 frequency components. In another implementation, the RF signal is provided by an RF power generator that provides one frequency component In an implementation, the one or more processors comprise a Field Programmable Gate Array (FPGA).

In an implementation, the digital representations are at a sampling rate typically greater than about 100 MHz.

In an implementation, the power characteristics comprise a power factor.

In an implementation, the one or more processors are further configured to communicate data via a serial communication protocol, via Ethernet, or via another digital communication protocol.

In an implementation, the one or more processors are further configured to provide outputs to an Ethernet for Control Automation Technology (EtherCAT) system. In an implementation, the EtherCAT system is configured to provide instructions to one or more elements in a matching network or other RF distribution system.

In an implementation, the one or more processors are configured to: 1) provide calibration coefficients to the voltage sensor for storage in memory associated with the voltage sensor: or 2) provide calibration coefficients to the current sensor for storage in memory associated with the current sensor. In an implementation, the calibration coefficients are determined for a plurality of RF signal frequencies. In an implementation, the calibration coefficients are determined using a modular calibration method that comprises: determining an effect of one or more cables that electrically couple the voltage sensor and the current sensor to the analog-to-digital converter: or determining an effect of a controller that receives outputs from the voltage sensor and the current sensor via the one or more cables. In an implementation, the calibration coefficients are determined using an end-to-end calibration method that comprises determining transformation functions that relate outputs of the one or more processors to characteristics of the RF signal.

In an implementation, 1) the voltage sensor is configured to provide identifying information to the one or more processors: or 2) the current sensor is configured to provide identifying information to the one or more processors. In an implementation, the identifying information comprises the calibration coefficients. In an implementation, 1) the voltage sensor is configured to provide identifying information to the one or more processors at a system power on time or a system reset time: or 2) the current sensor is configured to provide identifying information to the one or more processors at the system power on time or the system reset time.

In an implementation, the one or more processors are further configured to determine a complex representation of the voltage and a complex representation of the current, wherein the peak voltage is determined based on the complex representation of the voltage, and wherein the peak current is determined based on the complex representation of the current. In an implementation, the complex representation of the voltage is determined by mixing the digital representations of the voltage with cosine and sine waveforms associated with the RF signal, and wherein the complex representation of the current signal is determined by mixing the digital representations of the current with the cosine and sine waveforms associated with the RF signal. In an implementation, the cosine and sine waveforms associated with the RF signal are generated by a Numerically Controlled Oscillator (NCO) that acts as a Local Oscillator. In an implementation, the one or more processors are further configured to determine an estimate of a frequency of the RF signal, and wherein the estimate of the frequency of the RF signal is used to generate the cosine and sine waveforms associated with the RF signal. In an implementation, the one or more processors are further configured to: determine a phase of the digital representation of the voltage or a phase of the digital representation of the current, wherein the frequency estimate is determined based on the phase of the digital representation of the voltage or the phase of the digital representation of the current. In an implementation, the frequency estimate is a derivative of the phase of the digital representation of the voltage or is a derivative of the phase of the digital representation of the current. In an implementation, the one or more processors are further configured to inhibit use of outputs of the voltage sensor and/or use of outputs of the current sensor in response to determining that a difference between a current estimate of the frequency and a preceding estimate of the frequency exceeds a predetermined threshold. In an implementation, the one or more processors are further configured to down-sample the complex representation of the voltage and to down-sample the complex representation of the current. In an implementation, the one or more processors are configured to down-sample the complex representation of the voltage and to down-sample the complex representation of the current using a decimation filter.

In some embodiments, a method is utilized for identifying anomalous conditions associated with a process chamber. The method comprises obtaining indications of one or more trigger events. The method further comprises detecting occurrence of a trigger event of the one or more trigger events. The method further comprises in response to detecting occurrence of the one or more trigger events, obtaining samples of one of: RF voltage signals from a voltage sensor or samples of RF current signals from a current sensor. The method further comprises determining a frequency domain representation of the samples of RF voltage signals or of the samples of RF current signals. The method further comprises identifying an anomaly in the frequency domain representation. The method further comprises causing an indication of the anomaly to be stored in a log.

In an implementation, the one or more trigger events comprise at least one of: a powering on of an RF signal generator, a change in a process condition, a voltage measured by the voltage sensor exceeding a voltage threshold, or a current measured by the current sensor exceeding a current threshold.

In an implementation, determining the frequency domain representation comprises determining a Fast Fourier Transform (FFT) of the samples of the RF voltage signals or the samples of the RF current signals.

In an implementation, the samples are obtained for a predetermined time period subsequent to detection of the trigger event. In an implementation, the predetermined time period is within a range of about 10 milliseconds-1 second.

In an implementation, the anomaly in the frequency domain representation comprises excess energy in a frequency band. In an implementation, the frequency band includes a harmonic of an RF signal generated by an RF signal generator.

BRIEF DESCRIPTION OF THE DRAWINGS

FIG. 6 is a flowchart for a method of measuring RF signal parameters in an integrated circuit fabrication chamber, according to an implementation.

FIG. 13 is a flowchart for a method of determining magnitude, phase, and power characteristics of RF current and RF voltage signals, according to an implementation.

FIGS. 15A and 15B are flowcharts of methods of calibration of a system for determining magnitude, phase, and power characteristics of RF current and RF voltage signals, according to an implementation.

FIG. 16 is a flowchart for a method of using frequency domain representations of RF current and voltage signals, according to an implementation.

DETAILED DESCRIPTION

Figure 1A:
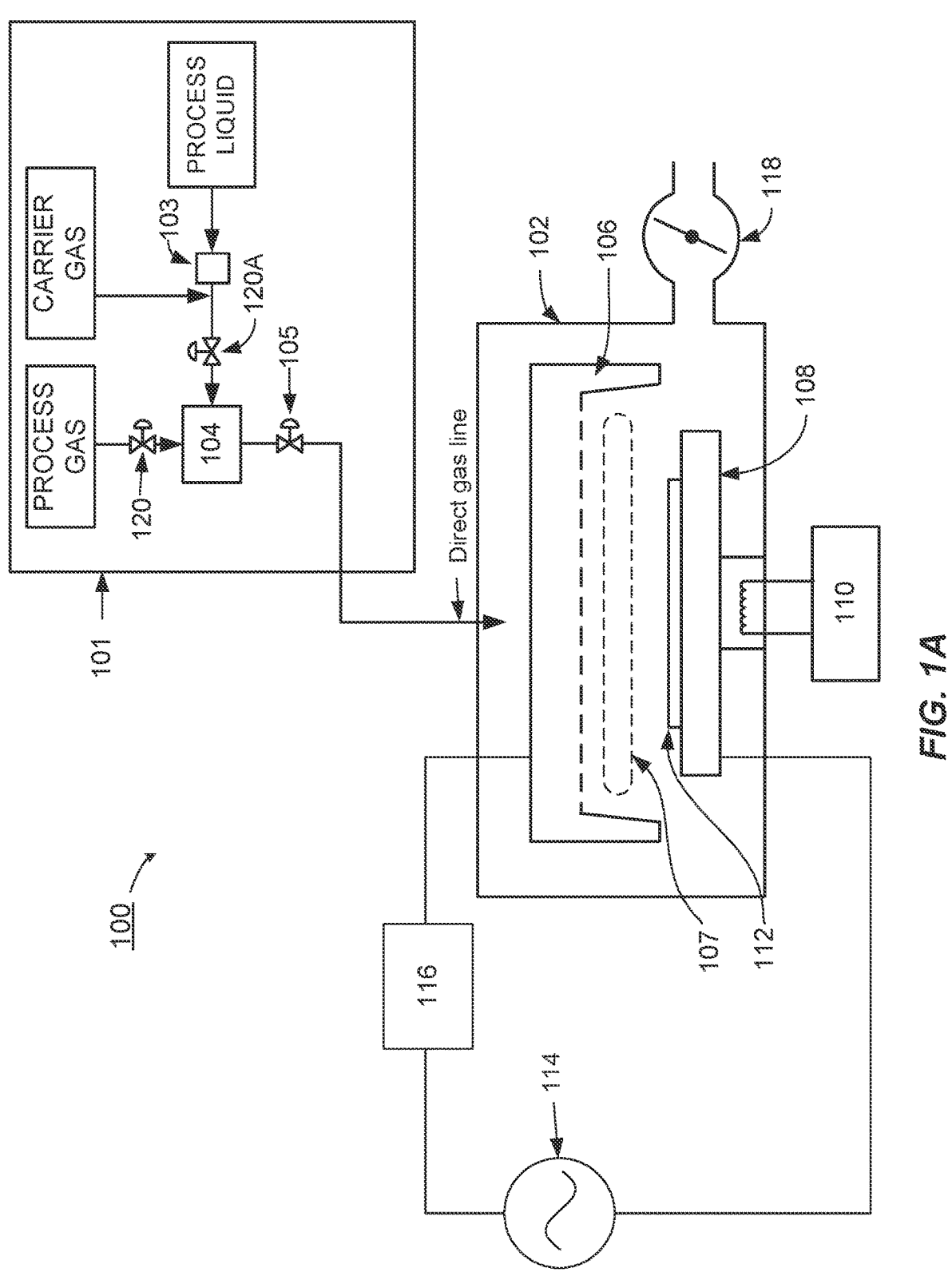
FIG. 1A shows a substrate processing apparatus for depositing or etching a film on or over a semiconductor substrate utilizing any number of processes, according to various implementations.

In particular implementations, such as implementations related to plasma-enhanced or plasma-assisted integrated circuit manufacturing processes, one or more high-power RF signals may be utilized to form an ionized plasma material. Formation of an ionized plasma material may enable precursor gases to undergo appropriate chemical reactions, which result in deposition or removal of semiconductor material from a wafer undergoing processing. Accordingly, accurate determination of RF signal parameters, such as RF voltage, RF current, as well as phase relationships between RF current and voltage, may be useful in determining RF power delivered, RF power reflected, for example, which may be utilized to exercise control over various semiconductor processes. Such processes may include deposition of a semiconductor material on or over a substrate as well as removal (e.g., etching) of material at one or more locations of the wafer. For example, in certain plasma-mediated semiconductor processes, accurate control over RF signal parameters may permit control over rates of material deposition or removal, deposition or etch uniformity across a wafer, stress introduced by deposited materials, and so forth.

In a multi-station integrated circuit fabrication chamber, in which multiple semiconductor wafers simultaneously undergo deposition or etching processes, measurement of RF signal parameters utilized in the formation of plasma may enhance uniformity of processes among various stations of the multi-station fabrication chamber. In such processing environments, in response to conditions within an individual station of a fabrication chamber resulting in changes to input impedance of the individual station, component values of an RF matching network may be adjusted so as to reduce variations in RF power coupled to the individual stations. Such precise adjustment of component values of the impedance matching network may enable coupling of a specific quantity of power into the fabrication chamber while minimizing power reflected from the fabrication chamber. Consequently, semiconductor processes conducted within a multi-station fabrication chamber may be performed with greater accuracy, which may, in turn, result in lower defect ratios and higher yields of devices formed utilizing the fabrication chamber.

In certain implementations, accurate determination of parameters of a signal from an RF power generator may allow characterization of current and voltage waveforms that may be prone to bringing about undesirable or abnormal operation of an integrated circuit fabrication chamber. For example, in certain situations, if RF power coupled to a process station of a multi-station fabrication chamber exceeds a threshold level, an anomalous plasma event (e.g., formation of an electric arc) may occur. In some instances, such an event may bring about formation of unwanted gaseous compounds, which may impede a semiconductor process. In some instances, an anomalous plasma event (e.g., formation of an electric arc) may damage a semiconductor wafer undergoing processing, which may necessitate inspection of the affected wafer outside of the process station. In certain other situations, if RF power coupled to a process station drops below a threshold level, plasma formation may be degraded or extinguished entirely. In some instances, extinguishing of an ionized plasma material may bring about an imbalance in deposition rates occurring at stations of a multi-station fabrication chamber. Consequently, at least in certain instances, responsive to the extinguishing of a plasma at a process station, the process station may be required to undergo plasma restarting operations. Such plasma restarting or re-initiation operations may delay fabrication processes (e.g., material deposition, material etch, and so forth).

In particular instances, accurate measurement the power of an RF signal coupled to a fabrication chamber may additionally impact operations conducted at other process stations of a multi-station fabrication chamber. For example, if power from an RF power generator is distributed among 2 or more process stations, an increase in RF power coupled to a first process station may bring about a corresponding reduction in power coupled to one or more other process stations. In some instances, in response to an increase in power coupled to a first station of a multi-station fabrication chamber, power to a second station of the fabrication chamber may fall below a threshold amount, which may cause plasma extinguishing in the second station. In such an instance, as previously alluded to, fabrication processes at the second station may consume longer periods of time, which may increase cost, decrease equipment availability for other processing operations, and/or decrease quality of a deposited film. In some instances, excessive occurrences of plasma extinguishing may bring about the need for additional processing and/or metrology to determine if quality of a fabricated wafer has been negatively impacted.

Particular implementations may represent improvements over alternative approaches of measuring or estimating power coupled from an RF signal utilized in plasma-assisted/plasma-enhanced fabrication processes. For example, in one or more of such alternative approaches, power of an RF signal may be estimated utilizing techniques that employ voltage division, peak detection, and/or use of buffer amplifiers. Consequently, especially with respect to the use of peak detection, such alternative approaches may give rise to inaccurate measurement of the current and voltage present in an RF signal. Such inaccuracies may distort the computing of the power of an RF signal which may, in turn, bring about unwarranted increases/decreases in power output of an RF signal generator. Such unwarranted increases/decreases in RF power coupled to stations of a multi-station fabrication chamber may bring about unwanted and/or unproductive variations in processes conducted at stations of the fabrication chamber. Such variations may affect the quality and cost of fabricated integrated circuit wafers, impede processing operations, and give rise to additional undesirable consequences. Certain embodiments herein do not employ voltage division, peak detection, and/or buffer amplifiers. Certain embodiments herein use the entire current and voltage signals (e.g., full wave signals) obtained from sensors conveying power, such as RF power, to a plasma reactor. In some cases, these signals are obtained in plasma reactors employing plasma generated by application of multiple radio frequencies.

Certain implementations may be utilized in conjunction with a number of wafer fabrication processes, such as various plasma-enhanced atomic layer deposition (ALD) processes, various plasma-enhanced chemical vapor deposition (CVD) processes, or may be utilized on-the-fly during single deposition processes. In certain implementations, an RF power generator having multiple output ports may be utilized at any signal frequency, such as at frequencies between about 300 kHz and about 60 MHz, which may include frequencies of about 400 KHz, about 1 MHz, about 2 MHz, about 13.56 MHz, and/or about 27.12 MHz. However, in other implementations. RF power generators having multiple output ports may operate at any signal frequency, which may include relatively low frequencies, such as between about 50 kHz and about 300 kHz, as well as higher signal frequencies, such as frequencies between about 60 MHz and about 100 MHz.

It should be noted that although particular implementations described herein may show and/or describe multi-station semiconductor fabrication chambers having 4 (four) process stations, implementations are intended to embrace multi-station integrated circuit fabrication chambers having or utilizing any number of process stations. Thus, in certain implementations, individual output ports of an RF power generator having multiple output ports may be assigned to a process station of a multi-station fabrication chamber having, for example, 2 process stations or 3 process stations. In other implementations individual output ports of an RF power generator having multiple output ports may be assigned to process stations of a multi-station integrated circuit fabrication chamber having a larger number of process stations, such as 5 process stations, 6 process stations, 8 process stations. 10 process stations, or any other number of process stations. Further, embodiments of the disclosure apply to chambers having only a single process station. Additionally, although particular implementations described herein may show and/or describe utilization of a single, relatively low frequency RF signal, such as a frequency of between about 300 KHz and about 2 MHz, as well as a single, relatively high-frequency RF signal, such as a frequency of between about 2 MHz and about 100 MHz, the disclosed implementations are intended to embrace the use of any number of frequencies below about 2 MHz as well as any number of frequencies above about 2 MHz.

Turning now to the figures, FIG. 1A shows a substrate processing apparatus 100 for depositing films on or over a semiconductor substrate utilizing any number of processes, according to various implementations. Processing apparatus 100 of FIG. 1A may employ a single process station 102 of a process chamber with a single substrate holder 108 (e.g., a pedestal) in an interior volume, which may be maintained under vacuum by vacuum pump 118. Showerhead 106 and gas delivery system 101, which may be fluidically coupled to the process chamber, may permit the delivery of film precursors, for example, as well as carrier and/or purge and/or process gases, secondary reactants, etc. Equipment utilized in the generation of plasma within the process chamber is also shown in FIG. 1A. The apparatus schematically illustrated in FIG. 1A may be adapted for performing, in particular, plasma-enhanced CVD.

In FIG. 1A, gas delivery system 101 includes a mixing vessel 104 for blending and/or conditioning process gases for delivery to showerhead 106. One or more mixing vessel inlet valves 120 may control introduction of process gases to mixing vessel 104. Particular reactants may be stored in liquid form prior to vaporization and subsequent delivery to process station 102 of a process chamber. The implementation of FIG. 1A includes a vaporization point 103 for vaporizing liquid reactant to be supplied to mixing vessel 104. In some implementations, vaporization point 103 may include a heated liquid injection module. In some other implementations, vaporization point 103 may include a heated vaporizer. In yet other implementations, vaporization point 103 may be eliminated from the process station. In some implementations, a liquid flow controller upstream of vaporization point 103 may be provided for controlling a mass flow of liquid for vaporization and delivery to process station 102.

Showerhead 106 may operate to distribute process gases and/or reactants (e.g., film precursors) toward substrate 112 at the process station, the flow of which may be controlled by one or more valves upstream from the showerhead (e.g., valves 120, 120A, 105). In the implementation depicted in FIG. 1A, substrate 112 is depicted as located beneath showerhead 106, and is shown resting on a pedestal 108. Showerhead 106 may include any suitable shape, and may include any suitable number and arrangement of ports for distributing process gases to substrate 112. In some implementations involving 2 or more stations, gas delivery system 101 includes valves or other flow control structures upstream from the showerhead, which can independently control the flow of process gases and/or reactants to each station so as to permit gas flow to one station while prohibiting gas flow to a second station. Furthermore, gas delivery system 101 may be configured to independently control process gases and/or reactants delivered to each station in a multi-station apparatus such that the gas composition provided to different stations is different: e.g., the partial pressure of a gas component may vary between stations at the same time.

In the implementation of FIG. 1A, gas volume 107 is depicted as being located beneath showerhead 106. In some implementations, pedestal 108 may be raised or lowered to expose substrate 112 to gas volume 107 and/or to vary the size of gas volume 107. Optionally, pedestal 108 may be lowered and/or raised during portions of the deposition process to modulate process pressure, reactant concentration, etc., within gas volume 107. Showerhead 106 and pedestal 108 are depicted as being electrically coupled to RF signal generator 114 and matching network 116 for coupling power to a plasma generator. Thus, showerhead 106 may function as an electrode for coupling radio frequency power into process station 102. In some implementations, the plasma energy is controlled (e.g., via a system controller having appropriate machine-readable instructions and/or control logic) by controlling one or more of a process station pressure, a gas concentration, power output of an RF signal generator, and so forth. For example, RF signal generator 114 and matching network 116 may be operated at any suitable RF power level, which may operate to form plasma having a desired composition of radical species. In addition, RF signal generator 114 may provide RF power having more than one frequency component, such as a low-frequency component (e.g., less than about 2 MHz) as well as a high frequency component (e.g., greater than about 2 MHz).

In some implementations, plasma ignition and maintenance conditions are controlled with appropriate hardware and/or appropriate machine-readable instructions in a system controller which may provide control instructions via a sequence of input/output control instructions. In one example, the instructions for bringing about ignition or maintaining a plasma are provided in the form of a plasma activation portion of a process recipe. In some cases, process recipes may be sequentially arranged, so that at least some instructions for the process can be executed concurrently. In some implementations, instructions for setting one or more plasma parameters may be included in a recipe preceding a plasma ignition process. For example, a first recipe may include instructions for setting a flow rate of an inert (e.g., helium) and/or a reactant gas, instructions for setting a plasma generator to a power set point and time delay instructions for the first recipe. A second, subsequent recipe may include instructions for enabling the plasma generator and time delay instructions for the second recipe. A third recipe may include instructions for disabling the plasma generator and time delay instructions for the third recipe. It will be appreciated that these recipes may be further subdivided and/or iterated in any suitable way within the scope of the present disclosure. In some deposition processes, a duration of a plasma strike may correspond to a duration of a few seconds, such as from about 3 seconds to about 15 seconds, or may involve longer durations, such as durations of up to about 30 seconds, for example. In certain implementations described herein, much shorter plasma strikes may be applied during a processing cycle. Such plasma strike durations may be on the order of less than about 50 milliseconds, with about 25 milliseconds being utilized in a specific example.

Figure 1B:
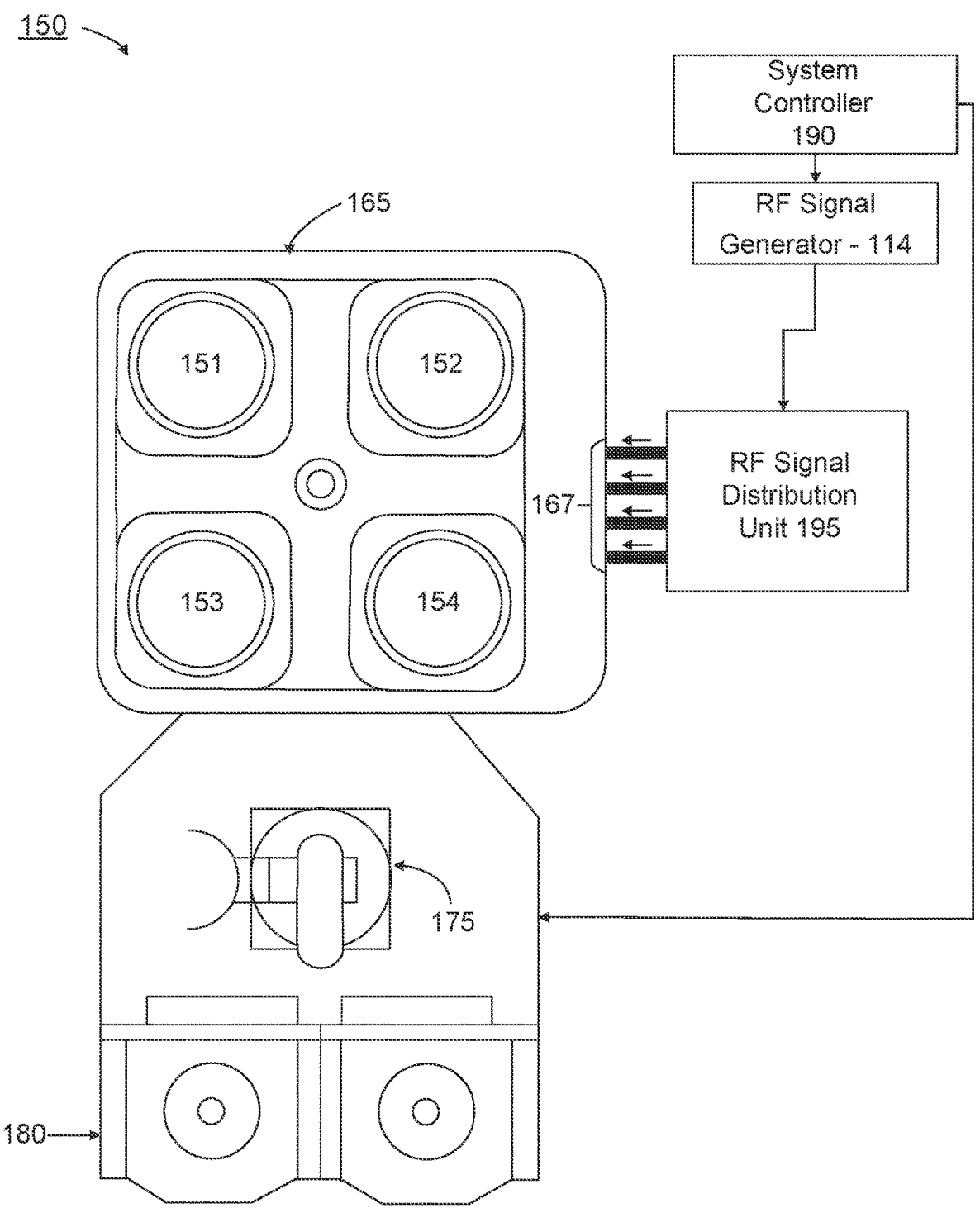
FIG. 1B depicts a schematic view of an implementation of a multi-station processing tool.

For simplicity, processing apparatus 100 is depicted in FIG. 1A as a standalone station (102) of a process chamber for maintaining a low-pressure environment. However, it may be appreciated that a plurality of process stations may be included in a multi-station processing tool environment, such as shown in FIG. 1B, which depicts a schematic view of an implementation of a multi-station processing tool. Processing tool 150 employs an integrated circuit fabrication chamber 165 that includes multiple fabrication process stations, each of which may be used to perform processing operations on a substrate held in a wafer holder, such as pedestal 108 of FIG. 1A, at a particular process station. In the implementation of FIG. 1B, the integrated circuit fabrication chamber 165 is shown as having four process stations 151, 152, 153, and 154. However, in certain other implementations, multi-station processing apparatuses may have more or fewer process stations depending on the implementation and, for instance, the desired level of parallel wafer processing, size/space constraints, cost constraints, etc. FIG. 1B additionally shows substrate handler robot 175, which may operate under the control of system controller 190, configured to move substrates from a wafer cassette (not shown in FIG. 1B) from loading port 180) and into multi-station integrated circuit fabrication chamber 165, and onto one of process stations 151, 152, 153, and 54.

FIG. 1B also depicts an implementation of a system controller 190 employed to control process conditions and hardware states of process tool 150. System controller 190 may include one or more memory devices, one or more mass storage devices, and one or more processors. The one or more processors may include a central processing unit, analog and/or digital input/output connections, stepper motor controller boards, etc. In some implementations, system controller 190 controls all of the activities of process tool 150. System controller 190 executes system control software stored in a mass storage device, which may be loaded into a memory device, and executed by a processor of the system controller. Software to be executed by a processor of system controller 190 may include instructions for controlling the timing, mixture of gases, fabrication chamber and/or station pressure, fabrication chamber and/or station temperature, wafer temperature, substrate pedestal, chuck and/or susceptor position, number of cycles performed on one or more substrates, and other parameters of a particular process performed by process tool 150. These programed processes may include various types of processes including, but not limited to, processes related to determining an amount of accumulation on a surface of the chamber interior, processes related to deposition of film on substrates including numbers of cycles, determining and obtaining a number of compensated cycles, and processes related to cleaning the chamber. System control software, which may be executed by one or more processors of system controller 190, may be configured in any suitable way. For example, various process tool component subroutines or control objects may be written to control operation of the process tool components necessary to carry out various tool processes.

In some implementations, software for execution by way of a processor of system controller 190 may include input/output control sequencing instructions for controlling the various parameters described above. For example, each phase of deposition and deposition cycling of a substrate may include one or more instructions for execution by system controller 190. The instructions for setting process conditions for an ALD/CFD deposition process phase may be included in a corresponding ALD/CFD deposition recipe phase. In some implementations, the recipe phases may be sequentially arranged, so that all instructions for a process phase are executed concurrently with that process phase.

Other computer software and/or programs stored on a mass storage device of system controller 190 and/or a memory device accessible to system controller 190 may be employed in some implementations. Examples of programs or sections of programs for this purpose include a substrate positioning program, a process gas control program, a pressure control program, a heater control program, and a plasma control program. A substrate positioning program may include program code for process tool components that are used to load the substrate onto pedestal 108 (of FIG. 1A) and to control the spacing between the substrate and other parts of process tool 150. A positioning program may include instructions for appropriately moving substrates in and out of the reaction chamber as necessary to deposit films on substrates and clean the chamber.

A process gas control program may include code for controlling gas composition and flow rates and for flowing gas into one or more process stations prior to deposition to bring about stabilization of the pressure in the process station. In some implementations, the process gas control program includes instructions for introducing gases during formation of a film on a substrate in the reaction chamber. This may include introducing gases for a different number of cycles for one or more substrates within a batch of substrates. A pressure control program may include code for controlling the pressure in the process station by regulating, for example, a throttle valve in the exhaust system of the process station, a gas flow into the process station, etc. The pressure control program may include instructions for maintaining the same pressure during the deposition of differing numbers of cycles on one or more substrates during the processing of the batch.

A heater control program may include code for controlling the current to heating unit 110 that is used to heat the substrate. Alternatively, the heater control program may control delivery of a heat transfer gas (such as helium) to the substrate.

In some implementations, there may be a user interface associated with system controller 190. The user interface may include a display screen, graphical software displays of the apparatus and/or process conditions, and user input devices such as pointing devices, keyboards, touch screens, microphones, etc.

In some implementations, parameters adjusted by system controller 190 may relate to process conditions. Non-limiting examples include process gas composition and flow rates, temperature, pressure, plasma conditions, etc. These parameters may be provided to the user in the form of a recipe, which may be entered utilizing the user interface. The recipe for an entire batch of substrates may include compensated cycle counts for one or more substrates within the batch in order to account for thickness trending over the course of processing the batch.

Signals for monitoring the process may be provided by analog and/or digital input connections of system controller 190 from various process tool sensors. The signals for controlling the process may be output by way of the analog and/or digital output connections of process tool 150. Non-limiting examples of process tool sensors that may be monitored include mass flow controllers, pressure sensors (such as manometers), thermocouples, etc. Sensors may also be included and used to monitor and determine the accumulation on one or more surfaces of the interior of the chamber and/or the thickness of a material layer on a substrate in the chamber. Appropriately programmed feedback and control algorithms may be used with data from these sensors to maintain process conditions.

System controller 190 may provide program instructions for implementing the above-described deposition processes. The program instructions may control a variety of process parameters, such as DC power level, pressure, temperature, number of cycles for a substrate, amount of accumulation on at least one surface of the chamber interior, etc. The instructions may control the parameters to operate in-situ deposition of film stacks according to various implementations described herein.

For example, the system controller may include control logic for performing the techniques described herein, such as determining an amount of accumulated deposition material currently on at least an interior region of the deposition chamber interior, applying the amount of accumulated deposition material, or a parameter derived therefrom, to a relationship between (i) a number of ALD cycles required to achieve a target deposition thickness, and (ii) a variable representing an amount of accumulated deposition material, in order to obtain a compensated number of ALD cycles for producing the target deposition thickness given the amount of accumulated deposition material currently on the interior region of the deposition chamber interior, and performing the compensated number of ALD cycles on one or more substrates in the batch of substrates. The system may also include control logic for determining that the accumulation in the chamber has reached an accumulation limit and stopping the processing of the batch of substrates in response to that determination, and for causing a cleaning of the chamber interior.

In addition to the above-identified functions and/or operations performed by system controller 190 of FIG. 1B, the controller may additionally control and/or manage the operations of RF signal generator 114. RF signal generator 114 may provide an output signal, which may be conveyed to an RF signal distribution unit 195, which may divide the power of the input signal into, for example, 4 output signals. Output signals from RF signal distribution unit 195 may exhibit similar levels of RF voltage and RF current, which may be conveyed to multi-station integrated circuit fabrication chamber 165 via input ports 167. In certain implementations, as described further herein, operations controlled via system controller 190 may relate to determining upper and lower thresholds for RF signal power to be delivered to integrated circuit fabrication chamber 165, determining actual (such as real-time) levels of RF signal power delivered to integrated circuit fabrication chamber 165, RF signal power activation/deactivation times, RF signal on/off duration, duty cycle, operating frequency, and so forth. Additionally, system controller 190 may determine one or more normal operating parameters of RF power to be delivered to integrated circuit fabrication chamber 165 by way of input ports 167. Such parameters may include upper and lower thresholds of, for example, power reflected from one or more of input ports 167 in terms of a reflection coefficient (e.g., the scattering parameter $S_{11}$), voltage standing wave ratio, upper and lower thresholds of a voltage applied to one or more of input ports 167, upper and lower thresholds of current conducted through one or more of input ports 167, as well as an upper threshold for a magnitude of a phase angle between a voltage and a current conducted through input ports 167. Such thresholds may be utilized in defining "out-of-range" RF signal characteristics. For example, reflected power greater than an upper threshold may indicate an out-of-range RF power parameter. Likewise, an applied voltage or conducted current having a value below a lower threshold or greater than an upper threshold may indicate out-of-range RF signal characteristics. Similarly, a phase angle between an applied voltage and conducted current being greater than an upper threshold may indicate an out-of-range RF power parameter.

In particular implementations, multi-station integrated circuit fabrication chamber 165 may include input signal ports in addition to input ports 167 (additional input ports not shown in FIG. 1B). In particular implementations, process stations of integrated circuit fabrication chamber 165 may utilize first and second input ports in which a first input port may convey a signal having a first frequency and in which a second input port may convey a signal having a second frequency. Use of 2 or more frequencies may bring about enhanced plasma characteristics, which may give rise to deposition rates within particular limits and/or more easily controlled deposition rates. Use of 2 or more frequencies may bring about other desirable consequences. In certain implementations, frequencies of between about 300 kHz and about 100 MHz may be utilized. In some implementations, signal frequencies of about 2 MHz or less may be referred to as low frequency (LF) while frequencies greater than about 2 MHz may be referred to as high frequency (HF).

It may be appreciated that regardless of the frequencies of RF voltage and current signals coupled to multi-station integrated circuit fabrication chamber 165, it may be advantageous to measure such signals with an increased degree of accuracy. For example, for sinusoidal voltage and current signals that are in phase with each other, average RF power coupled to multi-station integrated circuit fabrication chamber 165 may be computed substantially in accordance with expression (1) below:

$$P_{avg} = \frac{1}{2} V_{peak} \times I_{peak} \qquad (1)$$

Wherein $V_{peak}$ corresponds to a peak voltage signal, and wherein $I_{peak}$ corresponds to a peak current signal. However, it may be appreciated that power computed by way of expression (1), which specifies the use of peak RF voltage and peak RF current, may introduce inaccuracies since steady state or root mean square (RMS) levels of RF voltage and RF current may deviate significantly from peak values. For example, if RF voltage and current waveforms do not exhibit purely sinusoidal behavior, such that RF voltage and RF current achieve peak values for only a brief instant, computation of average RF power may overestimate actual power coupled to a fabrication chamber. Similarly, responsive to non-sinusoidal RF voltage and RF current waveforms reaching peak values for significant durations may result in underestimation of actual power coupled to a fabrication chamber. It may be appreciated that in both instances, such as overestimation or underestimation of RF power coupled to a fabrication chamber, any adjustments of parameters of RF signal generator 114 could potentially give rise to incorrect adjustment of RF signal generator output power parameters.

Accordingly, at least in particular implementations, it may be advantageous to formulate or compute power coupled to a fabrication chamber utilizing instantaneous levels of RF voltage applied by an RF signal and a current conducted by the RF signal. Such computations may more accurately represent levels of RF power coupled to a fabrication chamber which, in turn, may bring about tighter control, greater uniformity, greater repeatability, etc., as these pertain to fabrication processes performed via a fabrication chamber.

Figure 2:
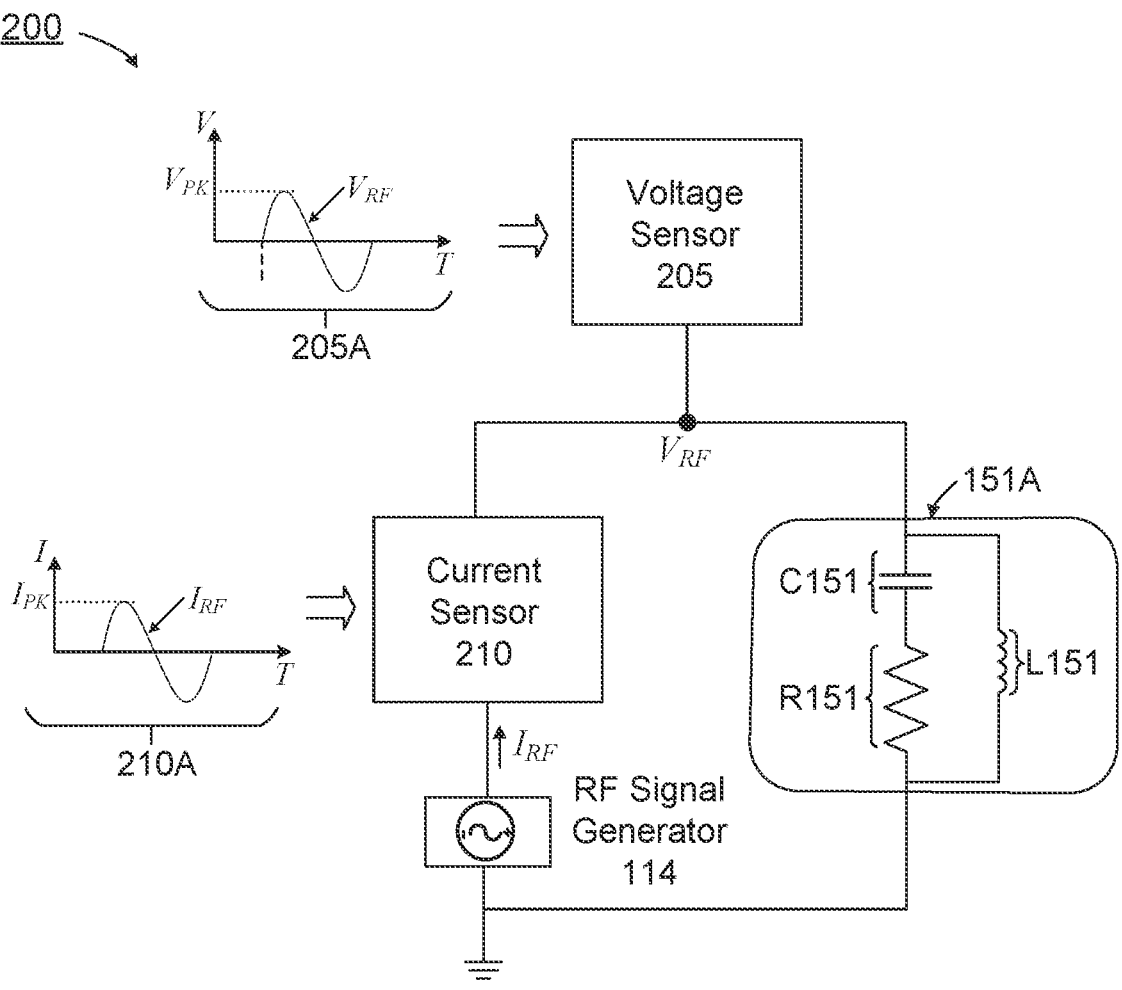
FIG. 2 is a schematic diagram showing a circuit involving a fabrication chamber as well as RF signal generation and measurement components, according to an implementation.

FIG. 2 is a schematic diagram showing a circuit involving a fabrication chamber as well as RF signal generation and measurement components, according to an implementation. Although FIG. 2 shows RF signal generator 114 providing a signal to a single process station 151, in other implementations, such as described in relation to FIG. 2, RF signal generator 114 may provide a signal to RF signal distribution unit 195. In an implementations, RF signal distribution unit 195 unit is configured to divide power from a single RF input port to 2 or more output ports for coupling to input ports 167 of fabrication chamber 165 as shown in FIG. 2. To simplify the operations depicted in FIG. 2, additional components utilized in association with a fabrication chamber, such as power supplies, impedance matching units, RF power dividers, and so forth are omitted from FIG. 2.

In implementation 200, the complex impedance of a station, such as process station 151, of multi-station integrated circuit fabrication chamber 165 may be modeled and/or characterized by equivalent circuit 151A that includes a series and/or parallel lumped circuit having a capacitance C151 and a resistance R151. Capacitance C151 and resistance R151 are depicted as being in parallel with inductance L151. In some implementations, the complex impedance of a station of a multi-station integrated circuit fabrication chamber, as represented by equivalent circuit 151A may include a capacitance having a value of between about 1.5 nF and about 3.5 nF and may include a resistance of between about 5 ohms and about 10 ohms. In particular implementations, capacitor C151 may assume a value of between about 2.0 nF and about 3.0 nF, and resistor R151 may assume a value of between about 6.5 ohms and about 8.5 ohms. However, the disclosed implementations are intended to embrace any real or complex impedance formed by series and/or parallel combinations of resistive and reactive circuit elements presented by a process station of an integrated circuit fabrication chamber. In certain implementations, a complex impedance presented by process station 151 of multi-station integrated circuit fabrication chamber 165 may be dependent upon one or more reactive gases and/or vapors present in the chamber, partial and total pressures of gases, and other factors. Thus, for certain pressure/gas combinations, chamber 165 may present a predominantly capacitive load while for other pressure/gas combinations, chamber 165 may present a predominantly inductive load, for example.

In the implementation of FIG. 2, voltage sensor 205 is coupled to a transmission line, such as a coaxial cable, for example, disposed between RF signal generator 114 and process station 151 of multi-station integrated circuit fabrication chamber 165 (as represented by equivalent circuit 151A). In particular implementations, voltage sensor 205 may correspond to a capacitive voltage sensor having a relatively high input impedance that occasionally or periodically samples a voltage at node $V_{RF}$ shown in FIG. 2 without consuming a significant electric current. The implementation of FIG. 2 also includes current sensor 210 (e.g., a inductive current transformer), which may be coupled in series between RF signal generator 114 and multi-station integrated circuit fabrication chamber 165 (as represented by equivalent circuit 151A). In particular implementations, current sensor 210) may correspond to an inductive current transformer having a relatively low input impedance that occasionally or periodically samples a current conducted from RF signal generator 114 without bringing about any significant voltage drop.

In particular implementations, voltage sensor 205 may include a voltage divider network, in which a voltage may be measured across a known lower resistance in comparison to a total resistance of known higher & lower resistor combination. In such a network, the actual voltage of the RF signal may be scaled by dividing the voltage measured across the known resistance by the sum of the 2 known resistances. In other instances, voltage sensor 205 may include a capacitive voltage divider. In such a network, the voltage of the RF signal may be scaled by dividing the voltage measured across a known capacitance in relation to the sum of the 2 known capacitances combined in series. In certain other implementations, RF signal parameter measurement may involve direct voltage sensing, in which voltage of an RF signal may be directly measured or sampled without (or exclusive of) a voltage divider network and/or without (or exclusive of) a capacitive voltage divider. Implementations may embrace alternative voltage measurement approaches other than those disclosed, which may result in measurement of voltage between RF signal generator 114 and equivalent circuit 151A.

In particular implementations, current sensor 210 may include a transformer coil coupled to a conductor conducting an RF current from an RF signal generator 114 to a process station. In such instances, a current conducted via a transmission line between RF signal generator 114 and a process station (e.g. process station 151) may be measured utilizing an inductive coil coupled to the transmission line. In such instances, a relatively small current may be induced in the inductive coil in relation to a current conducted through the transmission line. In such a sensor, the actual current conveyed by the RF signal may be scaled by considering the current measured in the inductive coil in relation to the coupling factor between current sensor 210 and the transmission line between RF signal generator 114 and a process station. Implementations may embrace alternative current measurement approaches other than those disclosed, which may result in measurement of current between RF signal generator 114 and a process station.

As shown in FIG. 2, a voltage at node $V_{RF}$ can be characterized as a conventional sinusoidal voltage or as a complex sinusoidal signal, having a peak amplitude indicated by $V_{PK}$ as depicted in graph 205A. Thus, in particular implementations, $V_{RF}$ may be characterized as a sinusoidal signal superimposed on a pulse train in which intermittently-pulsed sinusoidal RF signals are conveyed to a process station (e.g., process station 151). Alternatively, in certain other implementations, $V_{RF}$ may include a plurality of sinusoidal RF signals, such as signals having a first frequency superimposed on a pulse train, wherein a sinusoidal RF signal of a second frequency is superimposed on the sinusoidal RF signal of the first frequency. Accordingly, $V_{RF}$ of the implementation of FIG. 2 is intended to represent any number of composite waveforms having pulsed (e.g., relatively square-wave) components, saw-toothed (e.g., ramped) components, as well as any number of other components, and the disclosed implementations are not intended to be limited in this respect.

Similarly, graph 210A of FIG. 2 also depicts a sinusoidal electric current ($I_{RF}$) conducted through current sensor 210. As shown in graph 210A, an RF signal conveyed through current sensor 210 ($I_{RF}$) includes a peak current $I_{PK}$ having a period corresponding to a frequency of between, for example, about 300 KHz and about 100 MHz with an additional ±10% (for example) frequency fine-tuning capability. In certain other implementations, $I_{RF}$ may be characterized by a sinusoidal RF waveform having a first frequency superimposed on a pulse train, wherein a sinusoidal RF signal of a second frequency is superimposed on the sinusoidal RF signal of the first frequency. Accordingly, $I_{RF}$ of the implementation of FIG. 2 is intended to embrace any number of composite waveforms having pulsed (e.g., relatively square wave) components, saw-toothed (e.g., ramped) components, as well as any number of other components.

Figure 3:
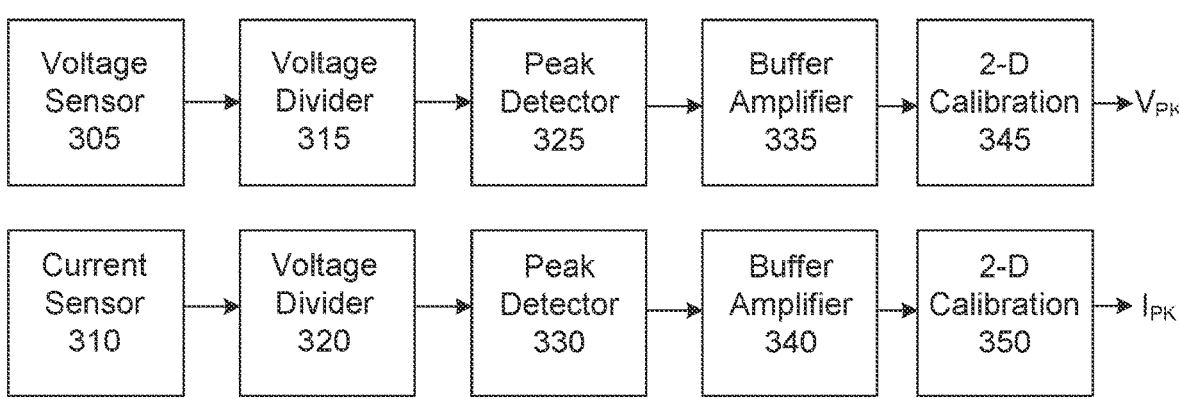
FIG. 3 is a diagram showing processes involved in measurement of RF signal current and voltage parameters, according to an implementation.

FIG. 3 is a diagram showing processes involved in measurement of RF signal current and voltage parameters, according to an implementation 300. In FIG. 3, voltage sensor 305 may include a voltage sensor disposed at a transmission line, such as a coaxial cable, which conveys a high-power RF signal between an RF signal generator and a process station of a multi-station integrated circuit fabrication chamber. As depicted in FIG. 3, voltage sensor 305 may interface with voltage divider 315, which may operate to make an output signal of voltage sensor 305 available to a peak detector, such as peak detector 325. An output signal of peak detector 325 may be conveyed to buffer amplifier 335, which may operate to provide a input high impedance so as not to distort an output signal from peak detector 325. Output signals from buffer amplifier 335 may be calibrated, such as via applying calibration coefficients stored by way of a lookup table, for example, by two-dimensional calibration circuit 345. In particular implementations, two-dimensional calibration circuit 345 includes frequency dependent coefficients that operate to adjust the levels of signals representing peak voltages provided by peak detector 325.

Similarly, current sensor 310 may include a current sensor disposed at a transmission line, such as a coaxial cable, which conveys a high-power RF signal between an RF signal generator and a process station of a multi-station integrated circuit fabrication chamber. As depicted in FIG. 3, current sensor 310 may interface with voltage divider 320, which may operate to make an output signal of current sensor 310 available to a peak detector, such as peak detector 330. An output signal of peak detector 330 may be conveyed to buffer amplifier 340, which may operate to provide a input high impedance so as not to distort an output signal from peak detector 330. Output signals from buffer amplifier 340 may be calibrated, such as via applying calibration coefficients stored by way of a lookup table, for example, by two-dimensional calibration circuit 350. In particular implementations, two-dimensional calibration circuit 350 includes frequency dependent coefficients that operate to adjust the levels of signals representing peak current levels provided by peak detector 330. Thus, in particular implementations, average RF power coupled to a station of multi-station integrated circuit fabrication chamber 165 may be computed substantially in accordance with expression (2) below:

$$P_{avg} = \frac{1}{2} V_{PK(CAL)} \times I_{PK(CAL)} \tag{2}$$

Wherein $V_{PK(CAL)}$ and $I_{PK(CAL)}$ correspond to calibrated output signals from two-dimensional calibration circuits 345 and 350, respectively.

Figure 4:
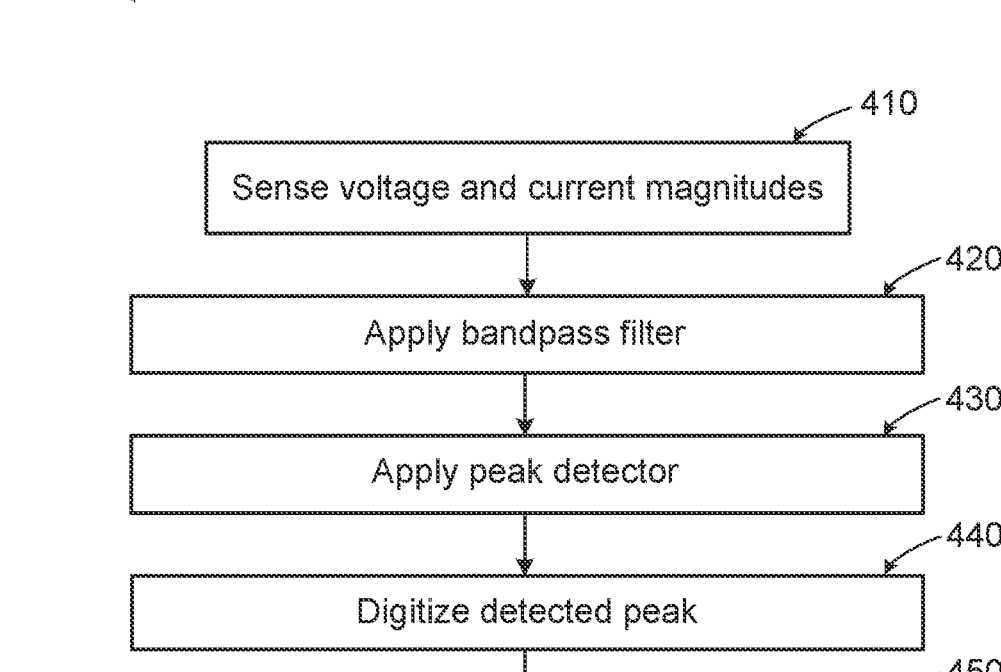
FIG. 4 is a flowchart for a method of measuring RF signal parameters, according to an implementation.

FIG. 4 is a flowchart for a method of measuring RF signal parameters, according to an implementation 400. It should be noted that the disclosed implementations, such as those of FIG. 4 and FIG. 6, are intended to embrace variations of the respective figures, including methods that include actions in addition to those depicted in the figures, actions performed in an order different than those depicted in the figures, as well as methods including fewer steps than those depicted. The method of FIG. 4 begins at 410, which may include sensing of voltage and current magnitudes, such as by way of voltage sensor 305 and current sensor 310 as indicated in FIG. 3. The method of FIG. 4 may additionally include application of bandpass filter, such as at 420, which may operate to remove noise and/or out-of-band signals as well as other signal distortions in measured current and voltage magnitudes. At 430, a filtered voltage may be applied to a peak detector, which may employ a sample-and-hold technique to measure a peak voltage and/or a peak current of an RF signal conveyed from an RF signal generator to one or more stations of a multi-station integrated circuit fabrication chamber. At 440, and output of a peak detector may be measured and digitized. At 450, parameters from detected voltage and current peaks may be computed. In some instances, computing operations of 450 may include computing real and/or imaginary power conveyed in a signal from an RF signal generator as well as voltage and current values, phase relationships between voltage and current signals, and so forth.

It may be appreciated that, at least under particular circumstances, the apparatus and method of FIGS. 3 and 4 may apply to RF signals having frequencies within particular ranges. It may also be appreciated that particular processes referred to in FIGS. 3 and 4 may provide RF current and voltage measurements having at least some degree of accuracy when RF signal waveforms are at least approximately sinusoidal. Accordingly, if RF voltage and current measurements are performed utilizing waveforms that deviate significantly from sinusoidal waveforms, accuracy of voltage and current measurements may degrade. It may also be appreciated that, at least in particular instances, signal construction may be dependent upon the bandwidth of any analog-to-digital converters, which might be utilized at 440 of FIG. 4. Further, in response to noise signals being present in RF signal waveforms, accuracy of sensed voltages and currents may be negatively impacted.

Figure 5:
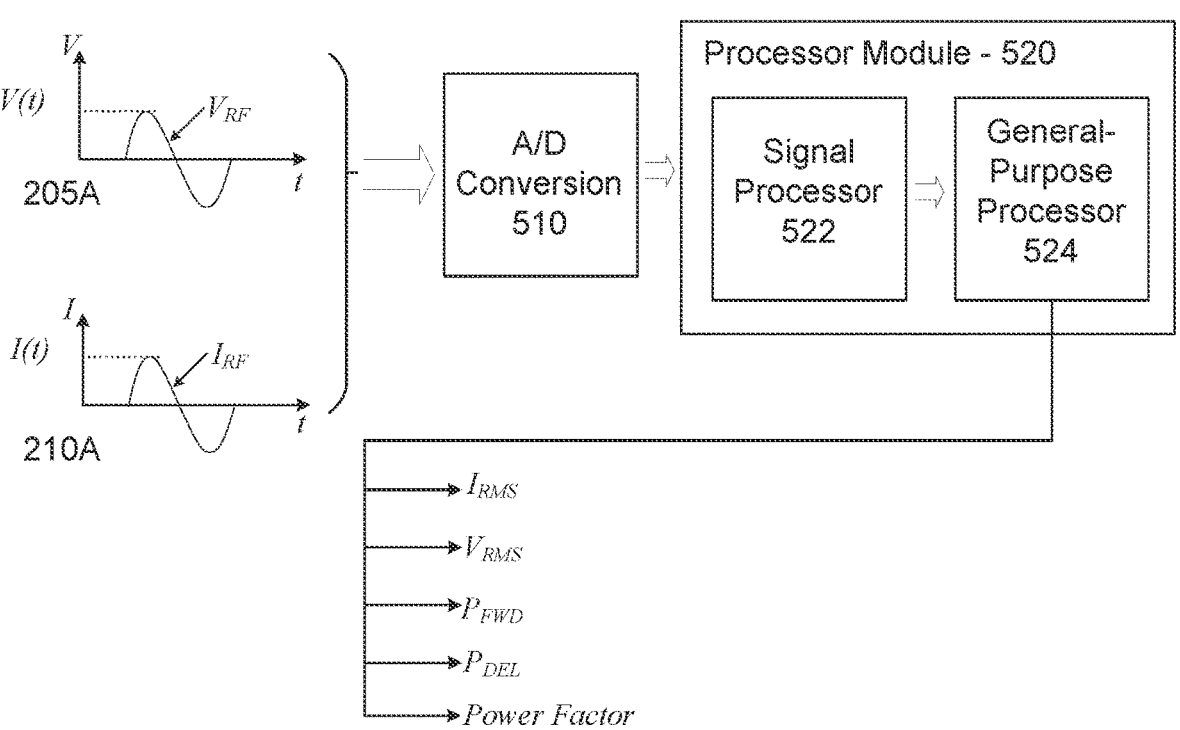
FIG. 5 is a schematic diagram of an apparatus adapted or configured to measure RF signal parameters, according to an implementation.

Thus, particular implementations of RF current and voltage measurements may represent an improvement over techniques identified utilizing the apparatus and method of FIGS. 3 and 4. Hence, FIG. 5, which avoids at least some of the draw backs brought about by the apparatus and method of FIGS. 3 and 4, shows a schematic diagram of an apparatus adapted or configured to measure RF signal parameters, according to an implementation 500. In FIG. 5, waveforms corresponding to voltage of an RF signal as well as current conducted by an RF signal may be coupled to an analog-to-digital conversion module 510. In the implementation of FIG. 5, voltage and current waveforms may be represented by approximately sinusoidal waveforms (e.g., waveforms 205A and 210A), although the disclosed implementations are not limited to sinusoidal variations in RF voltage and current.

As depicted in FIG. 5, voltage and current waveforms 205A and 210A may be converted to digital representations, such as by way of analog-to-digital conversion module 510. In particular instances, analog-to-digital conversion module 510 may involve a successive-approximation technique to arrive at digital representations of analog voltages of an RF signal as well as digital representations of current conducted by an RF signal. In such instances, an input voltage or current signal is held steady by a sample-and-hold circuit while a flash analog-to-digital converter quantizes the sampled signal into a relatively small number of binary digits (e.g., 3 binary digits, 4 binary digits, 5 binary digits, etc.). The sampled binary digits are then coupled to a digital-to-analog converter, which may be accurate to, for example, 12 binary digits. An analog output signal from the digital-to-analog converter may then be subtracted from the input signal to the analog-to-digital converter. The difference between the analog output signal from the digital-to-analog converter and the input signal to the analog-to-digital converter, which may be considered a "residue," is amplified and coupled to a subsequent stage of the analog-to-digital converter, and the above-described process may be repeated. In such a successive-approximation architecture, the amplified residue is conveyed through successive stages of the converter, thereby providing small number of binary digits at each stage (e.g., 3 binary digits, 4 binary digits, 5 binary digits, etc.), until the residue reaches a subsequent flash analog-to-digital converter, which operates to resolve the least-significant binary digits.

It should be noted that although analog-to-digital conversion module 510 is shown as a single module, in some implementations, analog-to-digital conversion module 510 may include separate analog-to-digital modules, such as computing modules. For example, in some implementations, analog-to-digital conversion module 510 may include a first analog-to-digital module to perform conversion of an analog voltage waveform to a stream of instantaneous values of a digitized voltage. A second analog-to-digital module may perform conversion of an analog current waveform to a stream of instantaneous values of a digitized current.

Responsive to conversion of signals representing instantaneous voltages and instantaneous currents of signals from an RF signal generator, signals from analog-to-digital conversion module 510 can be conveyed to input ports of a processor module 520. Processor module 520 may include signal processor 522 and general-purpose processor 524, which may operate to transform the digital representations of the instantaneous voltage into frequency domain representations of a complex voltage corresponding to the RF signal voltage. Signal processor 522 may additionally operate to transform the digital representations of the instantaneous analog current into frequency domain representations of a complex current corresponding to the RF signal current. Accordingly, in a particular example, a purely sinusoidal waveform of voltage (V (t)) having a period of about 1 us may be transformed, such as by signal processor 522, to a frequency domain representation having a corresponding single frequency of about 1 MHz. In at least certain implementations, off-the-shelf equipment may perform at least some of the functions performed by processor module 520.

In particular implementations, frequency domain representations of complex voltage and complex current may be represented by a polar or phasor notation, in which a magnitude of the complex current and/or the complex voltage may be expressed in conjunction with a phase angle (e.g., phasor notation). In other implementations, frequency domain representations of complex voltage and complex current may be represented by a real component (e.g., real voltage) and an imaginary component (e.g., imaginary voltage). Thus, signal processor 522 of processor module 520 may operate to extract real and imaginary voltage ($V_{RF}$) components and/or to extract real and imaginary current components ($I_{RF}$) of an RF signal. In particular implementations, signal processor 522 is capable of extracting voltage and current waveforms (V(t) and (I(t)) such as of FIG. 2 to form complex voltage and complex current values, which may be represented as:

$$V(t) = V_{RE}(k) + jV_{IM}(k) \qquad (2A)$$

$$I(t) = I_{RE}(k) + jI_{IM}(k) \qquad (2B)$$

In which the quantities $V_{RE}(k)$ and $jV_{IM}(k)$ correspond to real and imaginary components that correspond to instantaneous values of voltage and current sampled utilizing signal processor 522. In expressions (2A) and (2B), k is a descriptor corresponding to a value sampled at a particular sampling interval. In particular implementations, signal processor 522 may perform a transform that corresponds to a Fast Fourier Transform (FFT). However, in alternative implementations, signal processor 522 may perform other types of mathematical operations, such as a Discrete Fourier Transform, for example.

In the implementation of FIG. 5, following transformation of instantaneous values of voltage and current waveforms into digitized representations of such waveforms, general-purpose processor 524 may obtain such digitized representations. In certain implementations, general-purpose processor may access a database, for example, which may store a lookup table to provide calibration coefficients for digitized representations of current and voltage as a function of frequency. In an example implementation, such calibration coefficients may relate to corrections expressed in terms of a scattering parameter (e.g. $S_{21}$), such as from a scattering matrix $$\begin{bmatrix} S_{11} & S_{12} \\ S_{21} & S_{22} \end{bmatrix},$$

which may characterize for frequency-dependent deviations from ideal scattering parameters. In another example implementation, calibration coefficients may relate to frequency-dependent corrections expressed in terms of conventions other than scattering parameters, such as parameters of the "transmission" or $$\begin{bmatrix} A & B \\ C & D \end{bmatrix}$$

matrix, a "hybrid" or $$\begin{bmatrix} g_{11} & g_{12} \\ g_{21} & g_{22} \end{bmatrix}$$

matrix, etc.

In particular implementations, general-purpose processor 524 may combine digitized representations corresponding to voltage and current signals generated by an RF signal source to form, for example, root mean square (RMS) voltage ($V_{RMS}$) and RMS current ($I_{RMS}$). In particular implementations, RMS current may be expressed as a summation of sampled values of real and imaginary current, obtained substantially in accordance with expression (3) below:

$$I_{RMS} = \sqrt{\sum_{i=0}^{\frac{k}{2}-1} \left( I_{Re}^2(i) + I_{Im}^2(i) \right)} \tag{3}$$

Wherein $$I_{Re}^2(i) \text{ and } I_m^2(i)$$

refer to values of instantaneously-sampled current, in which "k" samples may be obtained over a sampling period, such as 1 second. In particular implementations, RMS may be expressed as a summation of sampled values of real and imaginary voltage, obtained substantially in accordance with expression (4), below:

$$V_{RMS} = \sqrt{\sum_{i=0}^{\frac{k}{2}-1} \left( V_{Re}^2(i) + V_{Im}^2(i) \right)} \tag{4}$$

Wherein $$V_{Re}^2(i) \text{ and } V_{Im}^2(i)$$

refer to values of instantaneously-sampled voltage, in which "k" samples may be obtained over a sampling period, such as 1 second.

General-purpose processor 524 of FIG. 5 may be additionally be configured to combine digitized representations corresponding to voltage and current signals from an RF source to generate instantaneous values of RF power conveyed to a process station. In particular implementations, RF power may be computed substantially in accordance with expression (4), below:

$$P_{FWD} = I_{rms} * V_{rms} \tag{4}$$

General-purpose processor 524 of FIG. 5 may additionally be configured to determine actual power delivered, which may be computed via combining sampled values of real and imaginary voltage and currents in which "k" samples may be obtained over a sampling period, such as 1 second. Actual power delivered may be computed substantially in accordance with expression (5), below:

$$P_{DEL} = \sum_{i=0}^{\frac{k}{2}-1} \left( V_{RE}(i) * I_{RE}(i) + V_{IM}(i) * I_{IM}(i) \right) \tag{5}$$

Wherein the quantities $V_{RF}$ and $I_{RF}$ represent real voltage and current components (respectively) and wherein $V_{IM}$ and $I_M$ represent imaginary voltage and current components (respectively). Further, computed forward and delivered power may be combined to compute a power factor, which refers to a ratio of power coupled to a load impedance (e.g., a process station of a multi-station fabrication chamber) versus power incident at the process station. Power factor at the process station, which may degrade responsive to incident power being reflected from the process station back to the RF signal generator, may be computed substantially in accordance with expression (6) below:

$$\text{Power Factor} = \frac{P_{DEL}}{P_{FWD}} \tag{6}$$

FIG. 6 is a flowchart for a method of measuring RF signal parameters in an integrated circuit fabrication chamber, according to an implementation. The method of FIG. 6 may be performed utilizing the apparatus of FIG. 5 described herein as well as utilizing voltage sensor 205 and current sensor 210 of FIG. 2. The method of FIG. 6 may begin at 610, which may include obtaining samples (e.g., analog samples) of magnitudes of current and voltage of RF signals. Such signals may include signal frequencies, for example, or may include a composite of 2 or more frequencies, such as frequencies between about 300 kHz and about 500 kHz, as well as frequencies in the megahertz range, such as frequencies of 13.56 MHz and/or about 27.12 MHz.

At 620, the obtained samples of voltage and current magnitudes may be converted to digital representations of voltage and current samples. In particular implementations, conversion operations of 620 may be performed by 2 separate (e.g., standalone) converters, which may operate as analog-to-digital converters. In certain implementations, a first analog-to-digital converter may digitize an output signal from a voltage sensor and a second analog-to-digital converter may digitize an output signal from a current sensor. In other implementations, analog-to-digital conversion operations at 620 may be performed by a single analog-to-digital conversion module, which may employ a time division multiplex approach in which a single analog-to-digital converter is utilized to digitize voltage magnitudes of both current and voltage.

The method of FIG. 6 may continue at 630, in which digital representations of sampled voltage and current magnitudes may be transformed to a frequency domain. In certain implementations, 630 may involve a use of a Fast Fourier Transform. In certain other implementations, 630 may involve use of a different transform, such as a Discrete Fourier Transform, for example. The method may continue at 640, which may involve combining frequency domain representations of current and voltage magnitudes to obtain RMS values of voltage and current. In some instances, combining of frequency domain representations of voltage and current magnitudes may involve computing such magnitudes substantially in accordance with expressions (3) and (4) to obtain $I_{RMS}$ and $V_{RMS}$, described hereinabove.

The method may continue at 650, in which RMS values of voltage and current may be combined, such as substantially in accordance with expression (4) described hereinabove, to obtain forward power ($P_{FWD}$). The method may continue at 660, in which frequency domain representations of voltage and/or current magnitudes may be combined to obtain power delivered and/or a power factor that expresses a ratio of power delivered to a load (such as a process station) with respect to forward power. Computation of power factor may be conducted substantially in accordance with expression (6), described hereinabove.

In some embodiments, characteristics of RF voltage signals and/or RF current signals may be determined using one or more integrated circuits such as programmable logic devices or Application Specific Integrated Circuits (ASICs). Some implementations employ Field Programmable Gate Array (FPGA) integrated circuits. In some embodiments, an integrated circuit may be used to implement one or more blocks that calculate or determine: 1) voltage and/or current magnitude: 2) voltage and/or current phase: 3) power characteristics associated with an input RF signal (e.g., a power factor, or the like): 4) a change in RF frequency; and/or 5) impedance characteristics.

In some embodiments, characteristics RF signals from multiple voltage and/or current sensors can be determined. For example, as shown in and described above in connection with FIG. 2, each process chamber of semiconductor manufacturing equipment that includes multiple process chambers may be associated with a voltage sensor and/or a current sensor. Continuing with this example, in some embodiments, voltage and/or current signals from each sensor may be multiplexed such that the integrated circuit cycles through samples from voltage and/or current sensors associated with each process chamber.

In some embodiments, blocks of an integrated circuit can determine characteristics of RF voltage signals and/or RF current signals by being programmed to: 1) down-convert RF voltage signals and/or RF current signals to determine real and imaginary parts of the RF voltage signals and/or RF current signals: 2) filter and down-sample the down-converted RF voltage signals and/or RF current signals; and 3) determine magnitude and phase information corresponding to the real and imaginary parts of the RF voltage signals and/or RF current signals.

In some embodiments, the phase information of the RF voltage signals and/or RF current signals can be used to determine power characteristics. For example, a power factor can be determined based on a comparison of the phase of an RF voltage signal to a phase of an RF current signal. As a more particular example, the power factor can be determined as the cosine of the difference between the phase of the RF voltage signal and the phase of the RF current signal.

In some embodiments, the phase of an RF voltage signal and/or the phase of an RF current signal can be used to determine a magnitude of a change of frequency of an RF signal. For example, in some embodiments, the frequency of the RF signal can be determined as a derivative the phase of the RF voltage signal or the phase of the RF current signal.

Figure 7:
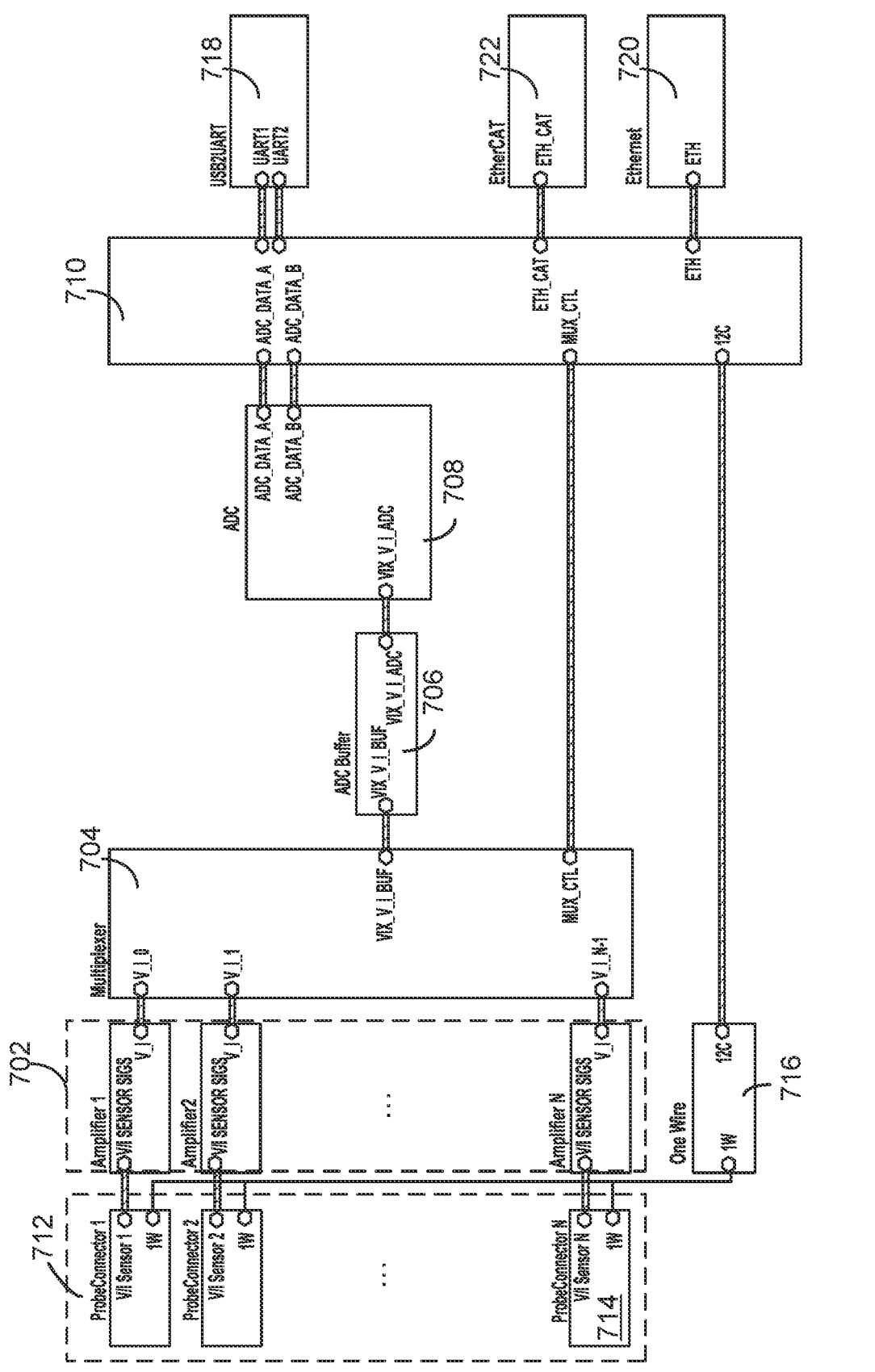
FIG. 7 is a block diagram illustrating components of a system for measurement of RF signal current and voltage parameters associated with multiple voltage and current sensors, according to an implementation.

FIG. 7 is a block diagram illustrating components of a system for measurement of voltage and current parameters of an input RF signal using multiple voltage and current sensors, according to an implementation.

FIG. 7 illustrates a set of sensors 712. Set of sensors 712 includes RF voltage sensors and RF current sensors, as shown in and described above in connection with FIG. 2. Set of sensors 712 includes individual RF voltage sensor/RF current sensor pairs, such as RF voltage sensor/RF current sensor pair 714.

A set of amplifiers 702 receives RF voltage signals and RF current signals from the RF voltage sensor/RF current sensor pairs included in set of sensors 712. It should be understood that any suitable number of voltage and current sensors can be used. Similarly, a number of amplifiers that corresponds to a number of voltage and current sensors can be used. In some implementations, a number of RF voltage sensor/RF current sensor pairs may correspond to a number of process chambers in a multi-process chamber configuration, as shown in and described above in connection with FIGS. 1B and 2.

Each sensor in set of sensors 712 may include a connector that allows the sensor to connect to an amplifier in set of amplifiers 702. Examples of connectors include 7/16 DIN connectors, SQS connectors, and the like.

A multiplexer 704 receives RF voltage and current signals from set of amplifiers 702. Multiplexer 704, together with a buffer 706, can act as a switch that selects one pair of voltage and current signals from set of amplifiers 702 to be provided as input to an Analog-to-Digital Converter (ADC) 708. Multiplexer 704 may be configured to switch between the sensors included in set of sensors 712 at a multiplexing rate. Examples of a suitable multiplexing rate include 0.8 msec, 1 msec, 1.5 msec, or the like. The multiplexing rate may depend on a number of sensors in set of sensors 712 and on a desired data update rate. For example, in an instance in which a desired data update rate is 1 msec, and in which there are 5 sensors in set of sensors 712, the multiplexing rate is 1 msec/5 sensors, or 0.2 msec. In some implementations, the multiplexing rate may have a relationship with a signal to noise ratio. For example, the multiplexing rate may be lowered to sample each sensor for a longer duration of time, thereby increasing the signal to noise ratio. In some implementations, the multiplexing rate may be determined based on a current signal to noise ratio. For example, in some implementations, the multiplexing rate may be lowered in response to determining that a current signal to noise ratio is below a threshold. As another example, in some implementations, the multiplexing rate may be increased in response to determining that a current signal to noise ratio is above a threshold. ADC 708 can generate digitized representations of the selected RF voltage and current signals. In some embodiments, ADC 708 can sample an input signal at a predetermined sampling frequency. Examples of sampling frequencies include 150 MHz, 200 MHz, 250 MHz, and the like. ADC 708 can provide the digitized representations to an integrated circuit 710. It should be noted that, in some embodiments, ADC 708 may be implemented as a portion or region of code or circuitry of an integrated circuit (e.g., an ASIC, an FPGA, or the like). Such an integrated circuit may include additional other portions or additional other regions of code. For example, ADC 708 may be implemented as part of integrated circuit 710.

Integrated circuit 710 may be programmed to determine characteristics of the selected RF voltage and current signals, such as magnitude information, phase information, power characteristics, and the like. For example, integrated circuit 710 can be programmed to perform the method shown in and described below in connection with FIG. 13. In some embodiments, integrated circuit 710 may include modules similar to the modules shown in and described below in connection with FIGS. 8-11.

In some embodiments, integrated circuit 710 may communicate with RF voltage sensors and/or RF current sensors included in set of sensors 712 via a communication block 716. Communication block 716 may be configured to implement a communication protocol to transmit information between sensors in set of sensors 712 and integrated circuit 710. An example communication protocol that may be used is the MAXIM ONE-WIRE protocol. In some embodiments, integrated circuit 710 may cause calibration information (e.g., calibration coefficients, or the like) to be stored in memory of individual RF voltage sensors and/or individual RF current sensors in set of sensors 710 via communication block 716. As another example, in some embodiments, individual RF voltage sensors and/or individual RF current sensors may be configured to provide identification information to integrated circuit 710 (e.g., at system turn-on, or other similar times). Examples of sensor identification information may include a sensor identifier (e.g., serial number, part number, etc.), a port location, a revision number, or the like. In some embodiments, integrated circuit 710 may be configured to verify that a particular RF voltage sensor or particular RF current sensor has not been erroneously used in the system by verifying the sensor identifier.

Outputs of integrated circuit 710 may be provided to various components or modules. For example, outputs of integrated circuit 710 may be provided to a second communication block 718. Second communication block 718 may be configured to implement a communication protocol that transmits data from integrated circuit 710 to various other devices. For example, communication block 718 may be configured to implement a serial communication protocol for transmitting data from integrated circuit 710 to one or more other devices via a serial interface. As a more particular example, in some embodiments, communication block 718 may be implemented as a Universal Asynchronous Receiver/Transmitter (UART) microchip.

Additionally or alternatively, outputs of integrated circuit 710 may be provided to Ethernet block 720 and/or Ethernet for Control Automation Technology (EtherCAT) block 722. In some embodiments, data provided from integrated circuit 710 to Ethernet block 720 and/or EtherCAT block 722 may be used as feedback to provide instructions to one or more elements (e.g., tuning elements) in a matching network. For example, instructions may be provided to a motion controller PCB. In some such embodiments, the motion controller PCB may control an RF match capacitor rotational position. For example, the RF match capacitor rotational position may be controlled based on RF impedance information determined by integrated circuit 710, power information determined by integrated circuit 710, or the like. It should be noted that feedback provided via EtherCAT block 722 may be provided at a sub-millisecond rate.

It should be noted that, in some embodiments, physical shields may be placed around RF voltage sensors and/or RF current sensors in set of sensors 712. Additionally or alternatively, in some embodiments, physical shields may be placed between RF voltage sensors and/or RF current sensors in set of sensors 712 and integrated circuit 710. Such shields may provide isolation and grounding. Accordingly, such shields may minimize potential electrical field interference on current measurement. Similarly, such shields may minimize potential magnetic field interference on voltage measurement. A physical shield may be a metal shield (e.g., substantially made of aluminum).

Figure 8:
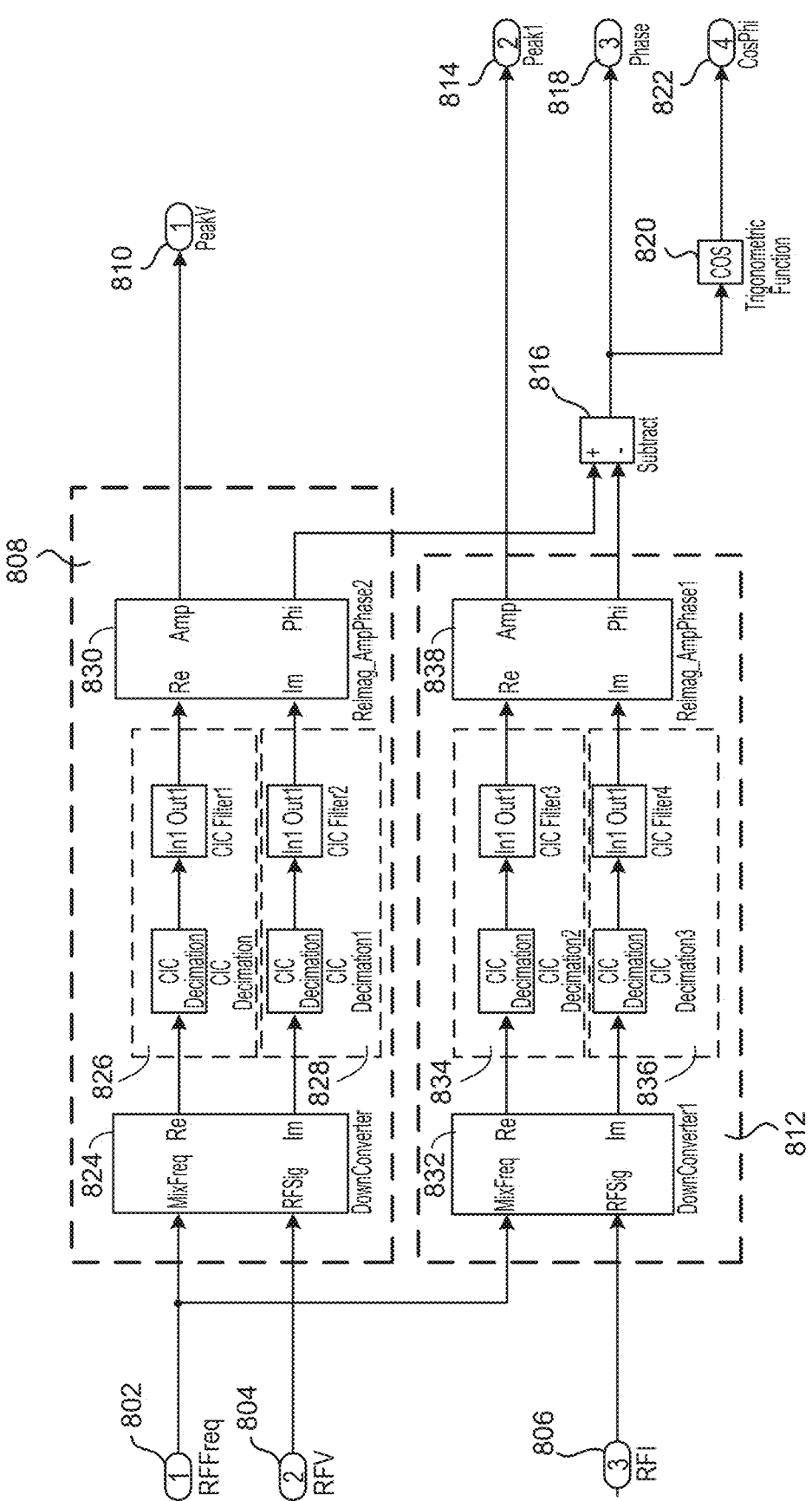
FIG. 8 is a block diagram illustrating components of a system for measurement of RF signal current and voltage parameters, according to an implementation.

FIG. 8 is a block diagram illustrating components of a system for measurement of RF voltage and current parameters, according to an implementation. In particular, FIG. 8 illustrates modules of an integrated circuit that may be programmed to measure RF voltage and current parameters. It should be noted that, as used herein, "modules" of an integrated circuit refer to individual blocks of the integrated circuit that are each configured to perform various functions, such as down-conversion, decimation filtering, magnitude and phase determination, or the like. Each module may be specified using software code (e.g., in Hardware Definition Language (HDL)) or other logical representation of hardware elements. In some embodiments, the software code may be compiled. For example, functionality of a module within an FPGA may be configured based on the compiled software code. As implemented, a module of an FPGA or other programmable logic device or of a non-programmable logic device such as an application specific integrated circuit (ASIC, or a digital signal processors (DSP) is a collection of circuits having devices (e.g., transistors, memory elements, LUTs, etc.) and interconnects between the devices. As illustrated, the integrated circuit may take, as inputs, an RF frequency signal 802, an RF voltage signal 804, and an RF current signal 806.

RF frequency signal 802 may be an RF frequency setting that substantially corresponds to a frequency of an RF signal generated by an RF signal generator. The RF signal generator may be an RF signal generator that provides a high-power RF signal to a process chamber or a group of process chambers. In some embodiments, RF frequency signal 802 may track a frequency of the RF signal generated by the RF signal generator. For example, in an instance in which the RF signal generator operates at a variable frequency, RF frequency signal 802 tracks the variable frequency of the RF signal generator.

RF voltage signal 804 may be an output of an RF voltage sensor. RF current signal 806 may be an output of an RF current sensor.

RF frequency signal 802 and RF voltage signal 804 can be processed by a first branch 808. First branch 808 can generate, as outputs, a peak magnitude 810 of RF voltage signal 804 and a phase of RF voltage signal 804. In some embodiments, first branch 808 can include a down-conversion module 824, one or more filtering and down-sampling modules (e.g., a real-part filtering and down-sampling module 826 and/or an imaginary-part filtering and down-sampling module 828), and/or a magnitude/phase determination module 830.

RF frequency signal 802 and RF current signal 806 can be processed by a second branch 812. Second branch 812 can generate, as outputs, a peak magnitude 814 of RF current signal 806 and a phase of RF current signal 806. In some embodiments, second branch 812 can include a down-conversion module 832, one or more filtering and down-sampling modules (e.g., a real-part filtering and down-sampling module 834 and/or an imaginary-part filtering and down-sampling module 836), and/or a magnitude/phase determination module 838.

Figure 9:
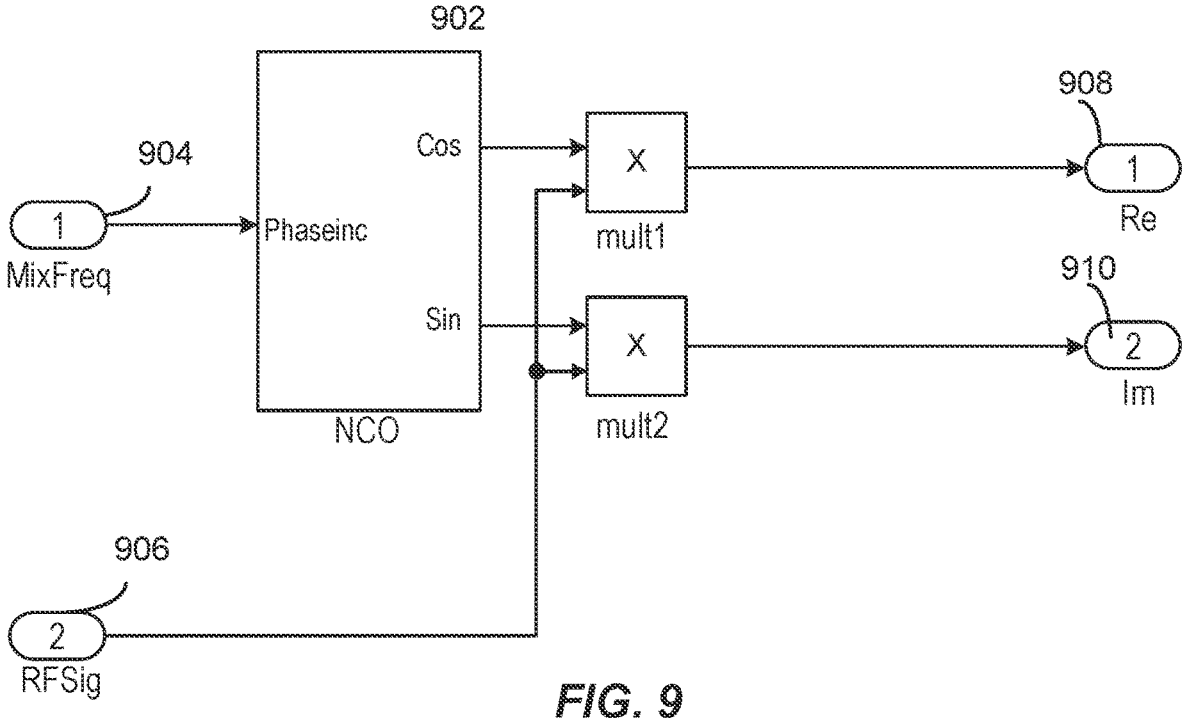
FIG. 9 is a block diagram illustrating components for down-converting RF current signals and RF voltage signals, according to an implementation.
Figure 10:
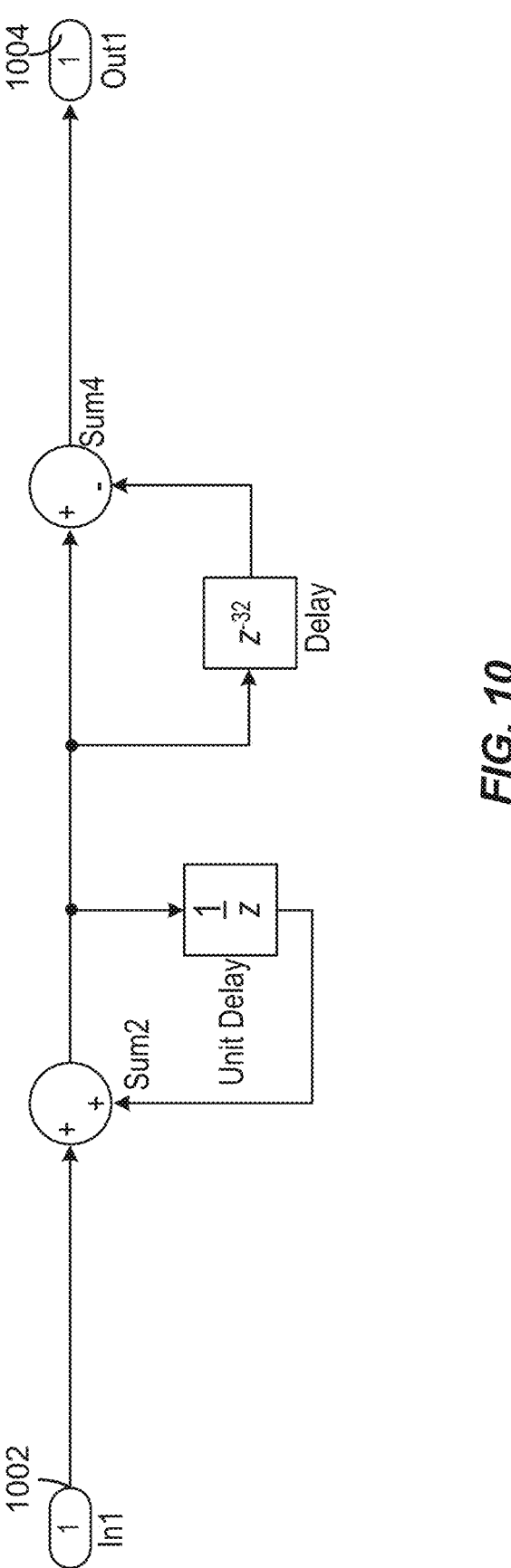
FIG. 10 is a block diagram illustrating components for filtering and down-sampling RF current signals and RF voltage signals, according to an implementation.
Figure 11:
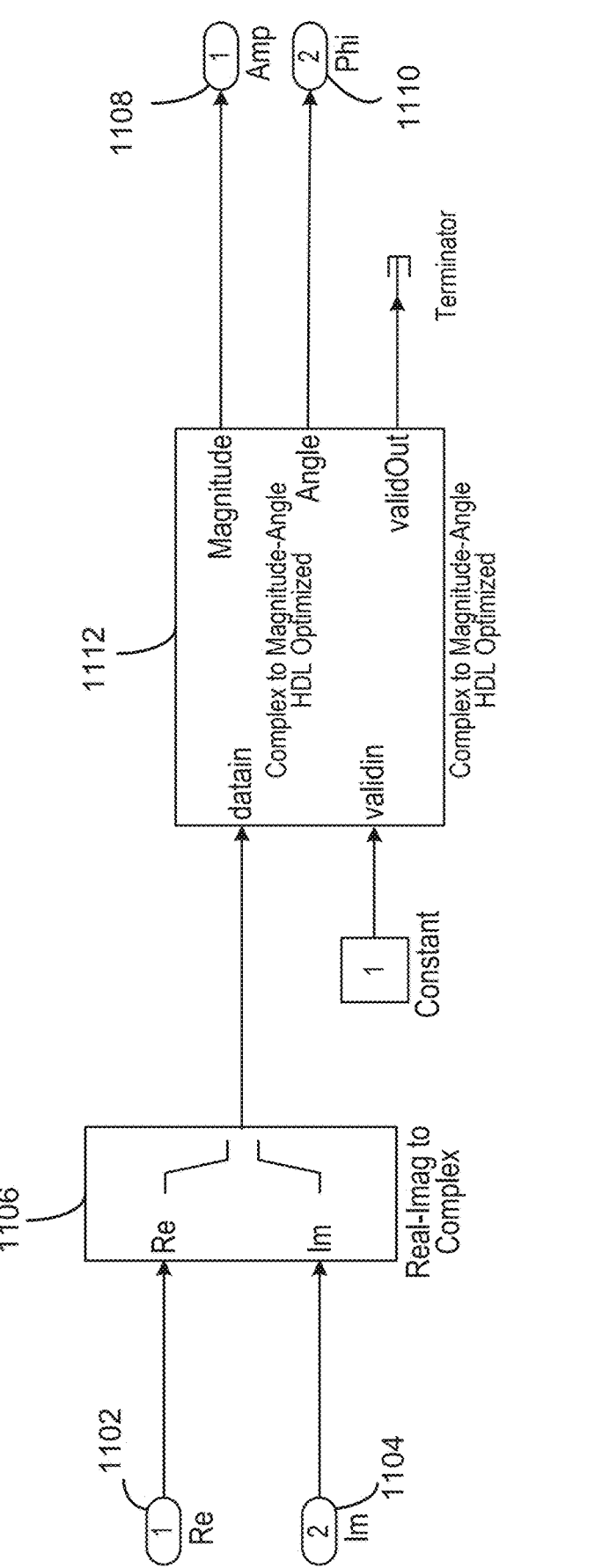
FIG. 11 is a block diagram illustrating components for determining magnitude and phase information of RF current signals and RF voltage signals, according to an implementation.

It should be noted that modules of first branch 808 may be similar to or substantially the same as modules of second branch 812. More detailed schematic diagrams of a down-conversion module, a filtering and down-sampling module, and a magnitude/phase determination components are shown in FIGS. 9-11, respectively. Additionally, it should be noted that first branch 808 and second branch 812 may execute substantially in parallel.

A difference between the phase of RF voltage signal 804 and the phase of RF current signal 806 may be determined at 816 to determine a phase difference 818.

The cosine of phase difference 818 may be determined at 820 to determine a power factor 822.

FIG. 9 is a block diagram illustrating a down-conversion module for down-conversion of an RF voltage signal and/or an RF current signal, according to an implementation.

Note that the block diagram shown in FIG. 9 may correspond to the down-conversion modules (e.g., down-conversion modules 824 and/or 832) shown in FIG. 8.

As illustrated in FIG. 9, a Numerically Controller Oscillator (NCO) 902 can be used as a Local Oscillator to frequency mix an RF signal input 906 (e.g., either an RF voltage signal or an RF current signal) from a carrier frequency to baseband. As illustrated, NCO 902 can take, as an input, an RF frequency setting 904, which is sometimes referred to herein as $f_{NCO}$). In some embodiments, RF frequency setting 904 may be variable. In some embodiments, RF frequency 904 may be selected through software control based on a frequency band of interest. In some embodiments, RF frequency setting 904 may be set, modified, or adjusted based on a current estimate of a frequency of an RF signal generated by an RF signal generator, as shown in and described below in connection with FIG. 12. That is, in some embodiments, RF frequency setting 904 may substantially track the frequency of the RF signal generated by the RF signal generator.

Down-conversion of RF signal input 906 may be a complex mix to baseband (e.g., mixing in quadrature). As illustrated in FIG. 9, the down-conversion module can therefore generate a real part 908 and an imaginary part 910.

A down-converted RF signal (e.g., a down-converted RF voltage signal and/or a down-converted RF current signal) may have a lower bandwidth compared to the sampling rate. In some embodiments, the down-converted RF signal may be filtered to eliminate aliasing and then down-sampled to reduce the sampling rate. In some embodiments, a decimation filter is used to filter and down-sample the down-converted RF signal. In some embodiments, a decimation filter may be implemented in an integrated circuit using a Cascade Integrate Comb (CIC) filter.

FIG. 10 is a block diagram illustrating a filtering and down-sampling module for down-sampling of an RF voltage signal and/or an RF current signal, according to an implementation. Note that the block diagram shown in FIG. 10 may correspond to the filtering and down-sampling modules (e.g., filtering and down-sampling modules 826, 828, 834, and 836) as shown in FIG. 8.

FIG. 10 shows a block diagram for using CIC filtering to filter and down-sample an input signal 1002 (e.g., a down-converted RF voltage signal or a down-converted RF current signal) to generate a down-sampled output signal 1004.

A magnitude and/or phase of a down-sampled signal may be determined (e.g., a magnitude and/or a phase of a down-sampled RF voltage signal, a magnitude and/or phase of a down-sampled RF current signal, and the like). In some embodiments, the magnitude and/or phase of the RF signal may be determined from real and imaginary parts of the down-sampled RF signal using Volder's algorithm. In some embodiments, Volder's algorithm may be implemented in an integrated circuit using Coordinate Rotation Digital Computer (CORDIC).

FIG. 11 shows a block diagram for determining amplitude and phase of an RF input signal based on real and imaginary parts of the RF input signal.

Real part 1102 and imaginary part 1104 may correspond to down-sampled real and imaginary parts of an RF input signal. For example, referring to FIG. 8, real part 1102 may correspond to an output of filtering and down-sampling module 826 (e.g., in an instance in which the RF signal is an RF voltage signal). As another example, real part 1102 may correspond to an output of filtering and down-sampling module 834 (e.g., in an instance in which the RF signal is an RF current signal). As yet another example, imaginary part 1104 may correspond to an output of filtering and down-sampling module 828 (e.g., in an instance in which the RF signal is an RF voltage signal). As still another example, imaginary part 1104 may correspond to an output of filtering and down-sampling module 836 (e.g., in an instance in which the RF signal is an RF current signal).

Real part 1102 and imaginary part 1104 may be combined at 1106 to a complex representation. The complex representation may then be used to determine a magnitude 1108 and/or a phase 1110 of the RF signal using CORDIC. In some embodiments, CORDIC may be implemented at 1112 using Hardware Description Language (HDL).

To mix an RF voltage signal and/or an RF current signal to baseband, the RF voltage signal and/or the RF current signal is mixed with sine and cosine waveforms with frequencies that correspond to the frequency of the input RF signal (e.g., the RF signal generated by an RF signal generator that provides high-power RF signals to one or more process chambers). The sine and cosine waveforms may be generated by an NCO that acts as a Local Oscillator. The frequency of the sine and cosine waveforms is generally referred to as $f_{NCO}$ herein.

In some instances, the frequency of the RF signal generated by an RF signal generator may vary over time. For example, an RF signal generator operating in a tuning mode may have an instantaneous frequency that varies over time. For example, an RF signal generator may be set to provide an RF RF frequency of 13.56 MHz, 27.12 MHz, or the like. However, the RF signal generated by the RF signal generator may have an instantaneous frequency that varies from the set (i.e., expected) RF frequency. Mixing an RF voltage signal or an RF current signal with sine and cosine waveforms having the set RF frequency rather than the actual RF frequency may result in frequency errors at baseband. The frequency errors may lead to voltage and/or current measurement errors. Accordingly, it is desirable to generate sine and cosine waveforms that have frequencies that track the instantaneous RF frequency of the RF signal generated by the RF signal generator. Tracking and updating the RF signal frequency may provide more accurate calculation of RF characteristics, such as magnitude and/or phase, power factor, and the like.

In some embodiments, the systems and methods described herein allow the sine and cosine waveforms generated by the NCO to track the actual RF frequency of the RF signal generated by the RF signal generator. For example, in some embodiments, the frequency of the RF signal may be determined and/or tracked. Continuing with this example, in some embodiments, the determined RF frequency may be provided to the NCO to generate sine and cosine waveforms for down-converting RF voltage signals and/or RF current signals using the determined RF frequency.

In some embodiments, the frequency of the RF signal may be iteratively updated based on a phase of the RF voltage signal or the phase of the RF current signal. For example, in some embodiments, the frequency may be determined as the derivative of the phase as a function of time. An example of an equation to determine the frequency of the RF signal is:

$$f = \frac{d\theta}{dt} \qquad (7)$$

It should be noted that, in some embodiments, other techniques may be used to determine and/or iteratively update the frequency of the RF signal, such as a digital phase-locked loop (PLL), a Fourier analysis, and the like.

In some embodiments, a change in estimated frequency of an RF signal between two successive time points may be compared to a threshold. In an instance in which the change exceeds the threshold, RF voltage sensor samples and/or RF current sensor samples may be discarded due to inaccuracy.

Figure 12:
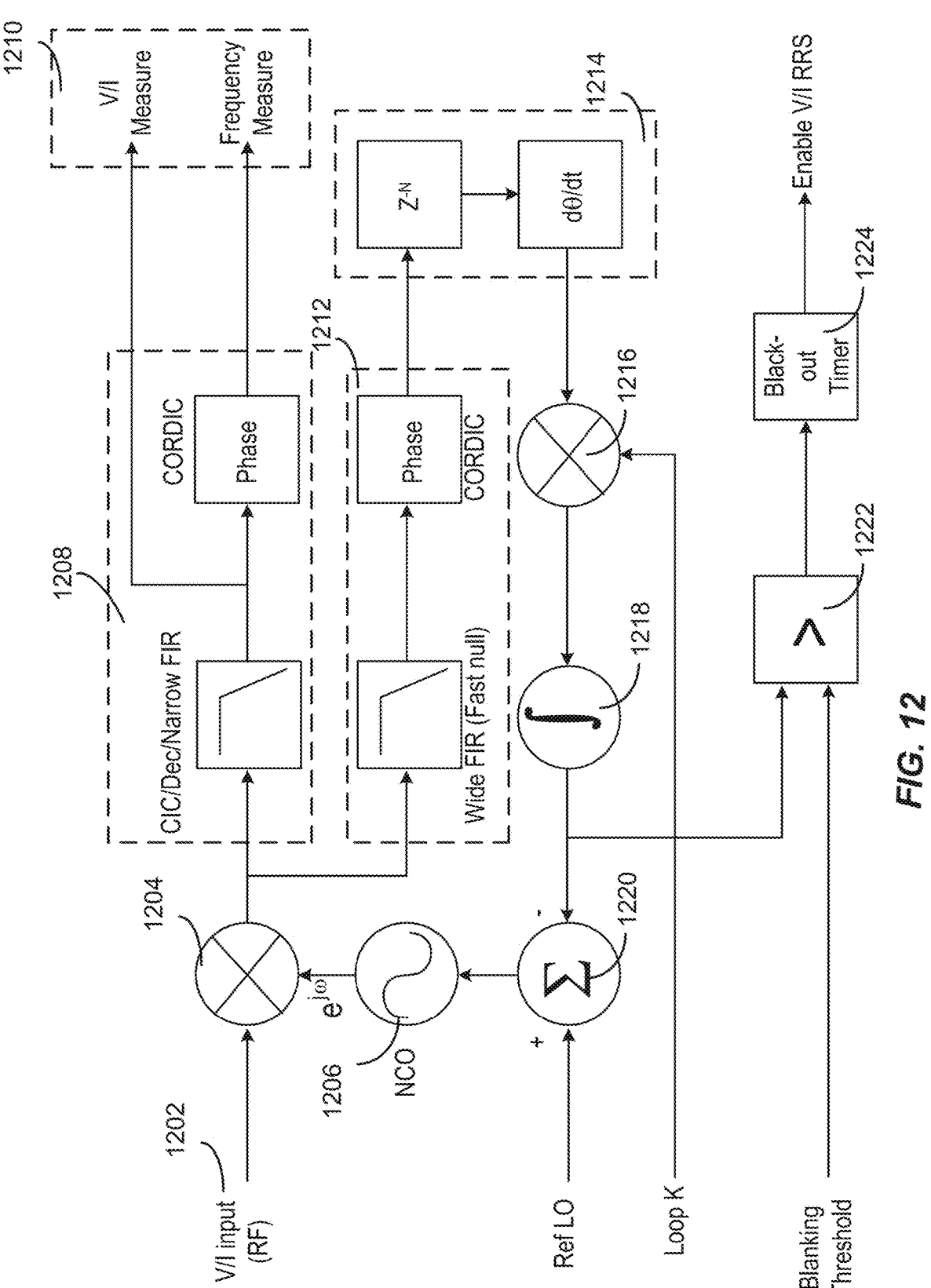
FIG. 12 is a block diagram illustrating a process for determining magnitude, phase, and power characteristics of RF current and RF voltage signals, according to an implementation.

FIG. 12 shows a block diagram illustrating a process for determining magnitude, phase, and power characteristics of RF current and RF voltage signals, according to an implementation.

As illustrated, an input corresponding to an RF voltage signal and/or an RF current signal is obtained at 1202. The RF voltage signal and/or the RF current signal may be conditioned in any manner, as described above in connection with FIG. 7.

At 1204, the RF voltage signal and/or the RF current signal are mixed to baseband. The mix to baseband uses sine and cosine waveforms generated at 1206 using an NCO that acts as a Local Oscillator operating at a frequency fico. The RF voltage signal and/or the RF current signal that have been mixed to baseband are sometimes referred to herein as a down-converted RF voltage signal and/or a down-converted RF current signal, respectively.

At 1208, the down-converted RF voltage signal and/or the down-converted RF current signal are down-sampled. Magnitude and/or phase information is derived. For example, as shown in FIG. 12, filtering and down-sampling may be performed using a decimation filter (e.g., using a CIC filter). Undesired signals (e.g., noise, or other undesired signals) may be rejected using a narrow band Frequency Impulse Response (FIR) filter. The passband width of the narrow band CIC filter may be 200 kHz, 400 kHz, or the like. The center frequency of the CIC filter may be set based on a tracked frequency determined at block 1214, as described below: Magnitude characteristics, phase characteristics, and/or frequency characteristics may be derived using CORDIC to generate outputs 1210.

At 1212, the down-converted RF voltage signal and/or the down-converted RF current signal may be applied to a branch parallel to the branch at 1208. As illustrated, the down-converted RF voltage signal and/or the down-converted RF current signal may be filtered using a wide FIR filter. The passband width of the wide FIR filter may be, e.g., +/−5% of the center frequency, +/−8% of the center frequency, or the like. The center frequency may correspond to a set frequency of the RF signal generator. Magnitude and phase information may then be derived using CORDIC.

At 1214, an estimate of the current frequency of the RF signal is determined using the derivative of the phase of the RF voltage signal or the phase of the RF current signal.

In some implementations, the estimate of the current frequency is used to set a center frequency of the narrow band FIR filter shown in and described above in connection with block 1208. That is, in some implementations, the wide FIR filter shown in and described above in connection with block 1212 is used to estimate the current frequency of the RF signal. The estimate of the current frequency of the RF signal is used to configure the narrow band FIR filter shown in and described above in connection with block 1208. The configured narrow band FIR filter is then used to determine the voltage/current characteristics, the power characteristics, etc. at block 1210.

At 1216 and 1218, the estimate of the current frequency is integrated over multiple samples obtained at different time points.

At 1220, a difference between the frequency estimate and a reference frequency (indicated in FIG. 12 as "Ref LO") is determined. The difference between the frequency estimate and the reference frequency may then be used to adjust $f_{NCO}$ at 1206.

The speed at which the feedback loop adjusts to changes in frequency is determined by the loop gain, which is indicated as "Loop K" in FIG. 12. Higher values of K may cause a faster response to changes in instantaneous frequency. However, higher values of K may cause an increase in noise and/or a higher likelihood of instability. Conversely, lower values of K may cause a slower response to changes in frequency. However, lower values of K may yield less noise in voltage and/or current measurements.

In some embodiments, the estimate of the current frequency is compared at 1222 to a threshold (indicated in FIG. 12 as "blanking threshold"). In response to determining that the current frequency exceeds the threshold, a black-out timer may be applied at 1224. For example, in some embodiments, measurement of RF voltage signals and/or RF current signals may be paused for a predetermined duration of time. In other words, measurements of RF voltage signals and/or RF current signals may be paused when a frequency of the RF signal is changing at a rate that exceeds a threshold.

FIG. 13 is a flowchart for a method 1300 of determining magnitude, phase, and power characteristics of RF current and RF voltage signals, according to an implementation.

At 1310, method 1300 obtains RF voltage signal samples and RF current signal samples. The RF voltage signal samples and RF current signal samples may be samples from a voltage sensor and/or a current sensor, as shown in and described above. In some embodiments, the RF voltage signal samples and/or RF current signal samples may be conditioned.

At 1320, method 1300 down-converts the RF voltage signal and the RF current signal to baseband. Down-conversion may be performed using a complex mix to baseband. That is, the down-converted RF voltage signal and the down-converted RF current signal may be represented as having imaginary and real parts. The mixing waveforms may be sine and cosine waveforms generated using an NCO that acts as a Local Oscillator operating at a frequency $f_{NCO}$. The frequency $f_{NCO}$ may be updated or adjusted to substantially track the actual frequency of an RF signal generated by an RF signal generator. An example schematic diagram for down-converting the RF voltage signal and/or the RF current signal is shown in and described above in connection with FIG. 9.

At 1330, method 1300 filters and reduces the sampling rate of the down-converted RF voltage signal and the down-converted RF current signal. For example, the down-converted RF voltage signal and the down-converted RF current signal may be filtered and down-sampled using decimation filtering. In some embodiments, decimation filtering may be applied using a CIC filter. An example schematic diagram for reducing the sampling rate of an RF voltage signal and/or an RF current signal is shown in and described above in connection with FIG. 10.

At 1340, method 1300 determines magnitude and phase information for each of the RF voltage signal and the RF current signal based on the imaginary and real parts of the down-sampled, down-converted signal. Magnitude and phase information may be determined from imaginary and real parts of the signal using Volder's algorithm. In some embodiments, Volder's algorithm may be implemented using CORDIC. An example schematic diagram for using CORDIC to determine magnitude and phase information of an RF voltage signal and/or an RF current signal is shown in and described above in connection with FIG. 11. In some embodiments, the magnitude of the RF voltage signal may be considered the peak voltage. In some embodiments, the magnitude of the RF current signal may be considered the peak current.

It should be noted that, in some embodiments, an impedance associated with an input RF signal may be determined based on the magnitude of the RF voltage signal and the magnitude of the RF current signal. For example, in some embodiments, the impedance may be determined as the ratio of the magnitude of the RF voltage signal to the magnitude of the RF current signal.

At 1350, method 1300 determines a power factor based on the difference between the phase of the RF voltage signal and the phase of the RF current signal. For example, the power factor may be determined as the cosine of the phase difference. The power factor may express a ratio of power delivered to a load (such as a process station) with respect to forward power.

At 1360, method 1300 obtains a current estimate of the RF signal frequency (e.g., the RF signal frequency generated by an RF signal generator) based on the RF voltage signal phase or the RF current signal phase. For example, the current RF signal frequency may be estimated based on a derivative of the phase.

The method may then loop back to 1310. Method 1300 may then obtain updated RF voltage signal samples and updated RF current signal samples. The current estimate of the RF signal frequency may be used to down-convert the RF voltage signal and/or the RF current signal at 1320. It should be noted that, in instances in which multiple voltage sensors and/or multiple current sensors are used (e.g., a different voltage/current sensor pair for each process chamber in a multi-process-chamber piece of equipment), at 1310, the method may obtain RF voltage signal samples and/or RF current signal samples from a different voltage sensor and current sensor.

A system that includes one or more RF voltage sensors and/or RF current sensors coupled to a controller for analyzing outputs of the RF voltage sensors and/or RF current sensors may be calibrated using various techniques. Calibration may be performed to generate calibration coefficients that transform raw RF voltage sensor measurements and/or raw RF current sensor measurements to controller outputs. Calibration coefficients may be dependent on characteristics of an RF voltage sensor and/or an RF current sensors, characteristics of cables used to couple a sensor to a controller (e.g., cable length, cable thickness, etc.), input characteristics at the controller, and the like. In some embodiments, calibration coefficients may be stored in memory (e.g., EEPROM) of a sensor and/or in memory associated with a controller. In some embodiments, by storing calibration coefficients in sensor memory, sensors may be swapped without having to re-calibrate the entire system. For example, calibration coefficients may be read from the sensory memory in response to detecting a change in power status (e.g., power on, system reset, or the like) of the system or apparatus. It should be noted that "controller," as used in connection with FIGS. 14A, 14B, 15A, and 15B refers to a system that receives RF voltage sensor and/or RF current sensor measurements as inputs. The system may include one or more amplifiers, a buffer, a multiplexer, an ADC, an integrated circuit to determine voltage, current, and/or power characteristics. For example, a controller may include 702, 704, 706, 708, 710, 716, 718, 720, and/or 722 of FIG. 7.

It should be noted that calibration may be performed at one or more RF frequencies. In some embodiments, calibration coefficients may be determined for each calibration frequency. In some such embodiments, calibration coefficients may be stored (e.g., in memory of RF voltage sensors and/or memory of RF current sensors) for each calibration frequency. Example calibration frequencies include 0.4 MHz, 13.56 MHz, 27.12 MHz, and the like.

In some embodiments, calibration may be performed modularly. For example, as shown in and described below in connection with FIGS. 14A and 15A, calibration coefficients associated with a sensor may be determined. For example, the calibration coefficients may be based on S-parameters from a vector network analyzer that characterize a sensor circuit. In some embodiments, calibration coefficients associated with sensor(s) may be stored in memory of the sensor(s). Continuing with this example, transformation coefficients that transform sensor outputs to a controller input may be determined. The transformation coefficients may be determined based on calibration coefficients associated with the sensors, cable characteristics that couple the sensors to the controller (e.g., cable length, cable impedance, and the like), etc. In some embodiments, the transformation coefficients may be stored in memory associated with the controller. In some such embodiments, transformation coefficients stored in memory of the controller may be associated with an identifier of a cable (e.g., a cable model number or part number), thereby allowing transformation coefficients associated with a particular cable to be retrieved from memory associated with the controller. An identifier of a cable may indicate cable characteristics, such as length. In some embodiments, a cable may be a "smart" cable. In some such embodiments, an identifier of a cable may indicate a Federal Communication Commission (FCC) identifier, an identifier of an embedded chip of the smart cable, or the like.

Additionally or alternatively, in some embodiments, calibration may be performed end-to-end such that the entire system is calibrated at once, as shown in and described below in connection with FIGS. 14B and 15B.

Figure 14A:
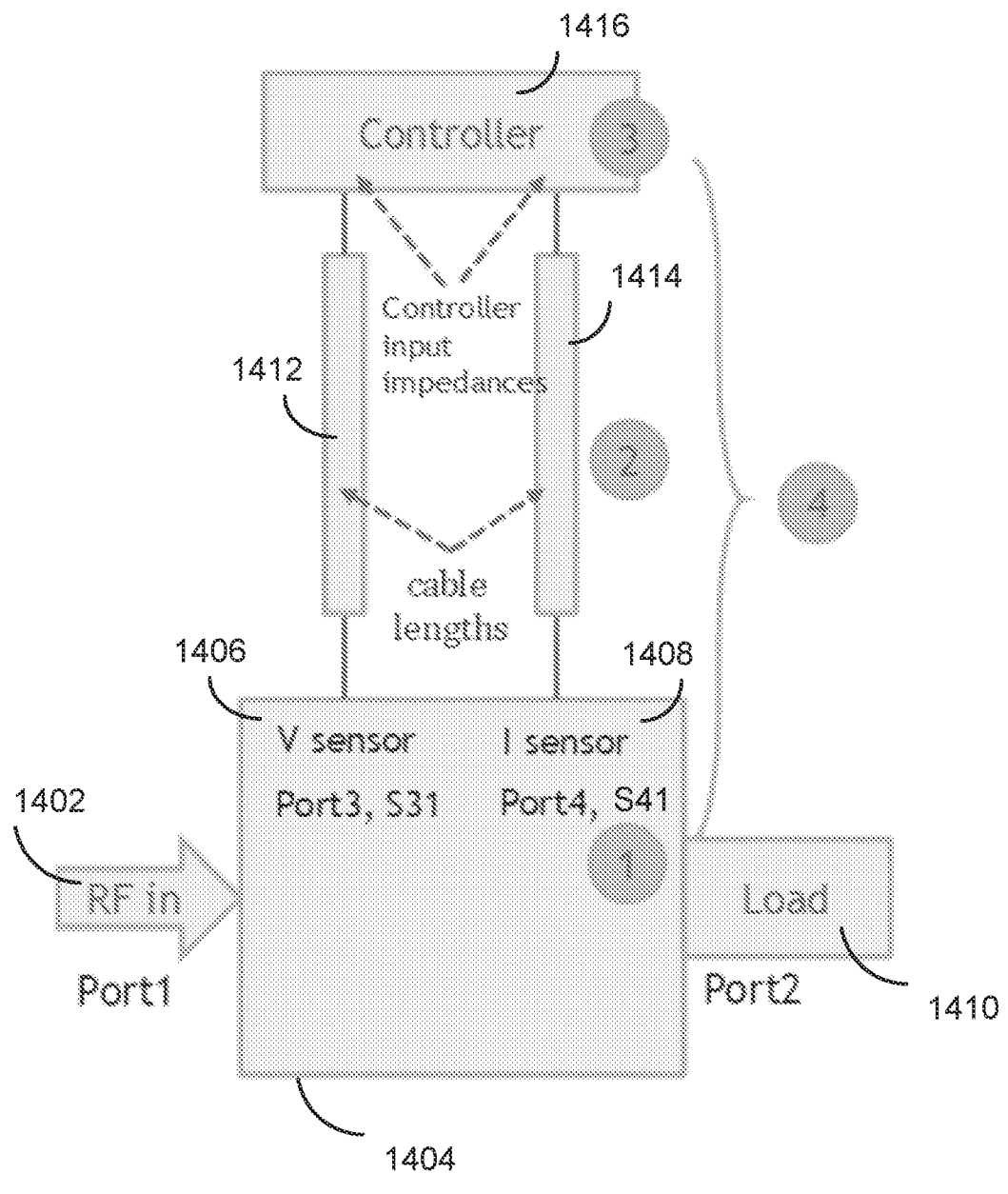
FIGS. 14A and 14B are schematic diagrams illustrating points of interest in calibration of a system for determining magnitude, phase, and power characteristics of RF current and RF voltage signals, according to an implementation.

FIG. 14A shows a schematic diagram for modular calibration of a system for determining magnitude, phase, and power characteristics of RF current and RF voltage signals, according to an implementation. Calibration may be performed to calibrate one or more sensors (e.g., one or more RF voltage sensors and/or one or more RF current sensors) of a sensor circuit 1404 that provide RF voltage and/or RF current inputs to a controller 1416.

As illustrated, an RF input signal 1402 may be input to a system that includes sensor circuit 1404. RF input signal 1402 may be an RF input signal generated by an RF signal generator, such as RF signal generator 114 of FIG. 1A. The sensor circuit may include an RF voltage sensor 1406 and/or an RF current sensor 1408. A load 1410 may be coupled to measure characteristics of sensor circuit 1404. Load 1410 may be a known load. Examples of load 1410 include a 50Ω resistance, a 100Ω resistance, or the like.

At step 1 of FIG. 14A, RF voltage sensor 1406 and RF current sensor 1408 may be calibrated. It should be noted that FIG. 14A illustrates a schematic diagram of a system, as well as steps (depicted by the numerals 1-4) of a method for calibrating the system.

In some embodiments, a two-port Vector network analyzer may be used to characterize response characteristics of the sensor circuit. Example two-port Vector network analyzers include the Keysight E5061B, the Keysight E5063A, or the like. The Vector network analyzer may be used to determine S-parameters (e.g., S21, S31, S41, and the like). The S-parameters may be used to determine outputs of RF voltage sensor 1406 and RF current sensor 1408 (denoted herein as V1 and I1). For example, V1 and I1 may be determined based on S31 and S41, respectively. In some embodiments, the S-parameters may be used to determine voltage and current components of the RF input signal 1402 (denoted herein as V2 and I2). For example, V2 and I2 may be determined based on S21 and a known value of load 1410. It should be noted that additional loads may be used to determine the transformation coefficients through fitting, in some embodiments. In some embodiments, a two-port Vector network analyzer may be used in multiple steps. For example, V1 may be determined based on S31 in a first step. Continuing with this example, I1 may be determined based on S41 in a second step.

In some embodiments, an impedance of the DUT may be determined using an open-short-load paradigm. For example, the corrected impedance of the DUT, referred to herein as $Z_{DUT}$, may be determined as:

$$Z_{DUT} = \frac{(Z_s - Z_{xm})(Z_{sm} - Z_o)}{(Z_{xm} - Z_o)(Z_s - Z_{sm})} Z_{std} \qquad (8)$$

In equation (8) above, $Z_0$ represents the measured open-circuit impedance, $Z_s$ represents the measured impedance under short circuit conditions, $Z_{sm}$ represents the measured impedance value of the known load, $Z_{std}$ represents the true (or expected) impedance value of the known load (e.g., 50Ω), $Z_{xm}$ represents a measured impedance value of the DUT, and $Z_{DUT}$ represents a corrected impedance value of the sensor circuit. Values of $Z_o$, $Z_s$, $Z_{sm}$, and $Z_{std}$, may be calculated based on the S-parameters.

The S-parameters can characterize the RF voltage sensor and/or the RF current sensor. In particular, the S-parameters can provide a transformation from an input voltage (e.g., from an RF signal generator) to the RF voltage produced by the RF voltage sensor. The S-parameters can similarly characterize the RF current sensor.

In some embodiments, the values of the calibration coefficients stored in memory of the RF voltage sensor and/or the RF current sensor may correspond to the values of $Z_o$, $Z_s$, $Z_{sm}$, and $Z_{std}$ calculated based on the S-parameters. For example, in some embodiments, the calibration coefficients may be stored in memory (e.g., EEPROM) of RF voltage sensor 1406 and/or RF current sensor 1408. These calibration coefficients may be retrieved at a later time (e.g., upon detection of an RF voltage sensor 1406 and/or RF current sensor 1408) such that various sensors can be swapped without having to recalibrate the entire system.

At step 2 of FIG. 14A, a transformation function can be determined that transforms the output value of RF voltage sensor 1406 to an input voltage value at controller 1416. Similarly, a transformation function can be determined that transforms the output value of RF current sensor 1408 to an input current value at controller 1416. Each transformation function may be determined based on various characteristics associated with the system. Examples of such characteristics may include characteristics of cables (e.g., cables 1412 and 1414) that couple RF voltage sensor 1406 and/or RF current sensor 1408 to controller 1416, an input impedance to controller 1416, a combination impedance that represents cable impedance and the input impedance to controller 1416, and the like. Example cable characteristics can include cable length, cable impedance, cable radius, cable material, and the like. In some embodiments, transformation coefficients associated with the transformation function(s) may be stored in memory (e.g., EEPROM) associated with the controller. Additionally or alternatively, in some embodiments, transformation coefficients associated with the transformation function(s) may be stored in memory associated with the cables that couple the RF voltage sensor and/or the RF current sensor to the controller.

At step 3 of FIG. 14A, a transformation function can be determined that transforms the input voltage value at controller 1416 to a raw output voltage value generated by controller 1416. Similarly, a transformation function can be determined that transforms the input current value at controller 1416 to a raw output current value generated by controller 1416. In some embodiments, the transformation function(s) may be determined using a dual output function generator that inputs a signal into controller 1416 to determine a scaling factor and/or a phase shift associated with the transformation function(s). In some embodiments, transformation coefficients that relate the input voltage value at controller 1416 to the raw output voltage value generated by controller 1416 and/or that relate the input current value at controller 1416 to the raw output current value generated by controller 1416 can be stored in memory associated with the controller.

At step 4 of FIG. 14A, the calibration coefficients associated with the RF voltage sensor and/or the RF current sensor, the transformation function(s) that transform sensor output to controller input, and the transformation function(s) that transform controller input to controller output can be combined to generate overall system transformation function(s). In some embodiments, transformation coefficients that represent the overall system transformation function(s) can be stored in memory associated with the controller.

Turning to FIG. 15A, an example flowchart for a method 1500 for performing modular calibration is shown, according to an implementation. It should be noted that blocks 1510 and 1520 of method 1500 relate to step 1 of FIG. 14A, block 1530 of method 1500 relates to step 2 of FIG. 14A, and block 1540 relates to step 3 of FIG. 14A.

At 1510, method 1500 obtains measurements associated with a sensor circuit that includes one or more RF voltage sensors and/or one or more RF current sensors. In some embodiments, the measurements may be obtained using a Vector network analyzer. In some embodiments, the measurements may be made using an open-short-load paradigm. For example, in some embodiments, the measurements may be obtained under three different conditions: 1) an open circuit condition: 2) a short circuit condition; and 3) a known load condition. The known load may be, for example, a 50Ω resistance, a 100Ω resistance, or the like. In some embodiments, the known load condition may be repeated with multiple different known loads.

At 1520, method 1500 determines calibration coefficients associated with the one or more RF voltage sensors and/or the one or more RF current sensors based on the measurements. For example, in some embodiments, the calibration coefficients can be determined based on network characteristics generated by a network analyzer, such as S-parameters, Z-parameters H-parameters, or the like.

At 1530, method 1500 determines one or more transformation functions that transform outputs of the RF voltage sensor(s) to an input voltage at a controller and that transforms outputs of the RF current sensor(s) to an input current at the controller. The transformation function(s) may be based on various characteristics, such as an input impedance of the controller, cable characteristics (e.g., a cable length, a cable impedance, a cable material, and the like), a combination of an input impedance of the controller and a cable impedance, and the like.

At 1540, method 1500 determines one or more transformation functions that transform an input voltage at the controller to a digitized output of the controller and that transforms an input current at the controller to a digitized output of the controller. The one or more transformation functions may be determined using a function generator (e.g., a dual output function generator). For example, the function generator may input a signal into the controller, and a scaling factor and/or a phase shift associated with the output signal may be measured. Continuing with this example, in some embodiments, the transformation function(s) may be determined based on the scaling factor and/or the phase shift.

At 1550, method 1500 may store parameters associated with the calibration coefficients and/or the transformation function(s) in memory associated with the RF voltage sensor(s), the RF current sensor(s), and/or in memory associated with the controller. For example, in some embodiments, calibration coefficients associated with the RF voltage sensor(s) and/or the RF current sensor(s) that are determined based on parameters generated by a network analyzer (e.g., S-parameters, Z-parameters, H-parameters, or the like) may be stored. Such calibration coefficients may be stored in memory (e.g., EEPROM memory) of the RF voltage sensor(s) and/or the RF current sensor(s). As another example, in some embodiments, coefficients and/or polynomial values associated with the transformation function(s) (e.g., the transformation functions determined at blocks 1530 and/or 1540) may be stored. Method 1500 may store the parameters associated with the transformation functions in memory associated with the controller.

Figure 14B:
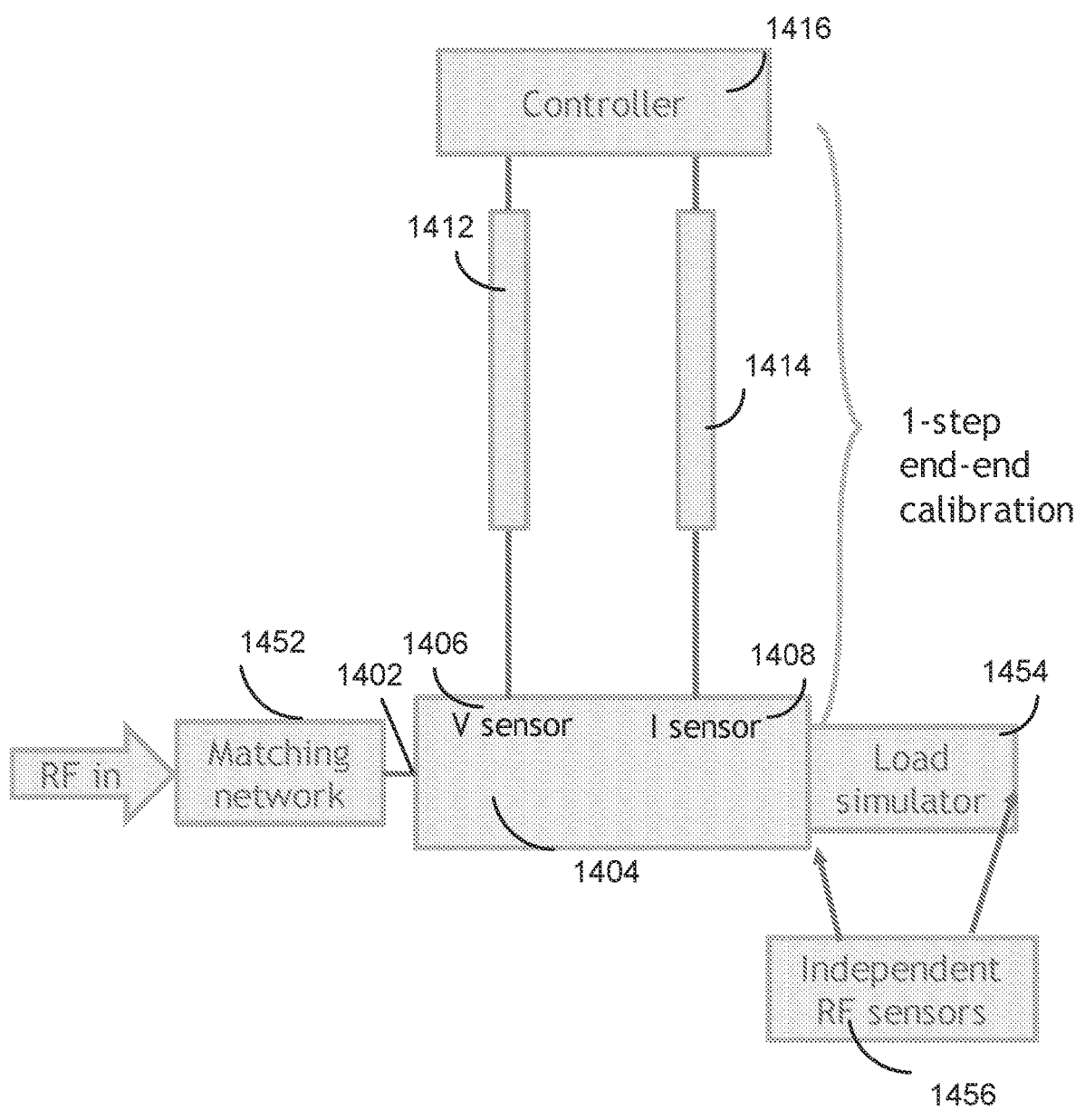

FIG. 14B shows a schematic diagram for end-to-end calibration of a system for determining magnitude, phase, and power characteristics of RF current and RF voltage signals, according to an implementation. Calibration may be performed to calibrate one or more sensors (e.g., one or more RF voltage sensors and/or one or more RF current sensors) of sensor circuit 1404 that provide RF voltage and/or RF current inputs to controller 1416

As illustrated, an RF input signal 1402 may be provided to a matching network 1452. In some embodiments, RF input signal may be an RF signal generator, such as RF signal generator 114 of FIG. 1A. In some embodiments, matching network 1452 may be a matching network such as matching network 116 of FIG. 1A that performs impedance matching from the RF signal generator that generates RF input signal 1402 to sensor circuit 1404.

System characteristics may be measured based on RF input signal 1402 with various loads simulated by a load simulator 1454. The system characteristics may be measured by independent RF sensors 1456. Independent RF sensors 1456 may have known characteristics. Measurements from an RF voltage sensor and/or an RF current sensor may therefore be compared with measurements from independent RF sensors 1456. Independent RF sensors 1456 may serve to monitor drift in the calibration system. In some embodiments, independent RF sensors 1456 may be commercially available.

Load simulator 1454 may simulate various known loads. In some embodiments, one or more loads simulated by load simulator 1454 may be a high-phase load. Examples of high-phase loads include loads that are substantially capacitive and/or substantially inductive. In some embodiments, load simulator 1454 may additionally or alternatively simulate a substantially resistive load, such as a 50Ω load, a 100Ω load, or the like.

In some embodiments, power characteristics can be measured for the loads simulated by load simulator 1454 using RF input signal 1402. It should be noted that, by using one or more high-phase loads, the system can be calibrated across a span of possible phases of an RF voltage sensor and/or an RF current sensor. By calibrating across the span of possible phases, power characteristics determined by the system may be more accurate.

One or more transfer functions that relate input voltage to the sensor circuit and input current to the sensor circuit to a digitized outputs of controller 1416 (e.g., indicating raw voltage and current measurements) and that relate a phase of input to the sensor circuit to a digitized output of controller 1416 (e.g., indicating raw phase measurements) can be determined based on the system characteristics measured for various known loads generated by load simulator 1454 and as measured by independent RF sensors 1456.

Turning to FIG. 15B, an example flowchart for a method 1560 for performing end-to-end calibration is shown, according to an implementation.

At 1570), method 1560) can obtain measurements associated with a sensor circuit that includes one or more RF voltage sensors and/or one or more RF current sensors. The RF voltage sensor(s) and the RF current sensor(s) may be coupled to a controller via one or more cables, as shown in FIG. 14B.

As shown in FIG. 14B, the measurements may be obtained using one or more independent RF sensors. Additionally, as shown in FIG. 14B, the measurements may be made with respect to a known load generated by a load simulator. For example, voltage may be measured across the known load. As another example, current may be measured through the known load. In some embodiments, the known load may include one or more high-phase loads. It should be noted that measurements may be obtained with any suitable number of loads (e.g., one, two, five, ten, or the like).

At 1580, method 1560 can determine one or more transformation function(s). The one or more transformation function(s) can relate: 1) the voltage at the RF voltage sensor(s) and a current going through the RF current sensor(s) to digitized outputs of the controller that represent raw voltage and/or current measurements, respectively; and/or 2) the phase of the input at the RF voltage sensor and/or the phase of the current going through the RF current sensor(s) to digitized phase outputs of the controller.

The one or more transformation function(s) may be determined based on characteristics of signals measured by the independent RF sensors across the known load(s). For example, the one or more transformation function(s) may be determined based on voltages measured across the known load(s), currents measured through the known load(s), phases of measured voltage or current signals, power at the known load(s), and/or any combination thereof.

At 1590, method 1560 can store parameters associated with the transformation function(s) in memory associated with the controller.

In some embodiments, measurements from one or more RF voltage sensors and/or one or more RF current sensors can be used to identify problems of an associated process chamber. For example, in some embodiments, the measurements may be analyzed to determine if there are any characteristics of the RF energy that may negatively impact deposition during a process (e.g., excessive particles, nonuniformity in deposition, or the like).

In some embodiments, a frequency domain representation of samples from one or more RF voltage sensors and/or one or more RF current sensors may be analyzed to identify anomalies that correspond to or correlate with particular trigger events. In some embodiments, the frequency domain representation may be determined by calculating an FFT of the RF voltage sensor samples and/or the RF current sensor samples.

In some embodiments, samples from the RF voltage sensor(s) and/or the RF current sensor(s) may be obtained and/or analyzed in response to detection of a trigger event. Examples of such a trigger event include when an RF signal generator is first turned on, when a measured RF voltage exceeds a predetermined threshold, when a measured RF current exceeds a predetermined threshold, when a power setpoint changes, when a process step or condition changes, and the like. It should be noted that, in some embodiments, multiple trigger events can be specified.

Examples of anomalies that may be detected in a frequency domain representation of samples of an RF voltage sensor and/or samples of an RF current sensor include energy at particular harmonics of the RF signal frequency exceeding a predetermined threshold, energy at particular inter-modulation products exceeding a threshold that indicate particular RF and plasma chamber interactions, or the like. In some embodiments, an indication of an identified anomaly can be stored or presented in various ways. For example, in some embodiments, information associated with an identified anomaly (e.g., an indication of the RF frequency associated with the anomaly, timestamp information, or the like) may be stored in a log. As another example, in some embodiments, information associated with an identified anomaly may be presented in a user interface, e.g., to a process engineer.

FIG. 16 shows an example flowchart for a method 1600 for identifying anomalous characteristics of RF signals associated with a process chamber or group of process chambers, according to an implementation.

At 1610, method 1600 obtains indications of one or more trigger events. As described above, the one or more events can include an RF signal generator being turned on or activated, a measured RF voltage (e.g., measured by an RF voltage sensor associated with a process chamber) exceeding a predetermined threshold, a measured RF current (e.g., measured by an RF current sensor associated with a process chamber) exceeding a predetermined threshold, or the like.

Method 1600 may obtain the indications of the one or more trigger events, for example, from a file that specifies the one or more trigger events. Such a file may be configured by a process engineer or other person charged with maintenance of the process chamber.

At 1620, method 1600 detects occurrence of a trigger event of the one or more trigger events. In some embodiments, the trigger event may be detected based on samples from a particular RF voltage sensor or a particular RF current sensor associated with the process chamber.

At 1630, in response to detecting occurrence of the trigger event, method 1600 obtains samples of RF voltage signals and RF current signals for further analysis. The sampling frequency may be 150 MHz, 200 MHz, 250 MHz, or the like. In some embodiments, method 1600 may obtain samples for a predetermined duration of time after a time point of the trigger event or may obtain a predetermined number of samples after a time point of the trigger event. The duration of time over which samples are obtained may be within a range of 5 msec-1 sec. For example, samples may be obtained for 10 msec, 50 msec, 500 msec, 1 sec, or the like.

At 1640, method 1600 determines frequency domain representations of the samples of the RF voltage signals and/or the samples of the RF current signals. In some embodiments, the frequency domain representations may be determined by calculating an FFT of the sampled RF voltage signals and/or the sampled RF current signals.

At 1650, method 1600 may identify an anomaly in the frequency domain representation of the RF voltage signals and/or the frequency domain representation of the RF current signals. For example, the anomaly may correspond to energy in a particular frequency band exceeding a predetermined threshold. In some embodiments, the frequency band may correspond to a particular harmonic (e.g., a second harmonic, or the like) of the RF frequency, a frequency associated with inter-modulation products that indicate a resonance frequency of the system, or the like.

At 1660, method 1600 may present or store information indicating the detected anomaly. The information may include a frequency band associated with the anomaly, an energy in the frequency band associated with the anomaly, timestamp information indicating a time at which the anomaly was detected, and the like. In some embodiments, method 1600 may cause the information indicating the anomaly to be stored in a log that can later be accessed. Additionally or alternatively, in some embodiments, method 1600 may cause information indicating the anomaly to be presented, for example, in a user interface.

More generally, in many instances, manufacture of semiconductor devices can involve depositing or etching of one or more thin films on or over a planar or non-planar substrate in an integrated fabrication process. In some aspects of an integrated process, it may be useful to deposit thin films that conform to unique substrate topography. As previously mentioned herein, one type of reaction that is useful in many instances may involve chemical vapor deposition (CVD). In typical CVD processes, gas phase reactants introduced into stations of a reaction chamber simultaneously undergo a gas-phase reaction. The products of the gas-phase reaction deposit on the surface of the substrate. Also as previously described, a reaction of this type may be driven by, or enhanced by, presence of a plasma, in which case the process may be referred to as a plasma-enhanced chemical vapor deposition (PECVD) reaction. As used herein, the term CVD is intended to include PECVD unless otherwise indicated. CVD processes have certain characteristics that render them less appropriate in some contexts. For instance, mass transport limitations of CVD gas phase reactions may bring about deposition effects that exhibit thicker deposition at top surfaces (e.g., top surfaces of gate stacks) and thinner deposition at recessed surfaces (e.g., bottom corners of gate stacks). Further, in response to some semiconductor die having regions of differing device density, mass transport effects across the substrate surface may result in within-die and within-wafer thickness variations. Thus, during subsequent etching processes, thickness variations can result in over-etching of some regions and under-etching of other regions, which can degrade device performance and die yield. Another difficulty related to CVD processes is that such processes are often unable to deposit conformal films in high aspect ratio features. This issue can be increasingly problematic as device dimensions continue to shrink.

In another example, some deposition processes involve multiple film deposition cycles, each producing a discrete film thickness. For example, in ALD, thickness of a deposited layer may be limited by an amount of one or more film precursor reactants, which may adsorb onto a substrate surface, so as to form an adsorption-limited layer, prior to the film-forming chemical reaction itself. Thus, a feature of ALD involves the formation of thin layers of film, such as layers having a width of a single atom or molecule, which are used in a repeating and sequential matter. As device and feature sizes continue to be reduced in scale, and as three-dimensional devices and structures become more prevalent in integrated circuit (IC) design, the capability of depositing thin conformal films (e.g., films of material having a uniform thickness relative to the shape of the underlying structure) continues to gain in importance. Thus, in view of ALD being a film-forming technique in which each deposition cycle operates to deposit a single atomic or molecular layer of material, ALD may be well suited to the deposition of conformal films. Typical device fabrication processes involving ALD may include multiple ALD cycles, which may number into the hundreds or thousands, may then be utilized to form films of virtually any desired thickness. Further, in view of each layer being thin and conformal, a film that results from such a process may conform to a shape of any underlying device structure. In certain implementations, an ALD cycle may include the following steps:

Exposure of the substrate surface to a first precursor.

Purge of the reaction chamber in which the substrate is located.

Activation of a reaction of the substrate surface, typically with a plasma and/or a second precursor.

Purge of the reaction chamber in which the substrate is located.

The duration of each ALD cycle may typically be less than about 25 seconds or less than about 10 seconds or less than about 5 seconds. The plasma exposure step (or steps) of the ALD cycle may be of a short duration, such as a duration of about 1 second or less.

In particular implementations, ALD operations may be controlled and/or managed by system controller 190 (of FIG. 1B), which may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus, as described above, the controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

In the foregoing detailed description, numerous specific details are set forth to provide a thorough understanding of the presented embodiments or implementations. The disclosed embodiments or implementations may be practiced without some or all of these specific details. In other instances, well-known process operations have not been described in detail so as to not unnecessarily obscure the disclosed embodiments or implementations. While the disclosed embodiments or implementations are described in conjunction with the specific embodiments or implementations, it will be understood that such description is not intended to limit the disclosed embodiments or implementations.

The detailed description is directed to certain embodiments or implementations for the purposes of describing the disclosed aspects. However, the teachings herein can be applied and implemented in a multitude of different ways. In the foregoing detailed description, references are made to the accompanying drawings. Although the disclosed embodiments or implementation are described in sufficient detail to enable one skilled in the art to practice the embodiments or implementation, it is to be understood that these examples are not limiting: other embodiments or implementation may be used and changes may be made to the disclosed embodiments or implementation without departing from their spirit and scope. Additionally, it should be understood that the conjunction "or" is intended herein in the inclusive sense where appropriate unless otherwise indicated: for example, the phrase "A, B, or C" is intended to include the possibilities of "A," "B," "C," "A and B," "B and C," "A and C," and "A, B, and C."

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically includes a diameter of 200 mm, or 300 mm, or 450 mm. The foregoing detailed description assumes embodiments or implementations are implemented on a wafer, or in connection with processes associated with forming or fabricating a wafer. However, the disclosed implementations are not so limited. The work piece may be of various shapes, sizes, and materials. In addition to semiconductor wafers, other work pieces that may take advantage of the disclosed implementations and may include various articles such as printed circuit boards, or the fabrication of printed circuit boards, and the like.

Unless the context of this disclosure clearly requires otherwise, throughout the claims, the words "comprise," "comprising," and the like are to be construed in an inclusive sense as opposed to an exclusive or exhaustive sense; that is to say, in a sense of "including, but not limited to." Words using the singular or plural number also generally include the plural or singular number respectively. When the word "or" is used in reference to a list of 2 or more items, that word covers all of the following interpretations of the word: any of the items in the list, all of the items in the list, and any combination of the items in the list. The term "implementation" refers to implementations of techniques and methods described herein, as well as to physical objects that embody the structures and/or incorporate the techniques and/or methods described herein.

What is claimed is:

1. An apparatus to estimate parameters of a radio frequency (RF) signal coupled to an integrated circuit fabrication chamber comprising a plurality of stations, comprising:

a plurality of voltage sensors, each configured to provide an indication of a voltage of the RF signal;

a plurality of current sensors, each configured to provide an indication of a current conducted by the RF signal;

a multiplexer configured to:

select a voltage sensor of the plurality of voltage sensors and a current sensor of the plurality of current sensors, wherein the selected voltage sensor and the selected current sensor correspond to a selected station of the plurality of stations; and provide outputs of the selected voltage and the selected current sensor to an analog-to-digital converter, the analog-to-digital converter configured to receive outputs from the voltage sensor and the current sensor and configured to provide digital representations of the voltage of the RF signal and the current conducted by the RF signal based on the outputs from the voltage sensor and the current sensor; and one or more processors configured to determine, based on the digital representations of the voltage and the current of the RF signal: a peak voltage associated with the digital representation of the voltage, a peak current associated with the digital representation of the current, and power characteristics associated with the RF signal.

2. The apparatus of claim 1, wherein the one or more processors are further configured to determine phases associated with the digital representations of the voltage and the current.

3. The apparatus of claim 2, wherein the power characteristics are based on the determined phases.

4. The apparatus of claim 1, wherein the one or more processors are further configured to determine an impedance based on the peak voltage and the peak current.

5. The apparatus of claim 1, wherein the voltage sensor comprises a capacitive voltage sensor.

6. The apparatus of claim 1, wherein the current sensor comprises an inductive transformer.

7. The apparatus of claim 1, wherein the RF signal is provided by an RF power generator that provides at least 2 frequency components.

8. The apparatus of claim 1, wherein the RF signal is provided by an RF power generator that provides one frequency component.

9. The apparatus of claim 1, wherein the one or more processors comprise a Field Programmable Gate Array (FPGA).

10. The apparatus of claim 1, wherein the digital representations are at a sampling rate typically greater than about 100 MHz.

11. The apparatus of claim 1, wherein the power characteristics comprise a power factor.

12. The apparatus of claim 1, wherein the one or more processors are further configured to communicate data via a serial communication protocol, via Ethernet, or via another digital communication protocol.

13. The apparatus of claim 1, wherein the one or more processors are further configured to provide outputs to an Ethernet for Control Automation Technology (EtherCAT) system.

14. The apparatus of claim 13, wherein the EtherCAT system is configured to provide instructions to one or more elements in a matching network or other RF distribution system.

15. The apparatus of claim 1, wherein the one or more processors are configured to: 1) provide calibration coefficients to the voltage sensor for storage in memory associated with the voltage sensor; or 2) provide calibration coefficients to the current sensor for storage in memory associated with the current sensor.

16. The apparatus of claim 15, wherein the calibration coefficients are determined for a plurality of RF signal frequencies.

17. The apparatus of claim 15, wherein the calibration coefficients are determined using a modular calibration method that comprises: determining an effect of one or more cables that electrically couple the voltage sensor and the current sensor to the analog-to-digital converter; or determining an effect of a controller that receives outputs from the voltage sensor and the current sensor via the one or more cables.

18. The apparatus of claim 15, wherein the calibration coefficients are determined using an end-to-end calibration method that comprises determining transformation functions that relate outputs of the one or more processors to characteristics of the RF signal.

19. The apparatus of any one of claim 15, wherein: 1) the voltage sensor is configured to provide identifying information to the one or more processors; or 2) the current sensor is configured to provide identifying information to the one or more processors.

20. The apparatus of claim 19, wherein the identifying information comprises the calibration coefficients.

21. The apparatus of claim 19, wherein 1) the voltage sensor is configured to provide identifying information to the one or more processors at a system power on time or a system reset time; or 2) the current sensor is configured to provide identifying information to the one or more processors at the system power on time or the system reset time.

* * * * *